US008395059B2

(12) United States Patent
Miyazaki et al.

(10) Patent No.: US 8,395,059 B2
(45) Date of Patent: Mar. 12, 2013

(54) ELECTROMAGNETIC WAVE SHIELDING MATERIAL, AND METHOD FOR MANUFACTURING SAME

(75) Inventors: Yuichi Miyazaki, Tokyo (JP); Yuusuke Satou, Tokyo (JP); Shinya Kiura, Tokyo (JP); Yukihiro Kyouden, Tokyo (JP); Yusuke Hagiwara, Tokyo (JP); Takeshi Nisizono, Tokyo (JP); Takeaki Imaizumi, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 183 days.

(21) Appl. No.: 12/923,186

(22) Filed: Sep. 8, 2010

(65) Prior Publication Data

US 2011/0122596 A1    May 26, 2011

Related U.S. Application Data

(63) Continuation of application No. PCT/JP2009/070174, filed on Dec. 1, 2009.

(30) Foreign Application Priority Data

Dec. 2, 2008   (JP) .................................. 2008-307790
May 22, 2009  (JP) .................................. 2009-124582
Nov. 13, 2009  (JP) .................................. 2009-260316

(51) Int. Cl.
*H05K 9/00*   (2006.01)

(52) U.S. Cl. ............................ 174/389; 174/392; 156/60

(58) Field of Classification Search .................. 174/389, 174/392; 430/321; 156/60
See application file for complete search history.

(56) References Cited

U.S. PATENT DOCUMENTS

| 6,717,048 | B2* | 4/2004 | Ueda et al. ..................... 174/389 |
| 2003/0013048 | A1* | 1/2003 | Gilson .......................... 430/321 |
| 2009/0272560 | A1 | 11/2009 | Tokunaga |
| 2010/0117504 | A1 | 5/2010 | Chun et al. |
| 2010/0282393 | A1* | 11/2010 | Castaldi et al. .................. 156/60 |

FOREIGN PATENT DOCUMENTS

| EP | 2 009 976 A1 | 12/2008 |
| JP | 64-007592 | 1/1989 |
| JP | 11-170420 | 6/1999 |

(Continued)

OTHER PUBLICATIONS

Japanese Official Action issued Jan. 18, 2010, for JP Application No. 2010-143572.

(Continued)

*Primary Examiner* — Hung Ngo
(74) *Attorney, Agent, or Firm* — Antonelli, Terry, Stout & Kraus, LLP.

(57) ABSTRACT

The present invention is to provide an electromagnetic wave shielding material including a transparent substrate and a convex pattern layer composed of a conductive composition formed in a prescribed pattern on the transparent substrate, wherein the conductive composition contains conductive particles and a binder resin; and in observation of a transverse cross section of the convex pattern layer by electron microscopic photography, at least a part of the conductive particles has a fused continuation and a method for manufacturing the same. The electromagnetic wave shielding material and the method for manufacturing the same include a configuration capable of achieving a lower surface resistivity in an electromagnetic wave shielding material which is required to achieve a much more reduction in a line width of the pattern, specifically, a reduction to a line width of not more than 30 μm, and more preferably not more than 15 to 20 μm and a treatment method capable of reducing the surface resistivity by an easy and short-time treatment.

13 Claims, 21 Drawing Sheets

FOREIGN PATENT DOCUMENTS

| | | |
|---|---|---|
| JP | 11-174174 | 7/1999 |
| JP | 2000-138496 | 5/2000 |
| JP | 2001-102792 | 4/2001 |
| JP | 2004-063943 | 2/2004 |
| JP | 2006-313891 | 11/2006 |
| JP | 2006-319167 | 11/2006 |
| JP | 2007-227906 | 9/2007 |
| JP | 2007-272161 | 10/2007 |
| JP | 2008-066574 | 3/2008 |
| JP | 2008-277250 | 11/2008 |
| WO | WO 2006/129568 A1 | 12/2006 |
| WO | WO 2007/114076 A1 | 10/2007 |
| WO | WO 2008/149969 A1 | 12/2008 |

OTHER PUBLICATIONS

English Translation of International Search Report, Jun. 12, 2007.

* cited by examiner (A)

(B)

(A)

(B)

(C)

(A)

(B)

(A)

(B)

ELECTROMAGNETIC WAVE SHIELDING MATERIAL, AND METHOD FOR MANUFACTURING SAME

This application is a Continuation application under 35 USC 365(c) of prior International (PCT) Application No. PCT/JP2009/70174, filed Dec. 1, 2009.

TECHNICAL FIELD

The present invention relates to an electromagnetic wave shielding material for shielding electromagnetic waves by a conductive layer formed in a prescribed pattern and to a method for manufacturing the same.

BACKGROUND ART

As an image display device (also referred to as "display device") such as a television receiver, and a monitor of personal computer, for example, a cathode ray tube (CRT) display device, a liquid crystal display device (LCD), a plasma display device (PDP), an electroluminescent (EL) display device and the like are known. Of these display devices, a plasma display device to which attention is paid in the field of a large-screen display device utilize plasma discharge for light emission, and thus, there is a concern that unnecessary electromagnetic waves of a band of from 30 MHz to 1 GHz leak out to exert an influence upon other instruments (for example, a remote control instrument, an information processing device, etc.) For that reason, it is general to provide an electromagnetic wave shielding material in a film form for the purpose of shielding the leaked electromagnetic waves on the front side (observer side) of a plasma display panel which is used in a plasma display device. In an electromagnetic wave shielding material which is set up on the front (screen) of an image display device of this kind, a conductive layer thereof is formed in a pattern shape such as a mesh, for the purposes of transmitting visible light therethrough and shielding electromagnetic waves.

The "electromagnetic waves" as referred to in the specification of the present application mean electromagnetic waves (radio waves) of a band of from kHz to GHz among electromagnetic waves in a broad sense, and among electromagnetic waves in a broad sense, infrared rays, visible light and electromagnetic waves of an ultraviolet band are to be called "infrared rays", "visible light" and "ultraviolet rays", respectively.

Though various investigations have hitherto been made regarding such an electromagnetic wave shielding material, in recent years, in view of advantages of low cost and high productivity, attention is paid to a specification in which a conductive composition (also called "conductive ink", "conductive paste" or the like) is printed in a prescribed pattern. In a conductive composition of this kind, since conductive particles are dispersed in an electrically insulating resin binder, there is involved such a problem of how to reduce the electrical resistance (to increase a conductivity) of the conductive composition. In order to solve such a problem, for example, Patent Document 1 proposes a method for manufacturing an electromagnetic wave shielding material by subjecting a conductive composition containing conductive particles, a binder and a solvent to screen printing in a geometric pattern on the surface of a transparent porous layer of a transparent resin substrate which is provided with the transparent porous layer containing an oxide ceramic, etc. as a main component and then subjecting the printed transparent resin substrate to a heat treatment to form a conductive part of the geometric pattern, and an electromagnetic wave shielding material.

Also, Patent Document 2 proposes an electromagnetic wave shielding film prepared by forming a geometric pattern containing metal fine particles on a transparent support and subjecting the formed geometric pattern to a heat treatment, thereby regulating a surface resistivity of the geometric pattern to not more than $10^6 \Omega/\square$.

On the other hand, as an electromagnetic wave shielding material composed of a pattern layer having a metal layer formed by means of plating, Patent Document 3 proposes an electromagnetic wave shielding material prepared by subjecting an electroless plating catalyst paste to screen printing in a mesh pattern on a transparent substrate and forming a metal layer thereon by means of electroless plating. Also, Patent Document 2 proposes an electromagnetic wave shielding material prepared by subjecting a conductive composition to intaglio offset printing in a mesh pattern on a transfer material, transferring the mesh pattern on the transfer material onto a transparent substrate and electroplating a metal layer on the mesh pattern on the transparent substrate. Also, Patent Document 5 proposes an electromagnetic wave shielding material prepared by subjecting a conductive composition to intaglio printing in a mesh pattern directly on a transparent substrate and forming a metal layer on the mesh pattern on the transparent substrate by means of electroplating. Furthermore, Patent Document 6 proposes a method for manufacturing a conductive base having a metal fine particle layer in a mesh form laminated on at least one surface of a base, wherein the metal fine particle layer is treated with an acid.

[Patent Document 1] WO 2006/129568
[Patent Document 2] JP-A-2008-66574
[Patent Document 3] JP-A-11-170420
[Patent Document 4] JP-A-2001-102792
[Patent Document 5] JP-A-11-174174
[Patent Document 6] JP-A-2006-313891
[Patent Document 7] WO 2008/149969

DISCLOSURE OF THE INVENTION

Problems that the Invention is to Solve

However, in the electromagnetic wave shielding material disclosed in Patent Document 1, since the printed transparent resin substrate is subjected to a heat treatment to form a conductive part of geometric pattern, the transparent resin substrate is thermally damaged; and in order to avoid such a thermal damage, in the case of using, for example, a PET resin as the transparent resin substrate during the heat treatment, a special heat treatment apparatus in which the treatment is carried out by putting the substrate in a thermostat bath of from 180 to 350° C. for from 10 seconds to 20 minutes in a state where the PET resin substrate side on which a pattern is not formed is brought into contact with cooling rolls cooled at from 0 to 40° C., or the like, is necessary, leading to an increase of the cost.

On the other hand, the heat treatment temperature is a temperature at which the metal particles are sintered, and in order to minimize the thermal damage of the transparent resin substrate, a fusion temperature among metal particles can be remarkably lowered by making a crystallite size of the metal particles small. In Patent Document 1, for example, when silver particles are concerned, in order to lower a burnable temperature to not higher than 300° C., it is mentioned that the crystallite size is regulated preferably to not more than 20 nm, and preferably to not more than 10 nm.

Also, even in Patent Document 2, it is mentioned that an average particle size of the metal fine particle is preferably from 5 nm to 500 nm. However, a metal fine particle in such a nanometer size is expensive, and in the existing circumstances where electromagnetic wave shielding materials with a lower cost are required, it is difficult from the cost standpoint to employ a metal fine particle in a nanometer size.

On the other hand, in the electromagnetic wave shielding material disclosed in Patent Document 3, the mesh pattern is formed by means of screen printing for which the formation of a fine pattern is difficult, and the metal layer is formed by means of electroless plating with a slow film deposition rate, and thus, there are involved such drawbacks that the productivity is inferior and that it may be impossible to contrive to reduce the cost. Also, in the electromagnetic wave shielding material disclosed in Patent Document 4, since the mesh pattern is formed by means of intaglio printing, it is possible to form a fine pattern; however, since the offset printing is employed, after transferring onto the transfer material (blanket cylinder) from an intaglio, transfer from the transfer body onto the transparent substrate is carried out twice, and thus, there is a concern that the mesh pattern of the intaglio as an original is not faithfully transferred onto the transparent substrate.

Furthermore, in the electromagnetic wave shielding material disclosed in Patent Document 5, because of a mode of transferring the conductive ink composition directly onto the transparent substrate from an intaglio, there is nothing about a problem of pattern strain to be caused due to a blanket cylinder which is peculiar to the offset printing. Also, it is possible to form a fine pattern as compared with silk screen printing. However, when applied to an electromagnetic wave shielding material, it is necessary to achieve the transfer (also called "transition") of an ink with poor fluidity, such as a conductive ink, in a high coating amount. Therefore, as a newly generated problem, during transferring a conductive ink, there is a concern that an untransferred part is generated, or transfer failure with inferior adhesion is generated. Specifically, as shown in FIG. 4, after coating a conductive ink composition 103 on an intaglio 101, during scraping away the conductive ink composition 103 by a doctor blade 102 to fill it in a recess 104, a depression 105 is generated in an upper portion of the conductive ink composition 103 in the recess 104 after scraping away by the doctor blade 102 as shown in FIG. 4(B). Thereafter, during press bonding a transparent substrate 106 onto the intaglio 101 to transfer the conductive ink composition 103 in the recess 104 onto the transparent substrate 106, this depression 105 becomes a factor of disturbing the adhesion between the transparent substrate 106 and the conductive ink composition 103 as shown in FIG. 4(C). As a result, an untransferred part of the conductive ink composition is generated on the transparent substrate 106, or transfer failure with inferior adhesion is generated, resulting in a lowering of electromagnetic wave shielding characteristics.

In general, since a number of high-viscosity conductive inks with low fluidity which are filled in a fine intaglio recess usually remain in the recess in an intaglio printing mode, a transition rate of the conductive ink [=(volume of the ink transited from the recess)/(volume of the intaglio recess)× 100%; or in the case where it is considered that a change in line width is negligible between the printed matter and the intaglio, a rough estimate is simply performed according to an expression: (thickness of the ink transited from the recess)/ (depth of the intaglio recess)×100%] was low, and its limit was about 20% even at maximum. Therefore, it was difficult to form a pattern having a sufficient thickness and a sufficient electric conductivity, and it was difficult to obtain sufficient electromagnetic wave shielding properties.

Then, in Patent Document 7, the present applicant proposes an electromagnetic wave shielding material prepared by transferring a conductive composition onto a transparent substrate by means of intaglio printing to form a pattern with conductivity, which is free from inconveniences to be caused on the basis of transfer failure of the conductive composition, such as disconnection of the pattern, shape failure, insufficient transition rate, and low adhesion. In the invention disclosed in this Patent Document 7, by going through a press bonding step of press bonding a depression 6 of a conductive ink composition 15 as shown in FIG. 8(A) to a transparent substrate 1 on which a primer layer 3 capable of keeping fluidity until it is cured as shown in FIG. 8(B) is formed, thereby bringing the primer layer and the conductive ink in the recess 6 into intimate contact with each other without forming any void, the primer layer is cured, the transparent substrate is released from a printing plate, and the conductive ink composition in the recess 6 is transferred onto the cured primer layer 3.

However, it has become clear that in such a method, the following problems to be solved still remain.

Problem 1

As a recent trend, in various utilization fields where it is required to make both high electromagnetic wave shielding properties and high transparency compatible with each other, in particular, in the case of an application of screen front of a display device, in order to obtain higher transparency, it is required to make the line width of a pattern much more finer. Specifically, it is required to achieve thinning of the line width to not more than 30 μm, and more preferably not more than 15 to 20 μm.

On the other hand, when the line width of a convex pattern layer composed of a conductive composition containing conductive particles and a binder resin becomes thin in this way, the following matters are caused.

(1) In general, an electrical resistance R of a material is proportional to its length L and volume resistivity p and inversely proportional to its sectional area S. That is, there is a relation of $R=\rho L/S$. For that reason, in the case of printing and forming patterns having the same pattern shape in a planar view (L: constant) and the same thickness using the same conductive composition (ρ: constant), the sectional area S decreases in proportion to a decrease of the line width, and the electrical resistance R of a conductive pattern portion increases. Following this, the surface resistivity as a shielding member, which is an index of the electromagnetic wave shielding properties, is also increased.

(2) When the pattern line width becomes narrow, and the line width and the conductive particle size are close to each other while fixing the printing thickness, even in conductive particles having the same particle size and particle shape, a ratio of the total area of a portion where the conductive particles come into contact with each other in a unit sectional area of the fine line pattern is lowered. As a result, as compared with a geometric sectional area $S_{GEO}$, an effective total sectional area $S_{AV}$ of the conductive particles (group) capable of becoming an actual current path is lowered ($S_{AV} < S_{GEO}$), and the electrical resistance R of the conductive pattern portion increases to a level more than an influence of the geometric factor (sectional area S) due to a decrease of the line width; and therefore, the surface resistivity of the electromagnetic wave shielding material also increases to a level more than a value simply calculated from the line width. As a result, the electromagnetic wave shielding properties are lowered. Since this situation is similarly generated even in the case of making the thickness thin without altering the line width, there is revealed a result that even in the case where the printing thickness becomes thin so that it is close to the conductive particle size, the surface resistivity abruptly increases.

As a matter of course, if a metal layer with a low volume resistivity is formed on the convex pattern layer by means of electroplating or the like, this increase of the electrical resistance can be compensated each other. However, in that case, since increases of the step number and the material expenses, a lowering of the yield and necessity of a treatment of a heavy metal-containing waste fluid are generated, it could not be said that such is a preferred form.

On the other hand, in the case of printing a metal fine particle solution on a base to provide a conductive layer of the metal fine particles, in general, in order to increase the conductivity of the metal fine particle layer, a high-temperature and long-time heat treatment is necessary. However, in the high-temperature and long-time heat treatment, for example, in the case of using a thermoplastic resin such as a polyester film as a transparent substrate, there was involved such a problem as occurrence of deformation of the thermoplastic resin, or the like. In order to solve this problem, Patent Document 6 proposes a method for manufacturing a conductive base by treating a metal fine particle layer with an acid. In Patent Document 6, it is mentioned that in the case of using a solution of at least one member selected among metal fine particles, metal oxide fine particles and organic metal compounds dispersed or dissolved in a solvent, an effect of the acid is recognized by a solution of the acid in a low concentration. However, it is disclosed that in a solution prepared by kneading a compound capable of forming metal fine particles in a resin component or dispersing the compound in a resin component and then adding a solvent to regulate the viscosity, or the like, even by using a solution of an acid in a low concentration, excellent conductivity is not obtainable. Furthermore, it is mentioned that as to a mixing ratio of the metal fine particles and the resin component contained in the metal fine particle layer, it is the most preferable that the resin component is not contained. And all of the metal fine particle layer forming solutions of the working examples are free from the resin component, a lattice having a line thickness of 3 μm, a line width of 50 μm and a pitch of 300 μm is formed, and the obtained surface resistivity is from 5 to 40Ω/□. On the other hand, from the practical use standpoint, in the existing circumstances where high electromagnetic wave shielding properties are demanded especially in a narrow-line width convex pattern having a line width of not more than 30 μm and at a surface resistivity of not more than 1.2Ω/□, there is neither direct teaching nor suggestion.

As described previously, in the convex mesh pattern, there has hitherto been proposed neither a configuration of the convex mesh pattern capable of achieving a low surface resistivity (high conductivity) even by decreasing the line width nor a treatment method for reducing an electrical resistance.

Problem 2

Also, in general, since conductive particles are also high in visible light reflectance, a conductive composition becomes high in visible light reflectance. In particular, metal particles are strong in this tendency, and above all, in the case of scaly conductive particles which are usually employed for the purpose of realizing a low resistance, from the broad viewpoint, a face close to a mirror finished surface is formed on the surface of a convex pattern, and therefore, such reflection becomes close to mirror reflection. In the case of a high visible light reflectance, especially in the case where the content of a mirror reflection component is high, the convex pattern surface (both surfaces of the transparent substrate side and the opposite side to the transparent substrate) reflects external light such as electric lamp light, sunlight or image light from a display device, thereby causing problems such as whitening of the screen and a lowering of image contrast.

As a matter of course, when conductive particles with a low visible light reflectance, such as graphite, are used, such whitening of the screen or lowering of contrast to be caused due to the convex pattern can be avoided. However, in that case, since a volume resistivity of graphite is high as compared with that of metals such as silver, in the case of designing the same conductive pattern, the electromagnetic wave shielding properties are inferior. In the case where the line width is wide, this becomes relatively hardly problematic; however, in the case of making the convex pattern fine, there are caused such problems that not only the electrical resistance is increased due to the geometric factor as described above, but the electromagnetic wave shielding performance becomes insufficient. Furthermore, since there may be often the case where particles of carbon such as graphite increase a structural viscosity of the conductive composition and lowers the fluidity, there is such a problem that this causes reproducibility failure of a fine line pattern and a tendency of a lowering of the transition rate.

Problem 3

Also, as another problem, there may be the case where in the transfer step, if release between the primer layer occupying a large contact area with a printing plate and the printing plate (such release will be hereinafter referred to as "plate release") is not smooth (heavy), an action in which a release starting point (normal point) P of the sheet, which is a tangent position between an intaglio roll 62 and a nip roll 67 under a normal condition as shown in FIG. 7(A), is dragged following the movement of the intaglio roll 62 and, for example, reaches a limiting point P' shown in FIG. 7(B) and again returns to the normal point P is periodically repeated, thereby assuming a vibrational plate release state. In such a vibrational plate release state, a modulation such as an increase or decrease of thickness is applied in a vibrational manner onto the convex pattern surface, thereby generating fringe-like unevenness in an appearance. Also, there was caused such a problem that a part of the conductive ink composition in an uncured state in a patterned line part is scattered in a dotted state into an aperture due to the vibration at the time of plate release. When such a scattered material is present in the aperture, appearance failure or a lowering of light transmittance is caused so that there may be the case where the material is no longer useful as an electromagnetic wave shielding material.

In view of the foregoing problems, the present invention has been made, and an object thereof is to provide a configuration capable of achieving a lower surface resistivity in an electromagnetic wave shielding material which requires to a further reduction in a line width of a pattern, specifically a reduction of a line width of not more than 30 μm, and more preferably not more than 15 to 20 μm, and a method for manufacturing an electromagnetic wave shield including a treatment method for reducing a surface resistivity by an easy and short-time treatment.

Means for Solving the Problems

As a result of extensive and intensive investigations for the purpose of solving the foregoing problems, it has been found that the problems can be solved by an electromagnetic wave shielding material in which its conductive composition constituting a convex pattern layer contains conductive particles and a binder resin and which is constituted such that in observation of a transverse cross section of the convex pattern layer by electron microscopic photography, at least a part of the conductive particles has a fused continuation and that a further reduction of the surface resistivity can be achieved by applying a step of carrying out a warm water treatment and/or an acid treatment of a conductive layer at the same time of or after a curing step of forming the conductive layer, or successively applying a step of carrying out an acid treatment and a step of carrying out a warm water treatment of the acid-treated conductive layer. The present invention has been accomplished on the basis of such knowledge.

That is, the present invention provides:

(1) An electromagnetic wave shielding material comprising a transparent substrate and a convex pattern layer composed of a conductive composition formed in a prescribed pattern on the transparent substrate, wherein the conductive composition contains conductive particles and a binder resin; and in observation of a transverse cross section of the convex pattern layer by electron microscopic photography, at least a part of the conductive particles has a fused continuation;

(2) An electromagnetic wave shielding material comprising a transparent substrate, a primer layer formed on the transparent substrate and a convex pattern layer composed of a conductive composition formed in a prescribed pattern on the primer layer, wherein a thickness of a portion of the primer layer where the convex pattern layer is formed is thicker than a thickness of a portion thereof where the convex pattern layer is not formed; an interface between the primer layer and the convex pattern layer in the convex pattern layer-formed portion has any one or two or more sectional forms of (a) a sectional form where an interface between the primer layer and the convex pattern layer is complicated in a non-linear manner, (b) a sectional form having a layer where a component constituting the primer layer and a component constituting the convex pattern layer are mixed, and (c) a sectional form in which a component contained in the primer layer is present in the conductive composition constituting the convex pattern layer; the conductive composition contains conductive particles and a binder resin; and in observation by electron microscopic photography in a transverse cross section of the convex pattern layer, the conductive particles include those in which at least a part of the plural conductive particles has a fused continuation;

(3) The electromagnetic wave shielding material as set forth above in (1) or (2), having at least one or more paths in which in the transverse cross section of the convex pattern layer, a length of the continuation (path) formed by partial fusion of the plural conductive particles exceeds ½ of a width of the convex pattern layer;

(4) The electromagnetic wave shielding material as set forth above in any one of (1) to (3), wherein in the convex pattern layer, the conductive composition contains conductive particles and a binder resin, and the convex pattern layer has a line width of not more than 30 μm and a surface resistivity of not more than 0.8Ω/□;

(5) The electromagnetic wave shielding material as set forth above in any one of (1) to (4), wherein a metal layer is further formed on the surface of the convex pattern layer;

(6) A method for manufacturing an electromagnetic wave shielding material having a transparent substrate, on one surface of which is formed a conductive layer in a prescribed pattern, the method comprising the successive steps of:

a step of forming a prescribed conductive pattern layer on one surface of the transparent substrate using a conductive composition containing conductive particles and a binder resin;

a curing step of curing the binder resin of the formed conductive pattern layer to form a conductive layer;

a step of subjecting the cured conductive layer to an acid treatment; and a step of subjecting the acid-treated conductive layer to a warm water treatment, wherein the conductive layer in which in observation of a transverse cross section of the conductive layer by electron microscopic photography, at least a part of the conductive particles has a fused continuation is formed;

(7) A method for manufacturing an electromagnetic wave shielding material having a transparent substrate, on one surface of which is formed a conductive layer in a prescribed pattern, the method comprising the successive steps of:

a transparent substrate preparing step of preparing a transparent substrate, on one surface of which is formed a primer layer capable of keeping fluidity until it is cured;

a filling step of, after coating a conductive composition capable of forming a conductive layer after curing on a plate-like or cylindrical printing plate having a recess formed in a prescribed pattern thereon, scraping away the conductive composition attached to other portion than the recess, thereby filling the conductive composition in the recess;

a press bonding step of press bonding the primer layer side of the transparent substrate after the transparent substrate preparing step and the recess side of the printing plate after the conductive composition filling step to each other, thereby bringing the primer layer and the conductive composition in the recess into intimate contact with each other without forming any void;

a primer curing step of, after the press bonding step, curing the primer layer;

a transfer step of, after the curing step, releasing the transparent substrate from the printing plate, thereby transferring the conductive composition in the recess onto the primer layer;

a curing step of, after the transfer step or at the same time of the primer layer curing step, curing the conductive composition layer formed in a prescribed pattern on the primer layer to form a conductive layer; and an electrical resistance reducing treatment step of, at the same time of or after the curing step of forming the conductive layer, subjecting the conductive layer to a warm water treatment and/or an acid treatment, wherein the conductive layer in which in observation of a transverse cross section of the conductive layer by electron microscopic photography, at least a part of the conductive particles has a fused continuation is formed;

(8) The method for manufacturing an electromagnetic wave shielding material as set forth above in (7), wherein the electrical resistance reducing treatment step comprises the successive steps of a step of subjecting the cured conductive layer to an acid treatment and a step of subjecting the acid-treated conductive layer to a warm water treatment;

(9) The method for manufacturing an electromagnetic wave shielding material as set forth above in (7), wherein the warm water treatment includes a treatment of exposing the conductive layer in a high-temperature high-humidity environment at a temperature of 30° C. or higher and not higher than 120° C. at a relative humidity of 70% RH or more over a prescribed time;

(10) The method for manufacturing an electromagnetic wave shielding material as set forth above in any one of (6) to (8), wherein the acid treatment is a treatment of dipping the conductive layer in a solution of an acid and/or coating a solution of an acid on the conductive layer;

(11) The method for manufacturing an electromagnetic wave shielding material as set forth above in any one of (6) to (10), wherein the warm water treatment is a treatment of dipping the conductive layer in warm water at a water temperature of from 30 to 100° C.; and

(12) An image display device comprising the electromagnetic wave shielding material as set forth above in any one of (1) to (5) placed in the front thereof.

In the electromagnetic wave shielding material obtained by the present invention, its conductive composition constituting a convex pattern layer contains conductive particles and a binder resin, and a conductive layer in which at least a part of the plural conductive particles has a fused continuation is provided; and therefore, even in the case where a line width of the pattern is made fine to enhance transparency, there gives rise to such an effect that it is possible to make both high electromagnetic wave shielding properties and mechanical strength compatible with each other.

Furthermore, by configuring the electromagnetic wave shielding material so as to have at least one or more paths in which a length of the continuation (path) formed by partial fusion of the plural conductive particles exceeds ½ of a width of the convex pattern layer, or have a line width of the convex pattern layer of not more than 30 pin and a surface resistivity of the convex pattern layer of not more than 0.8Ω/□, the foregoing effect can be brought much more.

In this respect, the term "fusion" as referred to in the present invention means that plural conductive particles become united (combined) each other and includes a concept of "contact", "joining", "binding" or "melting" or the like of conductive particles each other.

Also, by configuring the electromagnetic wave shielding material such that a metal layer is further formed on the surface of the convex pattern layer, the electrical resistance of the pattern becomes much more low, thereby giving rise to such an effect that it becomes possible to apply the material to an application which requires high-performance electromagnetic wave shielding properties to an extent that they are difficulty revealed only by the foregoing configuration of every sort.

Furthermore, in the foregoing electromagnetic wave shielding material (2), since a thickness of a portion of the primer layer where the convex pattern layer is formed is thicker than a thickness of a portion thereof where the convex mesh pattern layer is not formed; and an interface between the primer layer and the convex pattern layer in the convex mesh pattern layer-formed portion has sectional forms of (a) a sectional form where an interface between the primer layer and the convex pattern layer is complicated in a non-linear manner, (b) a sectional form having a layer where a component constituting the primer layer and a component constituting the convex pattern layer are mixed, and (c) a sectional form in which a component contained in the primer layer is present in the conductive composition constituting the convex pattern layer, there gives rise to the following effects:

(A) adhesion between the primer layer and the conductive composition layer is good; and (B) during pattern formation by means of intaglio printing, transition properties of the conductive composition is good; defective transition is not revealed; pattern reproducibility is good; scattering in the surroundings of the conductive composition during transition of the conductive composition from an intaglio are prevented from occurring; and appearance failure of an aperture and a lowering in light transmittance are prevented from occurring, resulting in enabling one to obtain favorable electromagnetic wave shielding properties.

Furthermore, in manufacturing the foregoing electromagnetic wave shielding material (2), there gives rise to such an effect that at the same time of or after the curing step of forming the conductive layer, by carrying out a relatively inexpensive treatment such as a warm water treatment and/or an acid treatment, the surface resistivity of from 0.9 to 2Ω/□ in the case of untreatment can be reduced to not more than 0.8Ω/□ without carrying out a high-cost copper plating treatment.

In the electromagnetic wave shielding material of the present invention, nonetheless burning is not carried out, fusion of conductive particles is formed, and there is no concern for substrate damaging to be caused at the time of burning which requires heating to at least about 150° C. or higher, peeling off to be caused due to a lowering of adhesion of the conductive composition or the like.

In a preferred manufacturing method of the electromagnetic wave shielding material of the present invention, the electrical resistance reducing treatment of the conductive layer is comprised of an acid treatment and a warm water treatment. For that reason, as compared with a conventionally performed high-temperature heat treatment method which requires sintering of conductive particles, the transparent substrate is free from damaging. Therefore, in particular, thermoplastic resin films such as a PET film can be used as the transparent substrate, and a low-cost electromagnetic wave shielding material provided with optical physical properties and mechanical physical properties can be obtained.

Also, when treatment equipment is concerned, the treatment can be carried out by simple equipment such as an acid treatment tank and a warm water treatment tank, and complicated cooling equipment of the transparent resin substrate or the like is not required. Therefore, an equipment cost can be suppressed, and the treatment can be carried out at a relatively high speed. Thus, it is possible to reduce the treatment cost of the electromagnetic wave shielding material.

According to the manufacturing method of the present invention, by selecting the conductive composition, an electromagnetic wave shielding material having a surface resistivity of not more than 0.8Ω/□ can be obtained without subjecting the surface to metal plating, and by omitting the plating step, an environmental load can be reduced, and it is possible to contrive to enhance the productivity and reduce a cost.

Furthermore, by the electrical resistance reducing treatment of the conductive layer which is used in the manufacturing method of the present invention, since at least a part of the conductive particles is fused, a printed (depicted) pattern becomes firm so that it does not cause denaturation. Also, solvent resistance performance and durability performance of the conductive layer are enhanced.

Since the surface resistivity of the electromagnetic wave shielding material can be regulated by controlling the water temperature of the warm water treatment, a quality control of the surface resistivity is easy, and production with good reproducibility and yield can be achieved.

Also, even in the case where a lower surface resistivity is required so that metal plating is applied, in general, metal plating has hitherto been further applied to a conductive layer of about 5Ω/□, thereby forming an electromagnetic wave shielding material of, for example, 0.5Ω/□; however, since the surface resistivity is scattered in a width direction, in order to make this in-plane scattering uniform, a plating rate must be made slow to a rate of from about 1 to 2 m/min. However, according to the manufacturing method of the present invention, since the conductive layer has a surface resistivity of not more than 0.8Ω/☐ from the first and is small in an absolute value of scattering of the surface resistivity in a width direction, metal plating can be applied at a higher rate, and it is possible to contrive to enhance the productivity and reduce the manufacturing cost.

Figure 1:
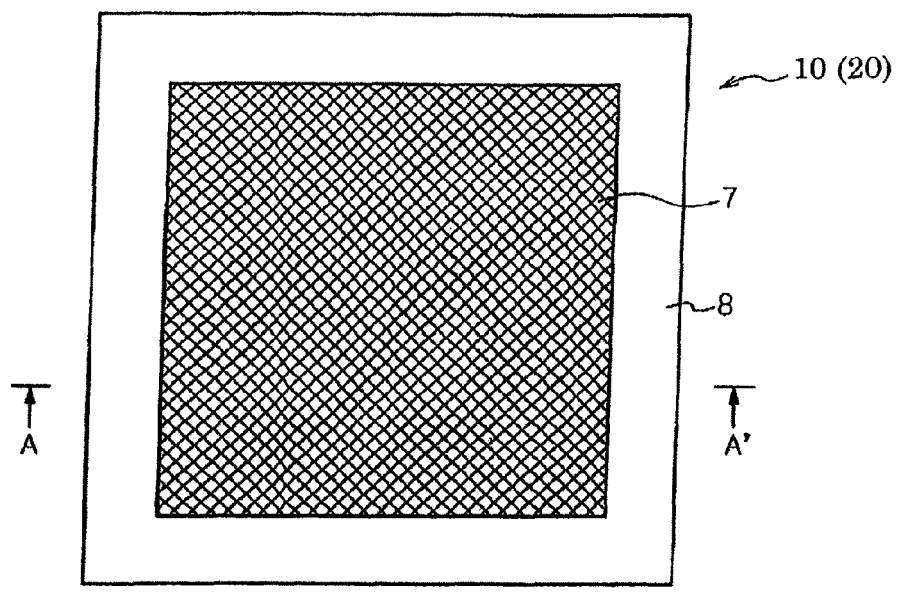
FIG. 1 is a schematic plan view showing an example of an electromagnetic wave shielding material of the present invention.

DESCRIPTION OF REFERENCE NUMERALS AND SIGNS 1, 106 Transparent substrate
2 Conductive pattern layer (2', 103: conductive composition layer)
3 Primer layer
4 Metal layer
5 Side edge
6, 105 Depression
7 Electromagnetic wave shielding pattern part
8 Grounding part
9 Protective layer
10, 20 Electromagnetic wave shielding material
15, 103 Conductive composition
51 Gravure roll
52 Backup roll
53 Resin composition filling container
54, 102 Doctor blade
61 Pickup roll
62 Intaglio roll
63 Printing plate
64, 104 Recess
65 Doctor blade 66 Nip roll
67 Nip roll
68 Filling container
101 Intaglio
100 Antireflection layer
200 Transparent substrate sheet
300 Transparent resin layer of microlouver layer
400 Light absorbing wedge-shaped part of microlouver layer
500 Shielding (barrier) layer
600 Coloring matter-containing adhesive layer
A Portion where a conductive material layer is formed
TA Thickness of A
B Portion where a conductive material layer is not formed
TB Thickness of B
$F_{com}$ Complex filter
$F_{opt}$ Optical functional layer
SI One surface of transparent substrate 1

BEST MODES FOR CARRYING OUT THE INVENTION

Next, embodiments of the present invention are described in detail, but it should not be construed that the present invention is limited to the following embodiments, and various modifications can be made within the scope of the gist thereof. The electromagnetic wave shielding material of the present invention is comprised of an invention of an electromagnetic wave shielding material of a first embodiment as set forth in claim 1, an invention of an electromagnetic wave shielding material of a second embodiment as set forth in claim 2, a manufacture invention of a first embodiment as set forth in claim 6, a manufacture invention of a second embodiment as set forth in claim 7 and an invention of an image display device as set forth in claim 12, and the manufacture inventions of the first and second embodiments are common in an acid treatment step and a warm water treatment step of a conductive layer.

[Electromagnetic Wave Shielding Material]

Figure 2:
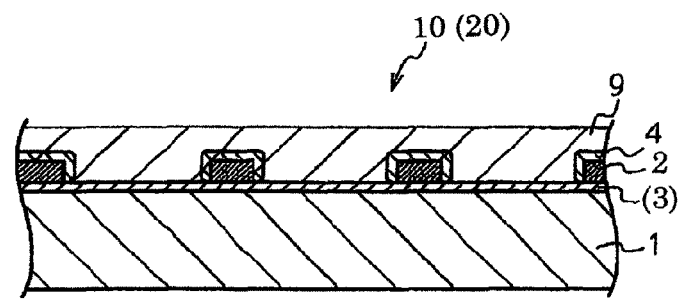
FIG. 2 is an enlarged view of an A-A' cross section in FIG. 1.

FIG. 1 is a schematic plan view showing an example of an electromagnetic wave shielding material of the present invention; and FIG. 2 is an enlarged view of an A-A' cross section in FIG. 1, in which a primer layer 3 is present only in the invention of the electromagnetic wave shielding material of a second embodiment, and each of a metal layer 4 and a protective layer 9 is a layer which is provided as the need arises.

Also, FIG. 3(A) is a schematic sectional view showing more enlargedly a part of FIG. 2 in the invention of the electromagnetic wave shielding material of the second embodiment; and FIG. 3(B) shows the case where the metal layer 4 formed on a conductive pattern layer 2 is provided, and the protective layer 9 (see FIG. 2) is further provided as the need arises.

FIG. 5(A) shows a flowchart showing an example of the manufacturing method of an electromagnetic wave shielding material regarding the invention of the electromagnetic wave shielding material of the first embodiment; and FIG. 5(B) shows a flowchart showing an example of a manufacturing method of an electromagnetic wave shielding material regarding the invention of the electromagnetic wave shielding material of the second embodiment.

Figure 11:
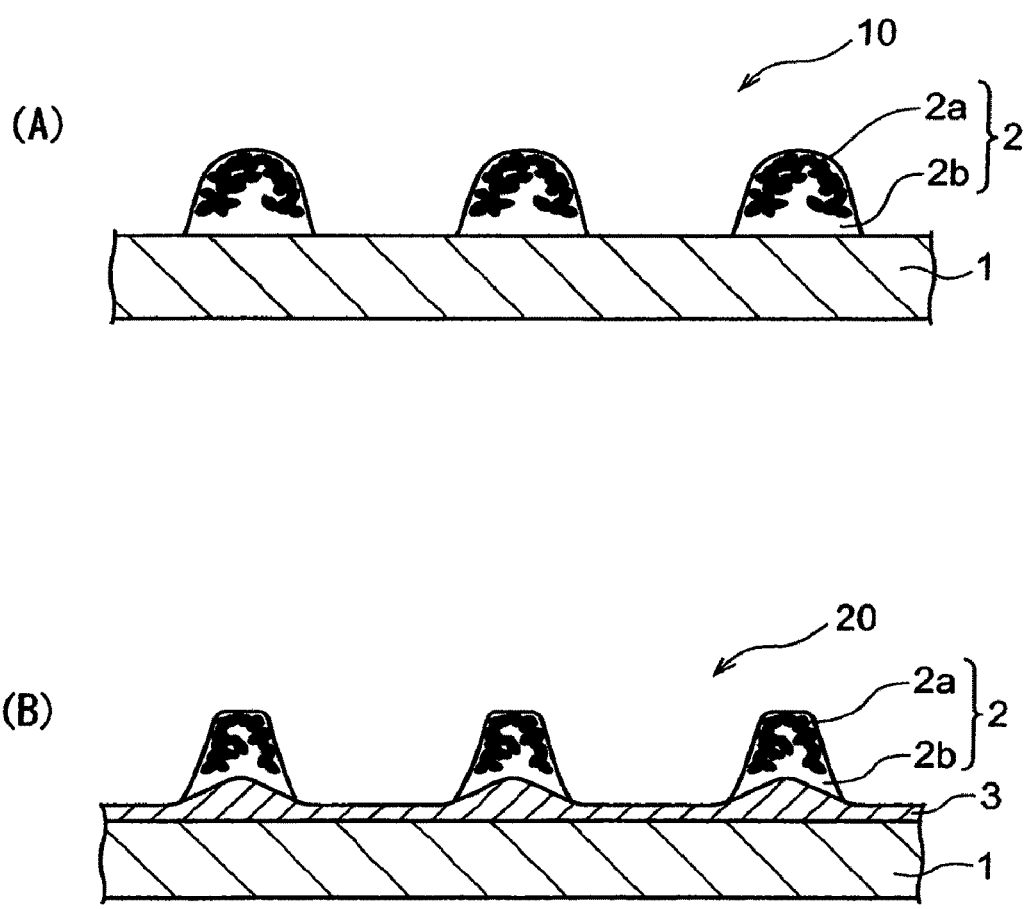
FIG. 11 is a schematic view of a state of conductive particles after applying an electrical resistance reducing treatment to a conductive pattern layer of an invention of an electromagnetic wave shielding material of a first embodiment (A) and an invention of an electromagnetic wave shielding material of a second embodiment (B), respectively.
Figure 21:
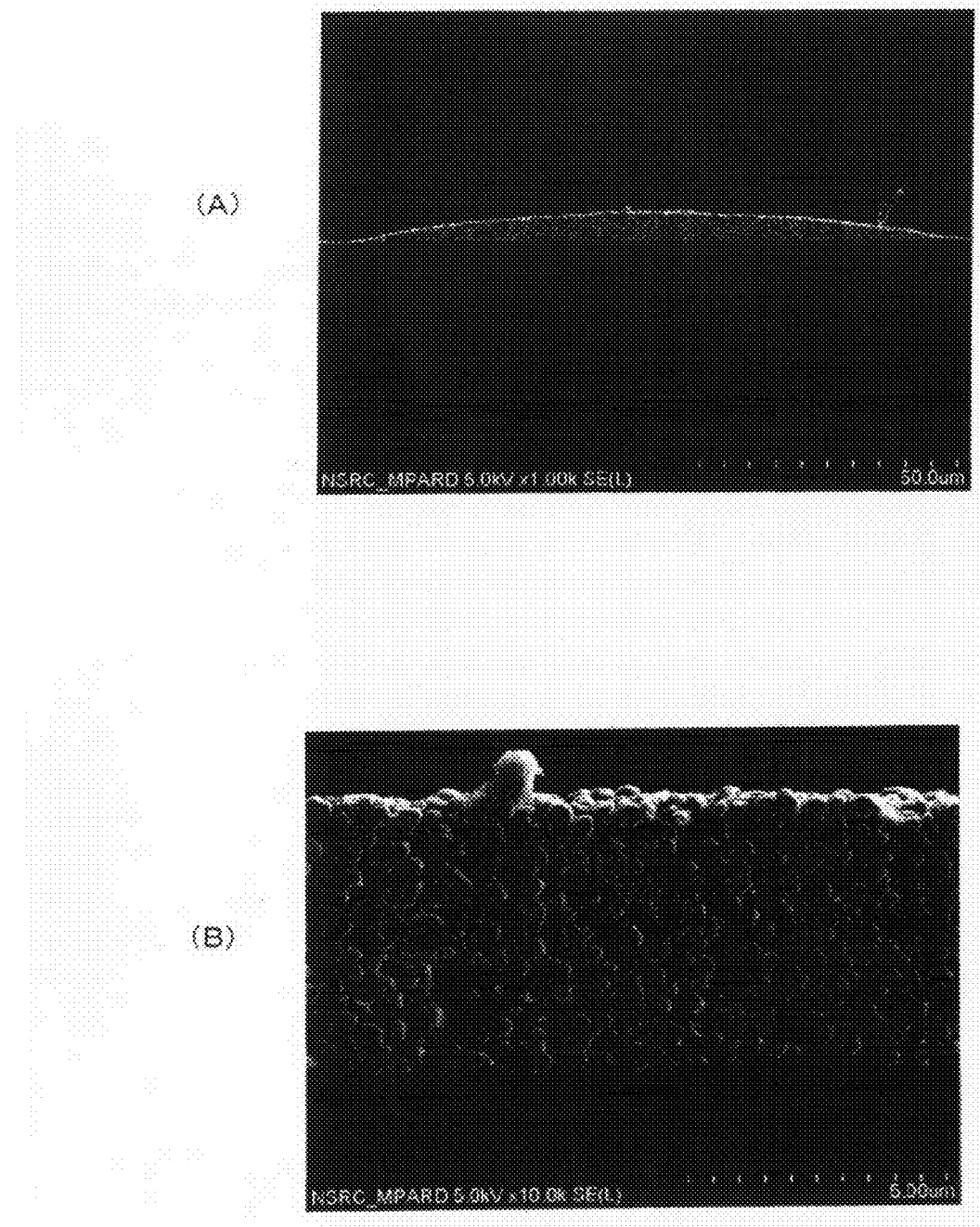
FIG. 21 is (A) a sectional SEM photograph (magnification: 1,000 times) showing the whole of a conductive pattern after an electrical resistance reducing treatment and (B) a partially enlarged sectional SEM photograph (magnification: 10,000 times of (A)), respectively of Example according to an invention of an electromagnetic wave shielding material of a first embodiment.

An electromagnetic wave shielding material 10 obtained by the invention of the electromagnetic wave shielding material of the first embodiment of the present invention has a transparent substrate 1 and a conductive pattern layer 2 formed in a prescribed pattern represented by a mesh shape on the transparent substrate 1; the conductive pattern layer 2 is composed of a conductive particle 2a and a binder resin 2b; and as schematically shown in FIG. 11(A) and also shown in FIG. 21(B), in observation of a transverse cross section of the conductive pattern layer 2 by electron microscopic photography, at least a part of the conductive particles 2a forms a portion having a continuation formed by fusion (melting) of adjacent particles to each other.

On the other hand, an electromagnetic wave shielding material 20 obtained by the invention of the electromagnetic wave shielding material of the second embodiment of the present invention has the primer layer 3 on the surface of the transparent substrate 1 and has the conductive pattern layer 2 formed on the surface of the primer layer 3, and reflecting characteristic features by the manufacturing method, as shown in FIG. 3(A), a thickness TA of a portion of the primer layer 3 where the foregoing conductive pattern layer 2 is formed is thicker than a thickness TB of a portion where the foregoing convex pattern layer is not formed.

Figure 15:
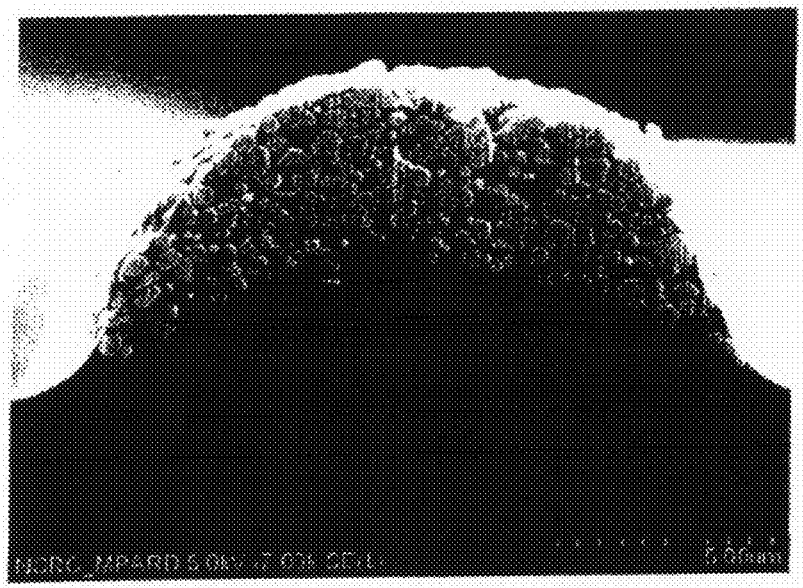
FIG. 15 is a sectional SEM photograph of (A) a conductive pattern before an electrical resistance reducing treatment and (B) a sectional SEM photograph of a conductive pattern after an electrical resistance reducing treatment, respectively in Example 10 according to an invention of an electromagnetic wave shielding material of a second embodiment.
Figure 15:
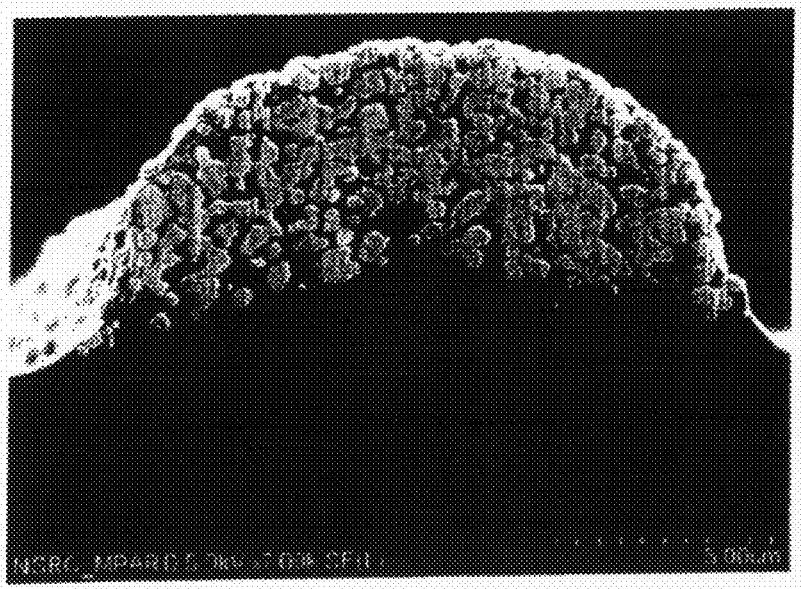

Also, the conductive pattern layer 2 is composed of a conductive particle 2a and a binder resin 2b, and as schematically shown in FIG. 11(B) and also shown in FIG. 15(B), in observation of a transverse cross section of the conductive pattern layer 2 by electron microscopic photography, at least a part of the conductive particles 2a forms a portion having a continuation formed by fusion (melting) of adjacent particles to each other.

Such fusion of the conductive particles 2a each other is a characteristic feature imparted to the conductive particle 2a in the conductive pattern 2 as a result of an electrical resistance reducing treatment step as described later. Also, this is a reason why a volume resistivity and a surface resistivity of the conductive pattern layer 2 are decreased.

While a reason why the conductive particles 2a are fused each other by the electrical resistance reducing treatment step has not been elucidated yet at this point, for example, when silver is used as a conductive particle and a change of the state of the silver particle before and after the treatment is observed by SEM (scanning electron microscope), a change of the particle shape of silver, partial melting of adjacent particles to each other (an increase of a contact area of particles with each other and transition of from point contact to plane contact), a decrease of a particle-to-particle distance and so on are observed, and it may be estimated that such is a direct cause of a reduction of the volume resistivity. In this respect, as already described, the term "fusion" as referred to in the present invention means that plural conductive particles become united (combined) each other and includes a concept of "contact", "joining", "binding" or "melting" or the like of conductive particles each other.

Also, as to the terms "in observation of a transverse cross section by electron microscopic photography, at least a part of the conductive particles has a fused continuation", the continuation formed by fusion of at least a part of the conductive particles is hardly confirmed through visual inspection because the thickness or width of the conductive layer is present in a portion of a sectional size of from 10 to 50 µm, and the conductive particles are not more than several µm; when the magnification is about 1,000 times or more, the confirmation is possible, and when the magnification is preferably about 5,000 times, and more preferably about 10,000 times, the confirmation is easy: and thus, as a confirmation means thereof, photography in observation by a scanning electron microscope (SEM) is specified. So far as the fusion state of the conductive particles of the convex pattern layer can be observed by an optical microscope or other microscope, it should not be construed that the confirmation means is limited to the electron microscopic photography.

When a reason why the volume resistivity is decreased by the electrical resistance reducing treatment step is considered, FIG. 15(A) is an SEM photograph of a transverse cross section (a cross section which is orthogonal to an extending direction of a streak part) of the conductive pattern 2 which has not been subjected to an electrical resistance reducing treatment, as obtained in Example 10 using silver particles; and though the silver particles vary in particle size, they are generally independent, and though the contact between a part of adjacent particles (particle-to-particle distance: 0) is found, any of the contacts is only point contact. This is corresponding to a state where the particles are not fused to each other. Also, a structure in which three or more of fused particles are continued (also referred to as "combined" or "connected") and integrated is not present.

On the other hand, FIG. 15(B) is an SEM photograph of a transverse cross section of Example 10 which has been subjected to an electrical resistance reducing treatment. In the adjacent particles to each other, there are present a number of particles coming into contact with each other on a plane (line on the transverse cross section) (particle-to-particle distance: 0), namely adjacent particles fused to each other. Furthermore, continuous paths formed by fusion of three or more particles to each other are observed, and when the paths are joined, a path communicating from one slope surface of the conductive pattern layer 2 to the other slope surface is formed in a zigzag line shape. This path formed by the fused particles upon being continued is able to flow a current with a low resistance therethrough, and it may be considered that the matter that one or more paths connecting one side edge to the other side edge of the conductive pattern layer 2 in a linear, zigzag line and/or curved shape are present is especially desirable from the standpoint of a reduction of the volume resistivity.

From this matter, as to a connecting structure (also referred to as "cluster" or "lump") constituting a path in which plural particles are fused and which is able to flow a current with a low resistance therethrough, so far as it is preferably a connecting structure in which the particles are continued such that its length is about ½ of the line width of the conductive pattern layer 2, the fusion cannot be always confirmed by a sectional photograph of the subject site; however, it may be estimated that a probability that a path connecting from one side edge to the other side edge is present in other sectional site is high, and as a result, a reduction of the volume resistivity can be achieved. In this respect, in view of the fact that there is found a phenomenon in which when a pattern which has not been subjected to an electrical resistance reducing treatment is subjected to a wiping-out test with an alcohol, the surface resistivity increases, whereas in the pattern after carrying out the treatment, the surface resistivity does not substantially change, it may be estimated that a firm binding between the conductive particles is formed, and it may be considered that this proves the foregoing cluster formation.

As to why the fusion occurs among particles by the acid treatment, the warm water treatment or a successive combination of these treatment, whereby the volume resistivity is lowered, promotion of metal diffusion of the silver particles each other due to the fact that the particle surface is washed, shrinkage of the resin binder to be caused due to the moisture or acid, a reduction of the solvent component, or the matter that the metal having been once dissolved is again solidified in a state where it envelops the surfaces of plural adjacent particles or fills a gap among the respective particles, or the like may be considered, but a true reason has been able to be not confirmed yet.

Figure 14:
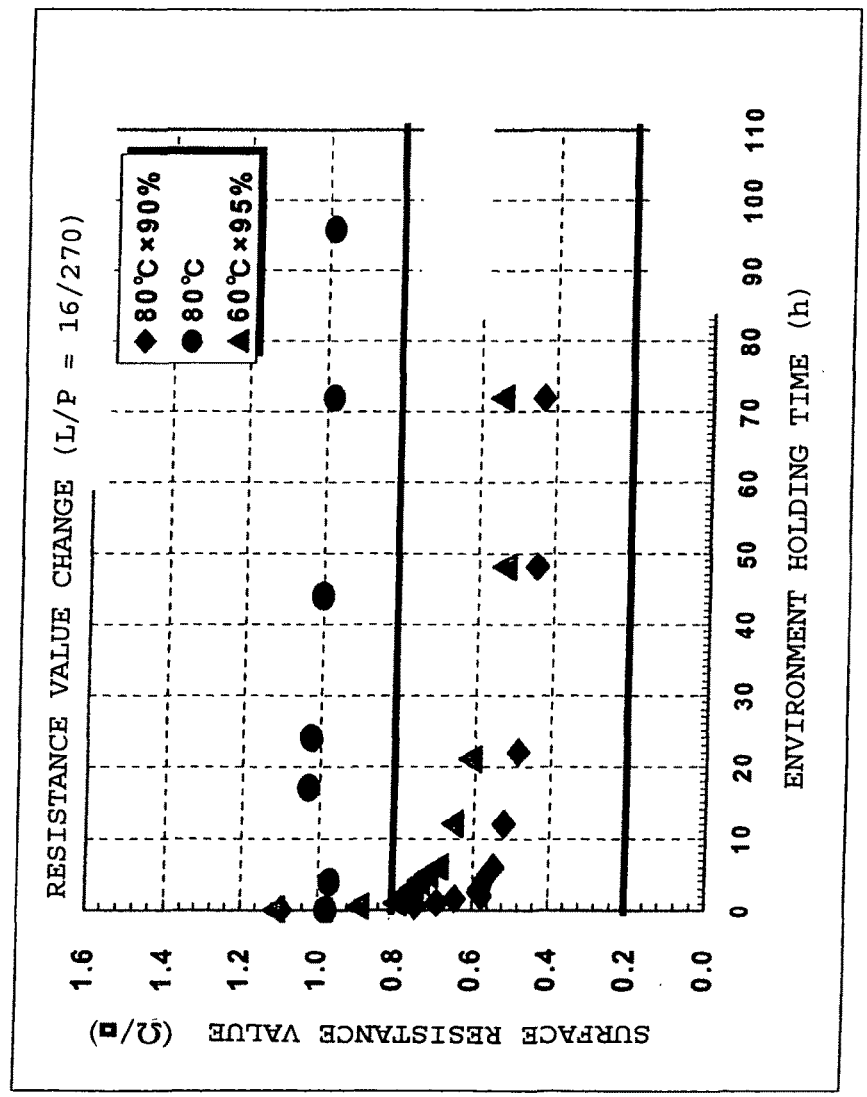
FIG. 14 is a graph expressing a relation among a warm water treatment (wet heat treatment), an environment holding time and a surface resistivity in an electromagnetic wave shielding material of the present invention.

In this respect, as is clear from FIG. 14, it is confirmed that when a heat treatment is merely carried out at 80° C., the volume resistivity is not reduced. Also, it is confirmed that as compared with only the acid treatment or warm water treatment, when the warm water treatment is carried out after the acid treatment, a reduction rate of the resistivity is large.

In this respect, in FIG. 1, a symbol 7 stands for an electromagnetic wave shielding pattern part, and a symbol 8 stands for a grounding part.

A configuration which is used for the manufacturing method of the present invention is hereunder described in detail. In this respect, those which are individually used for the invention of the electromagnetic wave shielding material of the first embodiment and the invention of the electromagnetic wave shielding material of the second embodiment are described herein, and those which are not particularly described are used in common, respectively.

(Transparent Substrate)

As to the transparent substrate 1, known materials and thicknesses may be properly selected while taking into consideration required physical properties such as transparency (light transmission) in a visible light region, heat resistance, and mechanical strength, and rigid materials of a plate-like body, such as plates of transparent inorganic materials, for example, glass, ceramics, or resin plates may be used. However, when continuous processing adaptability in a roll-to-roll mode with excellent productivity is taken into consideration, a flexible resin film (or sheet) is preferable. In this respective, the "roll-to-roll mode" as referred to herein means a processing mode in which the film is unwound from a take-up (roll) and supplied, properly processed and then wound up around a take-up, followed by storage.

Examples of the resin of the resin film or resin plate include polyester based resins such as polyethylene terephthalate (PET), polyethylene naphthalate (PEN), an ethylene glycol/1,4-cyclohexanedimethanol/terephthalic acid copolymer, an ethylene glycol/terephthalic acid/isophthalic acid copolymer, and a polyester based thermoplastic elastomer; acrylic resins such as polymethyl methacrylate; polyolefin based resins such as polypropylene, and a cycloolefin polymer; cellulose based resins such as triacetyl cellulose; polycarbonate based resins; polyimide (PI) based resins; and the like. Above all, polyethylene terephthalate is a preferred transparent substrate from the standpoints of heat resistance, mechanical strength, light transmittance, cost and the like with respect to its biaxially stretched film.

Examples of the transparent inorganic material include glasses such as soda-lime glass, potash glass, borosilicate glass, and lead glass; transparent ceramics such as PLZT; quartz; and the like.

Basically, a thickness of the transparent substrate is not particularly limited but may be properly selected depending upon an application or the like, and in the case of utilizing a flexible resin film, it is, for example, from about 12 to 500 μm, and preferably from about 25 to 200 μm. In the case of utilizing a plate of a resin or a transparent inorganic material, its thickness is, for example, from about 500 to 5,000 μm.

Also, in order to ensure adhesion to the conductive pattern layer in the invention of the first embodiment and adhesion to the primer layer 3 in the invention of the second embodiment, a surface treatment may be applied onto the surface of the transparent substrate for the purpose of separately improving adhesion, or an easy-adhesive layer, an underlayer or the like may be provided.

For example, in the case where the material of the transparent substrate is composed of a polyester resin and the primer layer is composed of an acrylate based ionizing radiation polymerizable composition, the underlayer may be a coating film made of a polyester resin, an acrylic resin, a urethane resin, an epoxy resin, etc. and having a thickness of from about 0.1 to 1 μM.

(Primer Layer)

The primer layer 3 which is used for the invention of the second embodiment is a layer having a principal object of enhancing transition properties of the ink (conductive composition) from a printing plate to a material to be printed (transparent substrate) at the time of printing and formation of the convex pattern layer 2 and enhancing adhesion between the conductive composition and the material to be printed after the transition. That is, the primer layer 3 is also a layer which has good adhesion to both of the transparent substrate and the convex pattern layer and which is transparent for the purpose of ensuring light transmittance of an aperture (convex pattern layer non-forming part).

Furthermore, this primer layer 3 is a layer which is provided on the transparent substrate 1 in a state where fluidity can be kept and which is formed as a layer to be solidified from a liquid state during a time when it comes into contact with the intaglio at the time of intaglio printing and is a layer which is solidified when an ultimate electromagnetic wave shielding material is formed.

Originally, a material constituting such a primer layer is not particularly limited; however, a layer formed by coating an ionizing radiation curable resin composition containing an ionizing radiation polymerizable compound which is liquid (fluid) in an uncured state is suitably used in the present invention. This material is hereunder focused and described in detail.

As the ionizing radiation polymerizable compound, a monomer and/or a prepolymer capable of being polymerized and cured with an ionizing radiation through a reaction such as crosslinking.

As such a monomer, examples of a radical polymerizable monomer include various (meth)acrylates such as monofunctional (meth)acrylates, for example, methyl (meth)acrylate, butyl (meth)acrylate, 2-ethylhexyl (meth)acrylate, lauryl (meth)acrylate, isobornyl (meth)acrylate, dicyclopentenyl (meth)acrylate, etc.; polyfunctional (meth)acrylates, for example, dipropylene glycol di(meth)acrylate, 1,6-hexanediol di(meth)acrylate, neopentyl glycol di(meth)acrylate, trimethylolpropane tri(meth)acrylate, pentaerythritol tri (meth)acrylate, pentaerythritol tetra(meth)acrylate, dipentaerythritol penta(meth)acrylate, dipentaerythritol hexa(meth)acrylate, etc.; and the like. Here, the expression "(meth) acrylate" means an acrylate or a methacrylate. Examples of a cation polymerizable monomer include alicyclic epoxides such as 3,4-epoxycyclohexenylmethyl-3',4'-epoxycyclohexene carboxylate; glycidyl ethers such as bisphenol A diglycidyl ether; vinyl ethers such as 4-hydroxybutyl vinyl ether; oxetanes such as 3-ethyl-3-hydroxymethyl oxetane; and the like.

Also, as such a prepolymer (or oligomer), examples of a radical polymerizable prepolymer include various (meth) acrylate prepolymers such as urethane (meth)acrylate, epoxy (meth)acrylate, polyester (meth)acrylates, triazine (meth) acrylate, and silicon (meth)acrylate; polythiol based prepolymers such as trimethylolpropane trithioglycolate, and pentaerythritol tetrathioglycolate; unsaturated polyester prepolymers; and the like. Besides, examples of a cation polymerizable prepolymer include novolak based epoxy resin prepolymers, aromatic vinyl ether based resin prepolymers and the like.

Such a monomer or prepolymer can be used singly depending upon a required performance or coating adaptability or the like; and besides, a mixture of two or more kinds of monomers, a mixture of two or more kinds of prepolymers, or a mixture of one or more kinds of monomers and one or more kinds of prepolymers can be used.

In the case where ultraviolet rays or visible light is employed as the ionizing radiation, a photopolymerization initiator is usually used. As the photopolymerization initiator, in the case of a radical polymerizable monomer or prepolymer, benzophenone based, thioxanthone based, benzoin based or acetophenone based compounds and the like are useful; and in the case of a cation polymerizable monomer or prepolymer, metallocene based, aromatic sulfonium based or aromatic iodonium based compounds and the like are useful. Such a photopolymerization initiator is added in an amount of from about 0.1 to 5 parts by mass based on 100 parts by mass of the composition composed of the foregoing monomer and/or prepolymer.

In this respect, as the ionizing radiation, ultraviolet rays or an electron beam is representative. Besides, electromagnetic waves such as visible light, X-rays, and γ-rays; or charged particle rays such as α-rays, various ionic beams can be used.

During curing the primer layer on the printing plate surface and then releasing it, in the case of using a material system with heavy release (good adhesion to the printing plate), a method of subjecting the printing plate surface to release processing or coating a release material is also taken; however, taking into consideration a processing cost or lifetime of release capability, a release agent can be added to the primer layer as the need arises. The release agent which is used in the present invention refers to an additive which in the manufacture of an electromagnetic wave shielding material, regulates the primer layer on the transparent substrate having gone through a primer curing step so as to have a small force (release force) required for releasing the primer layer from the printing plate, thereby enhancing release properties such that it is smoothly released. Examples of such a release agent include higher fatty acid esters of a monohydric or polyhydric alcohol, phosphoric acid esters, silicone resin based release agents, fluorocarbon resin based release agents and the like.

As the higher fatty acid ester, partial esters or complete esters of a monohydric or polyhydric alcohol having from 1 to 20 carbon atoms and a saturated fatty acid having from 10 to 30 carbon atoms are preferable. Examples of the partial ester or complete ester of a monohydric or polyhydric alcohol and a saturated fatty acid include stearic acid monoglyceride, stearic acid monosorbitate, behenic acid monoglyceride, pentaerythritol monostearate, pentaerythritol tetrastearate, propylene glycol monostearate, stearyl stearate, palmityl palmitate, butyl stearate, methyl laurate, isopropyl palmitate, 2-ethylhexyl stearate and the like.

Of these, stearic acid esters such as stearic acid monoglyceride, and pentaerythritol tetrastearate are especially preferable from the viewpoints of transparency and release properties.

Such a release agent can be used singly or in combinations of two or more kinds thereof.

The release agent is added in an amount of preferably from 0.1 to 5% by mass, and especially preferably from 0.5 to 3% by mass on the basis of the whole amount of the ionizing radiation curable composition for forming the primer layer. When the amount of the release agent is less than 0.1% by mass, the release properties of the primer layer from the printing plate are not enhanced, and even when the release agent is added in an amount exceeding 5% by mass, the release performance is saturated, and such is not economical.

Though the ionizing radiation curable composition may contain a solvent, in that case, a drying step after coating becomes necessary; and therefore, taking into consideration a cost, a solvent-free type (non-solvent type or solventless type) is preferable. In the case of adding a solvent for the purpose of improving the appearance or improving the coating adaptability, drying becomes necessary; however, when the addition amount of the solvent is an amount of about several %, drying may be carried out after curing. Though it is preferable that the amount of the residual solvent is as small as possible, so far as physical properties or durability is not affected, the amount of the solvent may be not zero.

Though a thickness of the primer layer 3 (TB: evaluated in terms of a thickness of a non-forming part of the conductive pattern layer (hereinafter also referred to as "convex pattern layer") 3 as shown in FIG. 3(A)) is not particularly limited, the primer layer 3 is usually formed in a thickness after curing of from about 1 µm to 100 µm. Also, a thickness (TB) of the primer layer 3 is usually from about 1 to 50% in terms of a ratio to the total sum value of the convex pattern layer 2 and the primer layer 3 (total thickness; a difference in height between a top of the convex pattern layer 2 and a surface of the transparent substrate 1 while referring to FIG. 3(A)).

(Convex Pattern Layer Composed of Conductive Composition)

As to the electromagnetic wave shielding material in the present invention, the conductive pattern layer 2 composed of a conductive composition is provided on the transparent substrate 1 or on an easy-adhesive layer further provided thereon as the need arises in the invention of the electromagnetic wave shielding material of the first embodiment; or provided in a prescribed pattern on the primer layer 3 while making it intervene therebetween in the invention of the electromagnetic wave shielding material of the second embodiment. As the pattern shape, though a mesh (network or lattice) shape is representative, besides, a stripe (parallel line group or striped pattern) shape, a spiral shape and the like are also useful. In the case of a mesh shape, a polygon such as a triangle, for example, an equilateral triangle, an inequilateral triangle, a quadrilateral, for example, regular square, a rectangle, a trapezoid, a rhomb, etc., a hexagon, an octagon, etc.; a circle; an ellipse; and the like are useful as a unit lattice shape. Also, for the purpose of reducing moire, a random network or pseudo-random network pattern or the like can be used. As to its line width and line-to-line pitch, usually employed dimensions may be employed. For example, the line width can be regulated to from 5 to 50 µm, and the line-to-line pitch can be regulated to from 100 to 500 µm. An aperture ratio (ratio occupied by the total sum area of the aperture in the whole area of the electromagnetic wave shielding pattern) is usually from about 50 to 95%. Also, separately from the electromagnetic wave shielding pattern of the mesh, there may be the case where the entirety of the surroundings thereof or a part thereof is provided with a grounding pattern adjacent thereto while keeping communication therewith, such as a full solid. This grounding pattern may be formed at the same of the formation of a shielding pattern, may be formed separately using a conductive ink, or may be formed by sticking a conductive metal tape, etc. In this respect, as a printing method in the case of forming the grounding pattern separately using such a conductive ink, in particular, since a fine pattern reproduction precision is not required, the same printing method as in the convex pattern layer 2 may be adopted, or various known printing methods such as silk screen printing, flexo printing, and offset printing may be adopted.

In this respect, in order to obtain higher transparency, from the viewpoint that it is required to make the line width much more finer, the line width is regulated to not more than 50 µm, preferably not more than 30 µm, and especially preferably not more than 20 µm.

Also, though a thickness of the conductive pattern layer 2 varies depending upon a resistance value of the conductive pattern layer 2, in view of an even balance between an electromagnetic wave shielding performance and adhesive adaptability of other member onto the conductive pattern layer, in the measurement in its central part (top of the protruded pattern), the thickness of the conductive pattern layer 2 is usually 2 µm or more and not more than 50 µm, and preferably 5 µm or more and not more than 20 µm.

In the invention of the electromagnetic wave shielding material of the first embodiment, this conductive pattern layer 2 can be formed from a conductive composition (conductive ink or conductive paste) containing the conductive particle 2a and the binder resin 2b by various known printing methods such as silk screen printing, flexo printing, and offset printing.

Also, in the invention of the electromagnetic wave shielding material of the second embodiment, the conductive patter layer 2 can be obtained upon being formed on the primer layer 3 by an intaglio printing method as described later.

Also, in order that it may become possible to form the metal layer 4 stably on the surface of the conductive pattern layer 2 by means of electroplating, it is preferable that the surface resistivity of the conductive pattern layer composed of the conductive composition is as low as possible. Specifically, it is preferable that the conductive pattern layer 2 is constituted such that its surface resistivity is not more than 2Ω/□. Furthermore, in order to reveal sufficient electromagnetic wave shielding properties without forming a metal layer on the surface of the conductive pattern layer and in a region having a line width of not more than 25 µm, a line thickness of not more than 20 µm and an aperture ratio of 80% or more, which is often employed as an electromagnetic wave shielding mesh, it is preferable that the surface resistivity of the conductive pattern layer composed of the conductive composition is lower as far as possible. Specifically, it would be better to constitute the conductive pattern layer such that its surface resistivity is preferably not more than 1.2Ω/□, and more preferably not more than 0.8Ω/□. In order to regulate the surface resistivity of the conductive pattern layer to not more than 0.8Ω/□, as described later, it is effective to select a metal having a low volume resistivity, such as silver, gold, and copper as the material of the conductive particle; to regulate an average particle size of the conductive particle to not more than 3 µm; to use a mixed system of a small-particle size particle and a large-particle size particle as a particle size of the conductive particle; to make a density of the conductive particle in a top of the convex pattern layer dense; or to transfer the convex pattern layer onto the primer layer and then apply a treatment in the presence of moisture at a high temperature (a so-called wet heat treatment) or a treatment with an acid, or to form the conductive pattern layer, then apply an acid treatment and subsequently apply a warm water treatment. It would be better to use one or two or more of these means jointly. In particular, it is preferable to form the conductive pattern layer, then apply an acid treatment and subsequently further apply a warm water treatment because an electrical resistance reducing effect is remarkably revealed.

As to the volume resistivity exhibiting the conductivity of the conductive composition itself, its apparent value varies depending upon a shape to be printed. For example, as compared with a volume resistivity in the case of forming a commercially available conductive paste into a solid shape (aperture-free shape), the finer the pattern shape to be formed, the larger the apparent volume resistivity in the case of forming the conductive composition in a pattern as calculated according to the following expression is.

(Apparent volume resistivity [Ω·cm])=(Surface resistivity of pattern part [Ω/☐])×(Thickness of pattern part [cm])×(Pattern occupancy ratio) (Expression)

Thickness of pattern part: (Thickness of pattern forming part)−(Total thickness of pattern non-forming part (aperture))

Pattern occupancy ratio: Proportion of an area of the pattern-formed portion in unit areas For example, a volume resistivity in the case of solid coating a commercially available dry curable silver paste and drying it is usually in an order of not more than $10^{-5}$ [Ω·cm]; however, when mesh pattern printing is actually carried out, the apparent volume resistivity is often increased by one digit or more. This is caused due to the fact that a filling ratio of silver particles or a chance of contact of the particles with each other is reduced. For example, even when the pattern occupancy ratio is identical, as the line width or thickness is close to the particle size of the conductive particle, the resistance increases. Here, by using the foregoing various means, this increase of the volume resistivity is suppressed. In particular, by carrying out the treatment with temperature and humidity (electrical resistance reducing treatment step), the apparent volume resistivity is reduced to a value of from 80 to 50% as compared with the case before carrying out the treatment.

Also, by carrying out the acid treatment, the apparent volume resistivity is reduced to a value of from 80 to 50% as compared with the case before carrying out the treatment.

In particular, by carrying out a warm water treatment after the acid treatment, the apparent volume resistivity is reduced to a value of from 60 to 30% as compared with the case before carrying out the treatment.

Examples of the conductive particle constituting the conductive composition include particles of a low-resistivity metal such as gold, silver, platinum, copper, nickel, tin, and aluminum; particles prepared by covering the surface of, as a core particle, a high-resistivity metal particle, a resin particle, an inorganic non-metal particle or the like with a low-resistivity metal such as gold, and silver; graphite particles; conductive polymer particles; conductive ceramic particles; and the like.

The shape of the conductive particle can be selected among a polyhedral shape such as a regular polyhedral shape, and a truncated polyhedral shape, a spherical shape, a spheroidal shape, a scaly shape, a discoid shape, a branch shape, a fibrous shape, an acicular shape and the like. Of these, a polyhedral shape, a spherical shape or a spheroidal shape is especially preferable. Such a material or shape may be properly mixed and used.

Since the size of the conductive particle is arbitrarily selected depending upon the kind, it cannot be unequivocally specified; however, one having an average particle size of from about 0.01 to 10 μm can be preferably used. In order to obtain good electromagnetic wave shielding properties by making the electrical resistance of the obtained convex pattern layer low [as described previously, the surface resistivity (also abbreviated merely as "surface resistance") is preferably not more than 0.8Ω/☐], it is preferable that the average particle size is small, and from this viewpoint, the average particle size is preferably from 0.1 to 3 μm. Small particles having an average particle size of several tens nm, which are generally called "nano particles", lead to a high cost, and when a binder resin is incorporated thereinto, a performance thereof is lowered, and stability as an ink is lowered. Also, as to the distribution of the particle size, in order to make the electrical resistance of the obtained convex pattern low, one composed of a mixed system of a relatively large-particle size particle and a relatively small-particle size particle as shown in FIG. 15(A) is more preferable than one having a narrow distribution width and close to a single particle size. For example, a mixed system of a small-particle size particle having a particle size in the range of from 0.01 μm to 1 μm and a large-particle size particle having a particle size in the range of from 5 to 10 μm is preferable. A mixing ratio of the both particles in such a mixed system is in the range of preferably from 1/9 to 9/1, and especially preferably from 5/5 to 9/1 in terms of a ratio of the number of small-particle size particles to the number of large-particle size particles. As a matter of course, when particles which are larger than the line width or thickness of the pattern are incorporated, defects such as deletion, or streak occur frequently at the time of printing, and therefore, an average size or maximum particle size of the large-particle size particle varies depending upon a pattern design. Also, besides mixing of particles of plural kinds having a different average particle size from each other, particles having particle size distribution to some extent may be used from the beginning.

As to reasons why when the particle size of the conductive particle is a mixed system of a small-particle size particle and a large-particle size particle, the surface resistivity of the conductive composition (convex pattern layer composed of such a mixed system) is lowered, inferring from the fact that when a cross section of the convex pattern layer composed of such a system is observed by an electron microscope, a form in which small-particle size particles are distributed upon being filled in gaps where large-particle size particles are distributed is observed, it may be considered that such a lowering is caused due to the fact that gaps free from the contact of the large-particle size particles with each other are reinforced by the contact with the small-particle size particles intervening therein, whereby a total sum of electric contact areas of large and small particles mutually dispersed in the conductive composition increases (corresponding to the matter that in the foregoing expression: R=ρL/S, the sectional area S increases).

Also, as to the distribution of the conductive particle in the convex pattern layer, various forms can be selected according to a desired characteristic or manufacturing adaptability; however, as an especially preferred embodiment, as shown in FIG. 15(A) according to the invention of the electromagnetic wave shielding material of the second embodiment, there is exemplified distribution in which in the neighborhood of a top of the convex pattern layer (a direction getting away from the primer layer), a gap between the particles becomes relatively small, and a density of the particle number, namely the particle number per unit volume becomes high (dense), whereas in the neighborhood of a bottom of the convex pattern layer (a direction getting near to the primer layer), a gap between the particles becomes relatively large, and a density of the particle number becomes low (non-dense or coarse).

In the case of such a distribution form, in a use form in which the electromagnetic wave shielding material of the present invention is placed on a screen of an image display device, namely in the case where the electromagnetic wave shielding material of the present invention is used in a direction where the convex pattern layer side faces the image display device side, whereas the transparent substrate side faces the observer side of an image, since the conductive particle standing opposite to the observer side is coarse in the density, it scatters external light (electric lamp light, sunlight, etc.), thereby reducing reflected light coming into eyes of the observer, especially mirror-reflected light. As a result, whitening of the image and glare of the surrounding scene in the presence of external light can be prevented, and a lowering of the image contrast can be prevented; and therefore, such is preferable. In order to reveal this effect much more effectively, it is preferable to select a polyhedral, spherical or spheroidal shape rather than a scaly shape because a plane close to a mirror plane is hardly formed on the surface on the primer layer side of the convex pattern layer. Also, in the case of employing a scaly material as the conductive particle shape, when an orientation direction of the scaly conductive particle in the convex pattern layer (for example, the orientation direction is defined as a normal direction of the largest plane of the scale) is randomly distributed, the mirror reflection is reduced, and such is preferable. In this respect, even in the case where the shape of the conductive particle is a polyhedral, spherical or spheroidal shape, what its orientation direction is made random is preferable from the standpoint of reducing the mirror reflected light.

Also, at the same time, the conductive particles standing opposite to the image display device side are minutely gathered; the electrical contact among the respective particles become good; the electrical resistance is decreased; and the electromagnetic wave shielding effect is increased. In this respect, as a matter of course, though such conductive particles distributed in a high density are high in reflectance against visible light, since the conductive particles are located on the plane of the side where the observer cannot see them (opposite side to the observer), there is no fear about a lowering of the image contrast or the like. Also, in the case of a use form in which the electromagnetic wave shielding material of the present invention is placed such that the conductive particle layer is located on the image observer side, a blackening treatment may be applied on the surface of the convex pattern layer as the need arises.

Also, a structure in which the particles are minutely present in the neighborhood of a top of the convex pattern layer gives rise to an effect for reducing the contact resistance in the contact with a grounding part in the case of using the present mesh as an electromagnetic wave shielding member.

Figure 8:
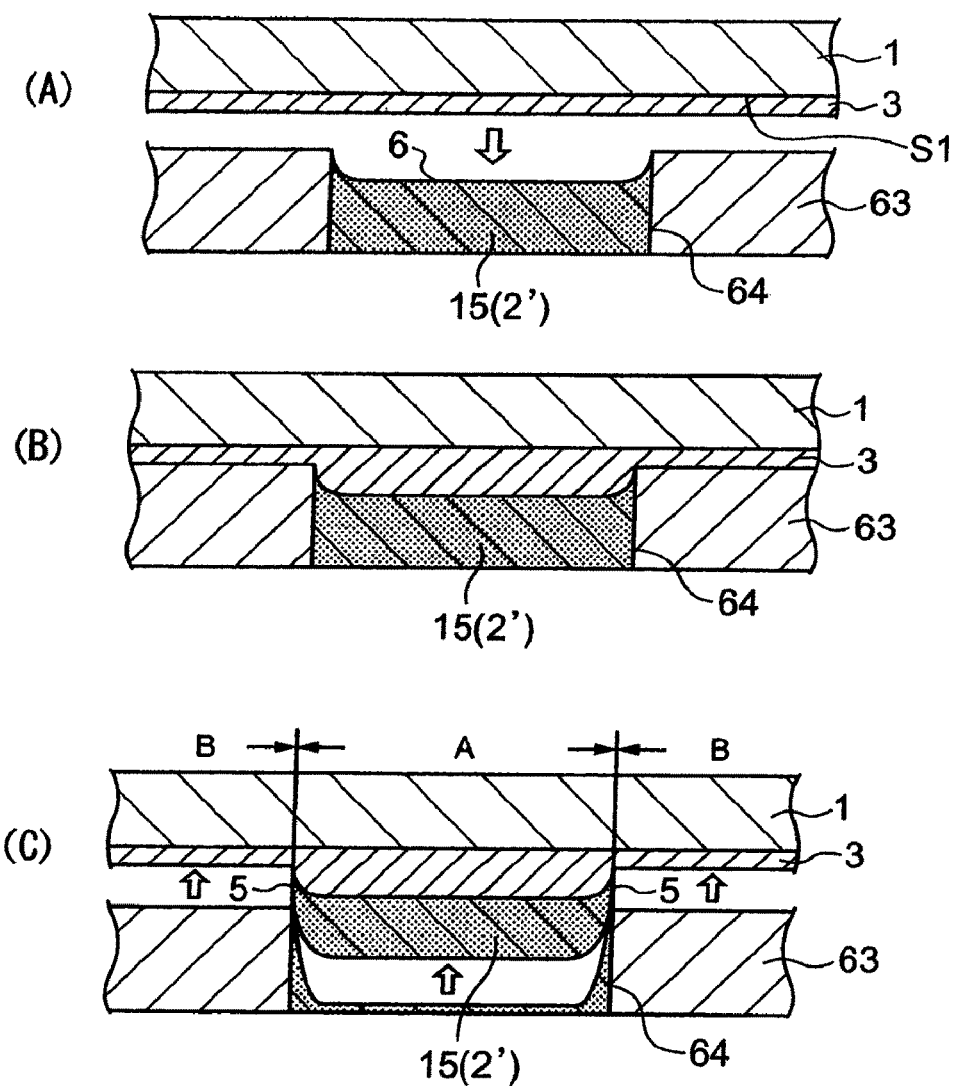
FIG. 8 is a schematic view showing a form of filling a primer layer in a depression of a conductive composition in a recess, whereby the conductive composition is transferred.

For the purposes of controlling the density distribution of the conductive particles in the convex pattern layer, thereby making the distribution relatively coarse in the neighborhood of the primary layer and dense in the neighborhood of a top of the convex pattern, respectively as shown in FIG. 15(A), or making the orientation direction of the particles random in the neighborhood of the primer layer and orienting the particles parallel or substantially parallel in a top of the convex pattern layer, for example, it is effective that in the manufacturing method of the electromagnetic wave shielding material of the second embodiment of the present invention to which an intaglio printing method is applied as described later (see FIG. 8), not only a pressure for pressing the primer layer in a fluid state on the transparent substrate against the depression (see the symbol 6 in FIG. 8(A)) on the upper surface of the conductive composition filled in the recess of the printing plate is set up high, but a viscosity of the conductive composition in an uncured state is set up low, and the conductive composition is not solidified in the recess of the printing plate but solidified after being released from the printing plate. Besides, such density distribution and orientation state of the conductive particles rely upon a kind of the binder resin of the conductive composition, a material, a particle size and a particle shape of the conductive particle, a blending ratio of the binder resin and the conductive particle, a coating condition or a solidification condition of the conductive composition and the like. Actually, a condition which is in agreement with required density distribution and orientation of the conductive particle is experimentally determined from various conditions under which such density distribution and orientation state of the conductive particle are influenced.

A content of the conductive particle in the conductive composition is arbitrarily selected depending upon the conductivity of the conductive particle and the form of the particle, and for example, the conductive particle can be contained in an amount in the range of from 40 to 99 parts by mass based on 100 parts by mass of solids of the conductive composition. In this respect, in the present specification, when the average particle size is referred to, it means an averaged value of particle sizes measured upon observation by a particle size distribution meter or TEM (transmission electron microscope).

As the binder resin constituting the conductive composition, any of a thermosetting resin, an ionizing radiation curable resin and a thermoplastic resins can be used. Examples of the thermosetting resin include resins such as a melamine resin, a polyester-melamine resin, an epoxy-melamine resin, a phenol resin, a polyimide resin, a thermosetting acrylic resin, a thermosetting polyurethane resin, and a thermosetting polyester resin; examples of the ionizing radiation curable resin include those described above as the material of the primer; and examples of the thermoplastic resin which is used singly or in admixture of two or more kinds thereof include resins such as a thermoplastic polyester resin, a polyvinyl butyral resin, a thermoplastic acrylic resin, a thermoplastic polyurethane resin, and a vinyl chloride/vinyl acetate copolymer, and such a resin is used singly or in admixture of two or more kinds thereof. In this respect, in the case of using a thermosetting resin, a curing catalyst may be added as the need arises. In the case of using an ionizing radiation curable resin, a photopolymerization initiator may be added as the need arises.

Also, in the invention of the electromagnetic wave shielding material of the second embodiment, in order to obtain fluidity suited for filling in the recess of the printing plate, such a resin is usually used as a varnish dissolved in a solvent. Though the kind of the solvent which is used for a conductive paste is not particularly limited, the solvent can be arbitrarily selected among solvents which are generally used for printing inks and used; however, those which do not hinder stable curing of the primer layer 3 or do not swell, whiten or dissolve the primer layer after curing are preferable. Though a content of the solvent is usually from about 10 to 70% by mass, it is preferable that the content of the solvent is as small as possible within the range where necessary fluidity is obtained. Also, in the case of using an ionizing radiation curable resin, since it has originally fluidity, the solvent is not always necessary.

Also, for the purpose of improving fluidity or stability of the conductive composition, a filler, a thickener, an antistatic agent, a surfactant, an antioxidant, a dispersant, an anti-setting agent and the like may be added so far as conductivity or adhesion to the transparent substrate or the primer layer is not adversely affected.

[Manufacturing Method of Electromagnetic Wave Shielding Material]

As shown in the flowchart of FIG. 5(A), the manufacture invention of the first embodiment is a method for manufacturing an electromagnetic wave shielding material comprising a step of forming a prescribed conductive pattern layer on one surface of a transparent substrate using a conductive composition containing conductive particles and a binder resin; a curing step of curing (drying) the binder resin of the formed conductive pattern layer to form a conductive layer; a step of subjecting the cured conductive layer to an acid treatment; and a step of subjecting the acid-treated conductive layer to a warm water treatment, wherein the conductive layer in which in observation of a transverse cross section of the conductive layer by electron microscopic photography, at least a part of the conductive particles has a fused continuation is formed.

In the manufacture invention of the first embodiment, the conductive resin composition containing the foregoing conductive particle and binder resin is formed into a prescribed conductive pattern layer by various known printing methods such as silk screen printing, flexo printing, and offset printing, and thereafter, the binder resin is cured to form a conductive layer. In the present invention, the term "curing" includes not only curing of the curable binder resin in a narrow sense by a crosslinking reaction, a polymerization reaction, etc. but volatilization, drying, etc. of the solvent contained in the ink and refers to a state where the printed pattern is solidified and adheres onto the transparent substrate.

Though the acid treatment and the warm water treatment of the cured conductive layer are hereunder described, the contents of the acid treatment and the warm water treatment are common in the manufacture invention of the first embodiment and the manufacture invention of the second embodiment.

After curing the conductive composition to form a conductive layer, by going through a step of carrying out the acid treatment and subsequently the warm water treatment step, the surface resistivity of the conductive layer is lowered, and the electromagnetic wave shielding performance is enhanced. This phenomenon is conspicuously observed especially in the case where the conductive particle is silver or a silver-containing particle, and this is also hereinafter referred to as "electrical resistance reducing treatment step". This is different from a so-called burning treatment and is not a long-time heating treatment which likely damages a general film substrate such as PET. Also, this method is extremely effective as a treatment method in the case of using a conductive ink with general properties, which contains a binder such as a resin, but not a dispersion liquid of nano-size particles which is known as a printing ink for low-temperature burning.

The acid treatment as referred to in the present invention means a treatment by bringing the conductive pattern layer formed by curing the binder resin into contact with an acid, thereby reducing the electrical resistance of the conductive pattern layer and lowering the surface resistivity of the conductive layer.

The acid as referred to in the present invention is not particularly limited but can be selected among various inorganic acids and organic acids. Examples of the inorganic acid include hydrochloric acid, sulfuric acid, nitric acid, phosphoric acid and the like. Examples of the organic acid include acetic acid, citric acid, oxalic acid, propionic acid, lactic acid, benzenesulfonic acid and the like. Such an acid may be either a strong acid or a weak acid. The acid is preferably acetic acid, hydrochloric acid, sulfuric acid or an aqueous solution thereof, and more preferably hydrochloric acid, sulfuric acid or an aqueous solution thereof, with hydrochloric acid being especially preferable from the viewpoint of easy handling.

A time of the acid treatment is sufficiently not more than several minutes, and even when the treatment time is more prolonged, there may be the case where the enhancing effect of conductivity is not increased, or there may be the case where the enhancing effect of conductivity is deteriorated. The treatment time with an acid is preferably from 15 seconds to 60 minutes, more preferably from 15 seconds to 30 minutes, further preferably from 15 seconds to 2 minutes, and especially preferably from 15 seconds to one minute.

A temperature of the acid treatment is sufficiently ordinary temperature. When the treatment is carried out at a high temperature, a vapor of the acid is generated to cause deterioration of surrounding metal devices, and in the case of using a thermoplastic resin film as the transparent substrate, there is a concern that the transparent substrate is whitened, or the transparency is impaired; and thus, such is not preferable. The treatment temperature is preferably not higher than 40° C., more preferably not higher than 30° C., and further preferably not higher than 25° C.

A method of the acid treatment is not particularly limited, and for example, a method of dipping the convex pattern layer in an acid or a solution of an acid, a method of coating an acid or a solution of an acid on the conductive pattern layer and a method of applying a mist (droplet) or vapor of an acid or a solution of an acid onto the convex pattern layer are adopted. Of these, a method of bringing the conductive pattern layer into contact with a liquid of an acid, such as a method of dipping the conductive pattern layer in a solution of an acid, and a method of coating an acid or an acid solution on the conductive pattern layer is preferable because it is excellent in the conductivity enhancing effect and low in corrosion of machines or a problem on the sanitary environment of a worker by the mist or vapor of the acid. That is, as to the acid treatment condition, it is preferable to carry out dipping of the conductive pattern layer in a solution of an acid or coating of a solution of an acid on the conductive pattern layer at a temperature of not higher than 40° C.

In the case of using a solution of an acid, a concentration of the acid is preferably not more than 10 moles/L, more preferably not more than 5 moles/L, and further preferably not more than 1 mole/L. What the concentration of the solution of the acid is high is not preferable because there may be the case where the workability is lowered to deteriorate the productivity; and when a thermoplastic resin film is used as the transparent substrate, there may be the case where the transparent substrate is whitened to impair the transparency. Also, in the case where the concentration of the acid is too low, the effect to be brought by the treatment with an acid is not obtained; and thus, it is desirable that the concentration of the acid is preferably 0.05 moles/L or more, and more preferably 0.1 moles/L or more.

In this respect, in the case of using a solution of an acid, there is a concern about adverse influences due to a residue of the acid, and therefore, after the treatment, water washing, rinsing and drying steps are necessary. In the present invention, since the warm water treatment is subsequently carried out, an independent rinsing step can be omitted.

Next, the warm water treatment step is described.

In the present invention, the warm water treatment which is carried out subsequently to the acid treatment step is not particularly limited, and for example, a method of dipping the conductive pattern layer in warm water composed of only water as a component and having a prescribed water temperature or a warm aqueous solution composed of water as a main component and containing a surface cleaning agent, a treating agent, etc. of the conductive pattern layer while taking into consideration the post factum formation or lamination of an adhesive layer (also called "dipping in water"), a method of coating or sprinkling and running warm water or a warm aqueous solution on the conductive pattern layer, a method of spraying warm water or a warm aqueous solution and a method of applying a mist (droplet) or vapor thereof onto the conductive pattern layer are adopted. Of these, a method of bringing the conductive pattern layer and warm water into direct contact with each other, such as a method of dipping the conductive pattern layer in warm water and a method of sprinkling and running warm water on the conductive pattern layer, is preferable because it is excellent in the conductivity enhancing effect. That is, as to the warm water treatment condition, it is preferable to carry out dipping of the conductive pattern layer in warm water having a water temperature of preferably from 30 to 100° C., more preferably from 40 to 95° C., and especially preferably from 70 to 90° C., or continuous running in a warm water tank or continuous running in a warm water shower.

Though pure water, ion-exchanged water, industrial water, tap water and the like can be used as the water used for the warm water treatment, it is desirable to use pure water or ion-exchanged water from the viewpoint of avoiding a problem such as an elevation of the surface resistance or rust generation of the conductive pattern layer to be caused due to impurities and a problem of bringing inferiority to be caused due to precipitation of impurities.

Though a treatment time is related to the warm water temperature, it is from about 30 seconds at 90° C. and generally from about 5 minutes to 20 seconds at from 30 to 100° C.

Also, in the case of applying a water vapor (also called "wet heat treatment"), the material is allowed to stand in an atmosphere filled with the water vapor for a prescribed period of time, and a relative humidity of air (atmosphere) in which the material is allowed to stand is regulated to 70% RH or more, and preferably 85% RH or more. The temperature in such a high-temperature state (an atmosphere temperature in the case of allowing the material to stand in water vapor-containing air or a water temperature in the case of dipping in water) is 30° C. or higher, and preferably 60° C. or higher. However, when the temperature is too high, since denaturation or alteration of the resin binder or transparent substrate is caused, in the case of a usual material, the temperature is regulated to not higher than 120° C.

As shown in FIG. 14, it would be better to regulate the treatment time (environment holding time) in the wet heat treatment to about 48 hours because the surface resistivity is lowered with a lapse of time up to 48 hours after starting the treatment but becomes substantially constant after lapsing 48 hours.

Next, the manufacturing method of an electromagnetic wave shielding material of the manufacture invention of the second embodiment is described in detail by reference to the drawings.

FIG. 5(B) is a flowchart showing an example of a manufacturing method of an electromagnetic wave shielding material of the second embodiment of the present invention. Also, FIG. 7 is a diagrammatic configuration view of an apparatus for carrying out the manufacturing method according to the manufacture invention of the second embodiment of the present invention; and FIG. 8 is a schematic view showing a form of filling a primer layer in a depression of a conductive composition in a recess, whereby the conductive composition is transferred.

Figure 6:
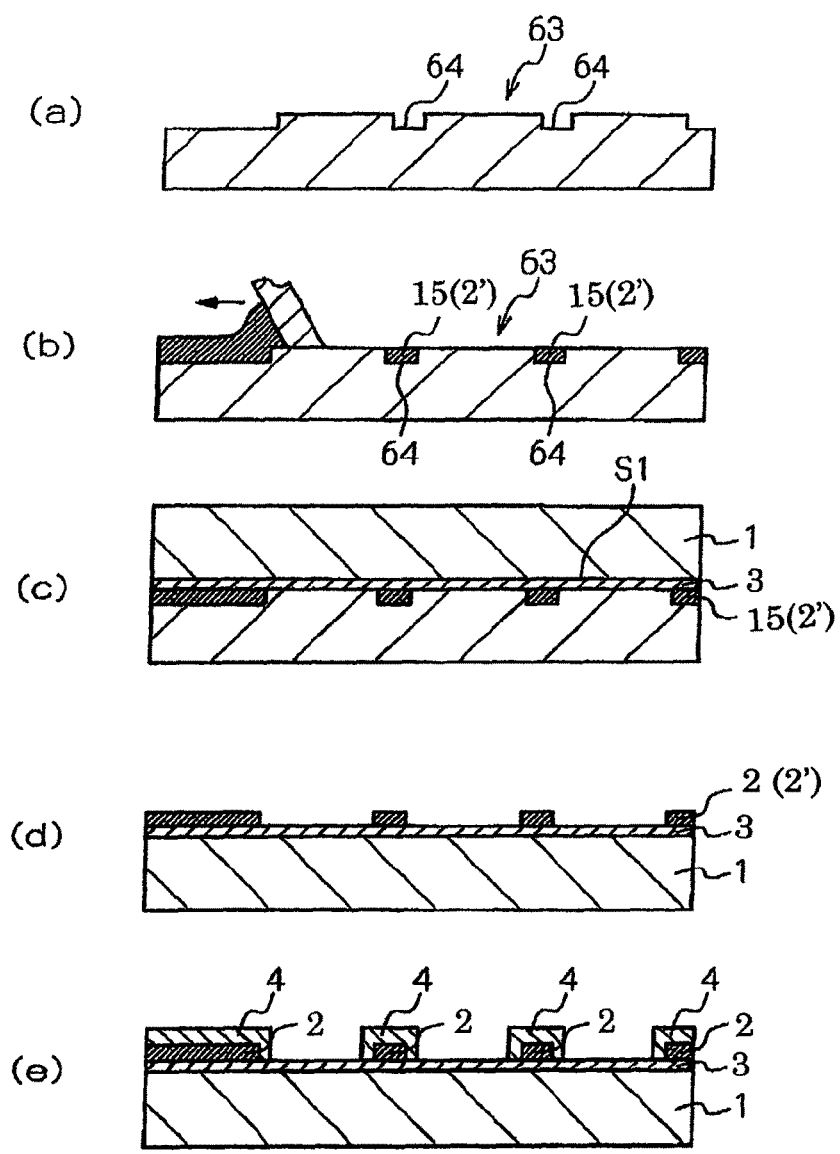
FIG. 6 is an explanatory view showing an example of steps of a manufacturing method of an electromagnetic wave shielding material of the present invention.
Figure 7:
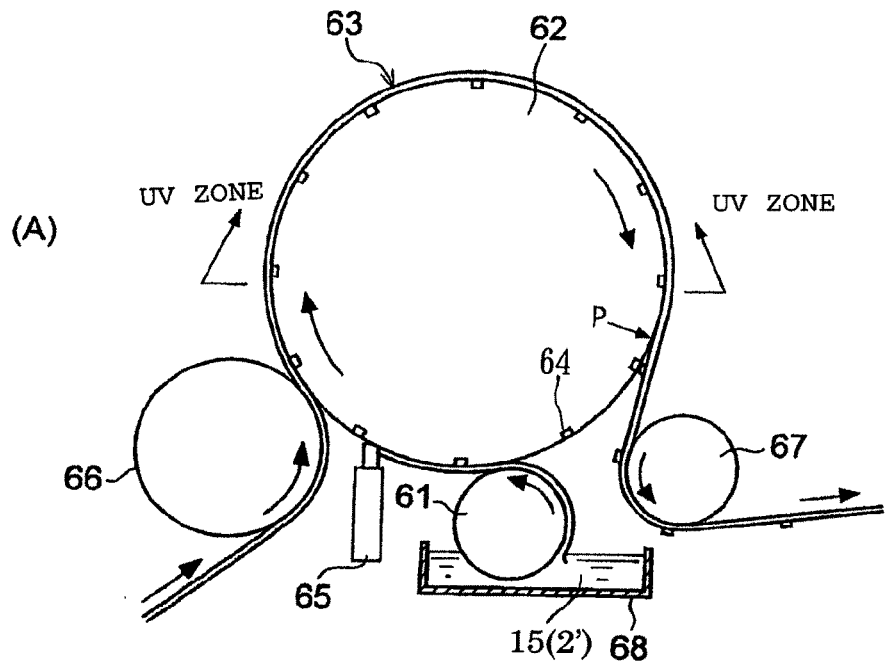
FIG. 7 is a diagrammatic configuration view of an apparatus in the case of (A) a normal plate release state and (B) an abnormal plate release state, respectively in a transfer step of transferring a conductive composition onto a primer layer.
Figure 7:
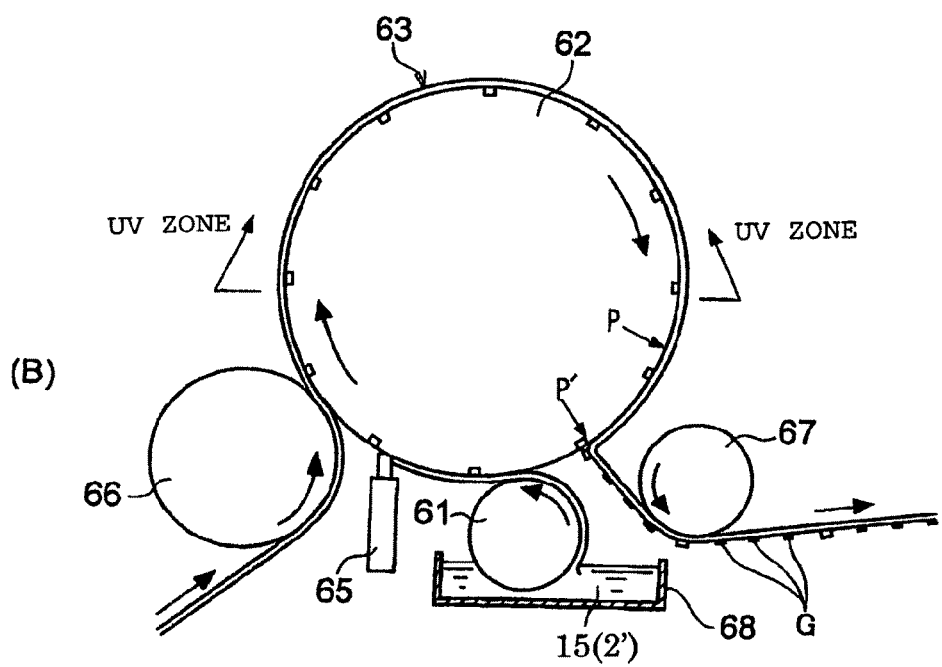

The manufacturing method of an electromagnetic wave shielding material of the manufacture invention of the second embodiment of the present invention is concerned with a manufacturing method of the electromagnetic wave shielding material 20 (see FIG. 11(B)) having the convex pattern layer 2 formed on one surface of the transparent substrate 1 and as shown in FIGS. 6 to 8, includes at least a transparent substrate preparing step of preparing the transparent substrate 1, on one surface S1 of which is formed the primer layer 3 capable of keeping fluidity until it is cured; a filling step (see FIGS. 6(b) and 8(A)) of, after coating the conductive composition 15 (2') capable of forming a cured material with conductivity after curing on a plate-like or cylindrical printing plate 63 having a convex pattern formed thereon, scraping away the conductive composition attached to other portion than the recess, thereby filling the conductive composition 15 in a recess 64; a press bonding step (see FIG. 8(B)) of press bonding the recess 64 side of the printing plate 63 after the filling step and the primer layer 3 side of the transparent substrate 1 after the transparent substrate preparing step to each other, thereby bringing the conductive composition 15 in the recess 64 and the primer layer 3 into intimate contact with each other without forming any void; a primer curing step of, after the press bonding step, curing the primer layer 3; a transfer step (see FIG. 8(C)) of, after the primer curing step, releasing the transparent substrate 1 from the printing plate 63, thereby transferring the conductive composition 15 (2') in the recess onto the primer layer 3; and a curing step of, after the transfer step, curing the conductive composition layer 2' formed in a prescribed pattern on the primer layer 3 to form a conductive layer.

In this respect, curing of the primer layer and curing of the conductive composition can be carried out at the same time. In that case, the primer curing step and the curing step of forming the conductive layer are combined in a single step. Thereafter, the transfer step is carried out. The respective steps are hereunder described by reference to the drawings.
(Transparent Substrate Preparing Step)

The transparent substrate preparing step is a step in which the fluidity can be kept until it is cured and the transparent substrate 1 on one surface S1 of which the primer layer 3 to which a solvent or a release agent is added as the need arises is formed is prepared. Though the primer layer 3 is formed by coating a resin composition for primer layer on the transparent substrate 1, since such a resin composition for primer layer is one described previously, its explanation is omitted. The transparent substrate 1 having the primer layer 3 may be a purchased material, or may be one formed by the coating method shown in FIG. 5(B). In all of the cases, it is necessary that the primer layer 3 is in a state where the fluidity is kept at the time of press bonding as described later.

For example, in the case where a curable resin composition which is liquid at room temperature is used as the resin composition for primer layer, it is preferable that in an unirradiated state where an ionizing radiation is not irradiated, only the solvent in its ionizing radiation curable resin composition is dried and removed to form the primer layer 3 in a fluid state as a coating film on the transparent substrate, followed by supplying it in that state into a press bonding step as described later. As a matter of course, in the case where the ionizing radiation curable resin composition which is used herein is of a so-called non-solvent type which does not contain a solvent, a drying step during the formation of the primer layer 3 is not necessary. In the case of a non-solvent type, heating or cooling may be adopted for the purpose of regulating the viscosity at the time of coating.

Also, in the case of using a thermoplastic resin composition as the resin composition for primer layer, any thermoplastic resin composition is useful so far as it is in a fluid state due to heating in a press bonding step as described later; immediately before the press bonding step, the primer layer 3 may be subjected to a heating treatment, or heating of the primer layer 3 using a heating roll, etc. and press bonding onto the printing plate may be carried out at the same time.

In this respect, as to a method of coating the primer layer, various coating modes can be adopted, and the coating method can be properly selected among various modes, for example, roll coating, gravure roll coating, comma coating, die coating, etc.

The coating method shown in FIG. 5(B) is an example of gravure reverse coating and is a method in which the transparent substrate 1 in a film form having been wound in a roll shape is introduced between a gravure roll 51 and a backup roll 52, thereby coating the ionizing radiation curable resin composition for primer layer. In that case, a lower portion of the gravure roll 51 comes into contact with an ionizing radiation curable resin composition filling container 53 and draws up the ionizing radiation curable resin composition, thereby coating it on one surface of the transparent substrate 1. At that time, an excess of the ionizing radiation curable resin composition is scraped away by a doctor blade 54. After coating the ionizing radiation curable resin composition on the transparent substrate 1, a drying treatment of the solvent contained in the resin composition is applied as the need arises. For example, as shown in FIG. 5(B), this drying treatment is a treatment in which only the solvent in the ionizing radiation curable resin composition having been regulated to a viscosity suitable for a coating device is dried and removed by passing the transparent substrate having a primer layer coated thereon through a drying zone (warm air blowing, irradiation with infrared rays, etc. is carried out in the inside thereof), thereby forming the primer layer 3 in a fluid state to be provided for a subsequent press bonding step. In the case of using an ionizing radiation curable resin composition of a non-solvent type having a viscosity suitable for a coating device, a drying device is not necessary. The transparent substrate 1 having the primer layer 3 which keeps fluidity is then supplied into a press bonding step.

(Resin Filling Step)

As shown in FIGS. 6 and 7, the conductive composition filling step is a step in which after coating the conductive composition 15 (2') capable of forming the convex pattern layer 2 after curing on the plate-like or cylindrical printing plate 63 having the recess 64 formed in a prescribed pattern such as a mesh form thereon (a planar intaglio is exemplified in FIG. 6, and a cylindrical intaglio is exemplified in FIG. 7), the conductive composition attached to other portion than the recess is scraped away by a doctor blade [a form illustrated in FIG. 6(b)], a roll, etc., thereby filling the conductive composition 15 in the recess. Since the conductive composition 15 is one described previously, its explanation is omitted herein.

A combination of the conductive composition with the resin composition for primer layer is not particularly limited, a mode of the curing treatment of the resin composition for primer layer and a mode of the curing treatment of the conductive composition may be different from each other; however, in the case of employing a conductive particle-containing ionizing radiation curable resin as the conductive composition 15, it is preferable that the resin composition for primer layer is also an ionizing radiation curable resin composition. By employing such a combination, curing of the primer layer 3 and curing of the conductive resin composition layer 15 (2') can be carried out at the same time through the press bonding step after this resin filling step and the subsequent ionizing radiation irradiation step at the time of the curing step of the primer layer. At that time, in the case where the ionizing ration to be irradiated is light or ultraviolet rays, curing can be carried out by selecting an adequate combination of a photopolymerization initiator and a photocurable resin. In this respect, in the case of ultraviolet ray irradiation, when the conductive particle has a color through which light does not pass, such as black, only the surface thereof is easily cured, and thus, it is necessary to take into consideration the matter that a resin in the inside is hardly cured.

Also, in the case of irradiating an electron beam, it is not particularly necessary to take into consideration the color of the conductive particle.

In this respect, the coating method shown in FIGS. 5(B) and 7 is an example of a step to be carried out prior to press bonding the transparent substrate 1 having the primer layer 3 onto the intaglio roll 62 which is a cylindrical printing plate, and specifically, a lower portion of a pickup roll 61 comes into contact with a conductive composition filling container 68 and draws up the conductive composition 15 (2'), thereby coating it on the printing plate 63 of the intaglio roll 62. At that time, the conductive composition 15 is scraped away by a doctor blade 65 such that it does not ride on other portion than the recess 64 on the printing plate 63.

(Press Bonding Step)

As shown in FIGS. 5(B) and 7, the press bonding step is a step of press bonding the recess 64 of the printing plate 63 after the resin filling step and the primer layer 3 side of the transparent substrate 1 after the transparent substrate preparing step to each other, thereby bringing the conductive composition 15 in the recess 64 and the primer layer 3 into intimate contact with each other without forming any void. The press bonding is carried out by a nip roll 66 and energized under a prescribed pressure against the intaglio roll 62. The nip roll 66 is provided with a regulating means of an energizing pressure, and the energizing pressure is arbitrarily regulated according to the fluidity of the primer layer 3. On that occasion, as shown in FIG. 7, the primer layer 3 flows into the undesired recess 6 which is generated in an upper part of the conductive composition 15 filled in the recess 64 of the printing plate and fills a void between the transparent substrate 1 and the conductive composition 15.

(Curing Step)

The curing step is a step of curing the primer layer 3 after the press bonding step by an energizing force of the nip roll 66, and by carrying out the curing treatment in a state after press bonding, curing can be carried out in a state where the primer layer 3 and the conductive composition 15 come into intimate contact with each other. Specifically, in the case where the resin composition for primer layer is an ionizing radiation curable resin composition, it is irradiated with an ionizing radiation in an irradiation zone (represented by a symbol "UV" and located in an upper portion of the intaglio roll 62 in FIG. 7) and subjected to a curing treatment.

In that case, since the primer layer is in a form where it is interposed between the transparent substrate and the printing plate and is not cured and impaired by oxygen in air, a nitrogen purging apparatus or the like is not always necessary.

In this respect, similar to the foregoing, the curing treatment is selected depending upon the kinds of the resin composition for primer layer and the conductive composition, and for example, a curing treatment such as an ionizing radiation irradiation treatment, heating, and a cooling treatment is applied.

(Transfer Step)

As shown in FIG. 8(C), the transfer step is a step in which after the curing step, the transparent substrate 1 is released from the printing plate 63 of the intaglio roll 62, thereby transferring the conductive composition 15 in the recess 64 onto the primer layer 3. Since the primer layer 3 is cured in the primer curing step prior to this step, by releasing the transparent substrate 1 from the printing plate 63 of the intaglio roll 62, the conductive composition 15 which has come into intimate contact with the primer layer 3 is separated from the inside of the recess and transferred completely onto the primer layer 3 to form the conductive composition layer 2'. In this transfer step, it is possible to transit the conductive composition 15 in a transition rate close to substantially 100% (according to the foregoing definition, usually from about 80% to 95%, or more). As shown in FIGS. 5(B) and 7(A), the release is carried out by the nip roll 67 provided on the outlet side. And in general, the release from the intaglio roll 62 is substantially smoothly carried out at the normal release point P; however, in the case where the release properties of the primer layer from the printing plate are so insufficient that the location of the release point P moves to the release point P' as shown in FIG. 7(B), thereby causing vibration in front and behind, such can be improved by adding a release agent to the primer layer, or the like. In this respect, in the transfer step, it is not always necessary to cure the conductive composition 15, and transition can be achieved even in a state where the solvent is contained in the conductive composition 15. Though the reason for this has not been elucidated yet, it may be supposed that in a state where the both come into intimate contact with each other without forming any void, an adhesion between the cured primer layer 3 and the conductive composition 15 is larger than an adhesion between an inner wall of the recess 64 of the intaglio roll and the conductive composition 15.

(Electrical Resistance Reducing Treatment Step)

After the conductive composition is transferred from the inside of the intaglio recess onto the transparent substrate via the primer layer, thereby forming the convex pattern layer, the volume resistivity of the convex pattern is lowered, and the electromagnetic wave shielding performance is enhanced by (i) carrying out the warm water treatment by treating it in the presence of moisture at a relatively high temperature or (ii) carrying out the acid treatment by bringing it into contact with an acid. This phenomenon is observed especially in the case where the conductive particle is silver or a silver-containing particle, and this is also hereinafter referred to as "electrical resistance reducing treatment step". This is different from a so-called burning treatment and is not a long-time heating treatment which likely damages a general film substrate such as PET. Also, it is possible to use a conductive ink with general properties, which contains a binder such as a resin, but not a dispersion liquid of nano-size particles which is known as a printing ink for low-temperature burning.

In the electrical resistance reducing treatment step, each of the warm water treatment (in the presence of moisture) (i) and the acid treatment (ii) is identical by itself with that in the case of the manufacture invention of the first embodiment; and therefore, the descriptions thereof are quoted herein, and overlapping descriptions are omitted herein.

However, in the electrical resistance reducing treatment step in the manufacture invention of the second embodiment, only the warm water treatment (i) may be carried out; only the acid treatment (ii) may be carried out; after the warm water treatment (i), the acid treatment (ii) may be subsequently carried out; or after the acid treatment (ii), the warm water treatment (i) may be subsequently carried out. In the inventive electrical resistance reducing treatment step of these various forms, it is preferable to carry out the warm water treatment (i) subsequently to the acid treatment (ii) from the standpoints of the inventive electrical resistance reducing effect and the workability.

According to such an electrical resistance reducing treatment step, the surface resistivity of the whole of the convex pattern is reduced to from about 80 to 30% of that prior to the treatment (the apparent volume resistivity is also reduced to from about 80 to 30% of that prior to the treatment).

Also, though this reduction of the volume resistivity is found regardless of the particle shape and size of the conductive composition and the kind of the resin binder, when a conductive paste in which (a) an average particle size of the conductive particle is from 0.1 µm to 1 µm and (b) the conductive particle is composed of a mixture of a relatively large-particle size particle and a relatively small-particle size particle is used, the surface resistivity after the pattern formation can be made small as compared with the case of using a conductive paste falling outside the foregoing, and an absolute value of the surface resistivity after the treatment can be made small and regulated to a value of not more than 0.8Ω/□ after the treatment in a general pattern design. Also, even in the case of forming a metal layer by means of electroplating as described later, a plating treatment rate can be increased by decreasing the surface resistivity by the present treatment, whereby the productivity is enhanced.

In the manufacture invention of the second embodiment, similar to the manufacture invention of the first embodiment, as the electrical resistance reducing treatment step, in particular, after curing the conductive composition to form a conductive layer, by going through a step of carrying out the acid treatment and subsequently the warm water treatment step, the surface resistivity of the conductive layer is lowered within an extremely short period of time, and the electromagnetic wave shielding performance is enhanced, and therefore, such is preferable. This phenomenon is observed especially in the case where the conductive particle is silver or a silver-containing particle. This is different from a so-called burning treatment and is not a long-time heating treatment which likely damages a general film substrate such as PET. Also, this method is extremely effective as a treatment method in the case of using a conductive ink with general properties, which contains a binder such as a resin, but not a dispersion liquid of nano-size particles which is known as a printing ink for low-temperature burning.

Since the details of the step of carrying out the acid treatment and subsequently the step of carrying out the warm water treatment in this order in the manufacture invention of the second embodiment are the same as the process and the contents of the foregoing manufacture invention of the first embodiment, explanations thereof are omitted.

Though a reason why the volume resistivity is reduced by such an electrical resistance reducing treatment step has not been elucidated yet at present as described previously, for example, when silver is used as the conductive particle and a change in the state of the silver particle before and after the treatment is observed by SEM (scanning electron microscope), a change of the silver particle shape, partial fusion, a reduction of particle-to-particle distance and the like are observed, and it may be assumed that such is a direct cause of the reduction of volume resistivity.

Figure 3:
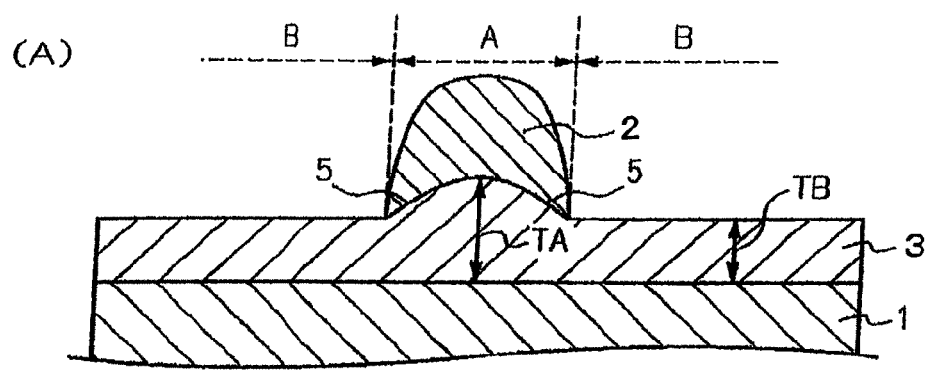
FIG. 3 is a schematic sectional view showing more enlargedly a part of FIG. 2.
Figure 3:
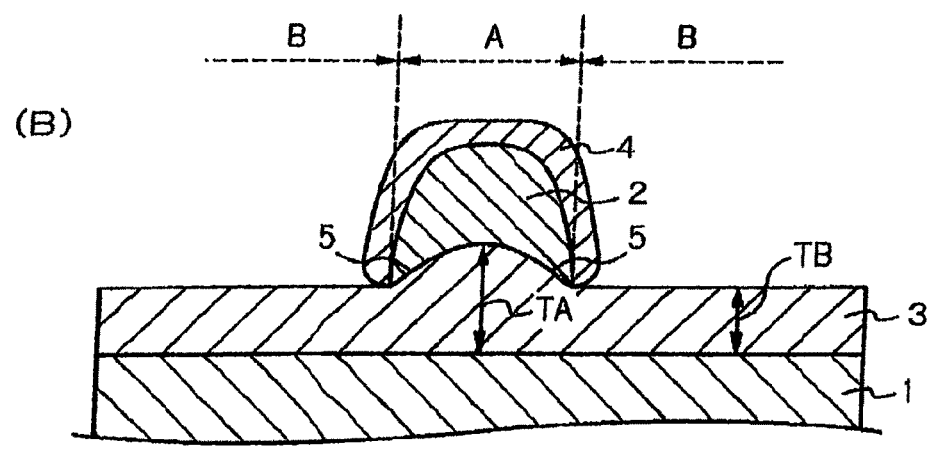
Figure 4:
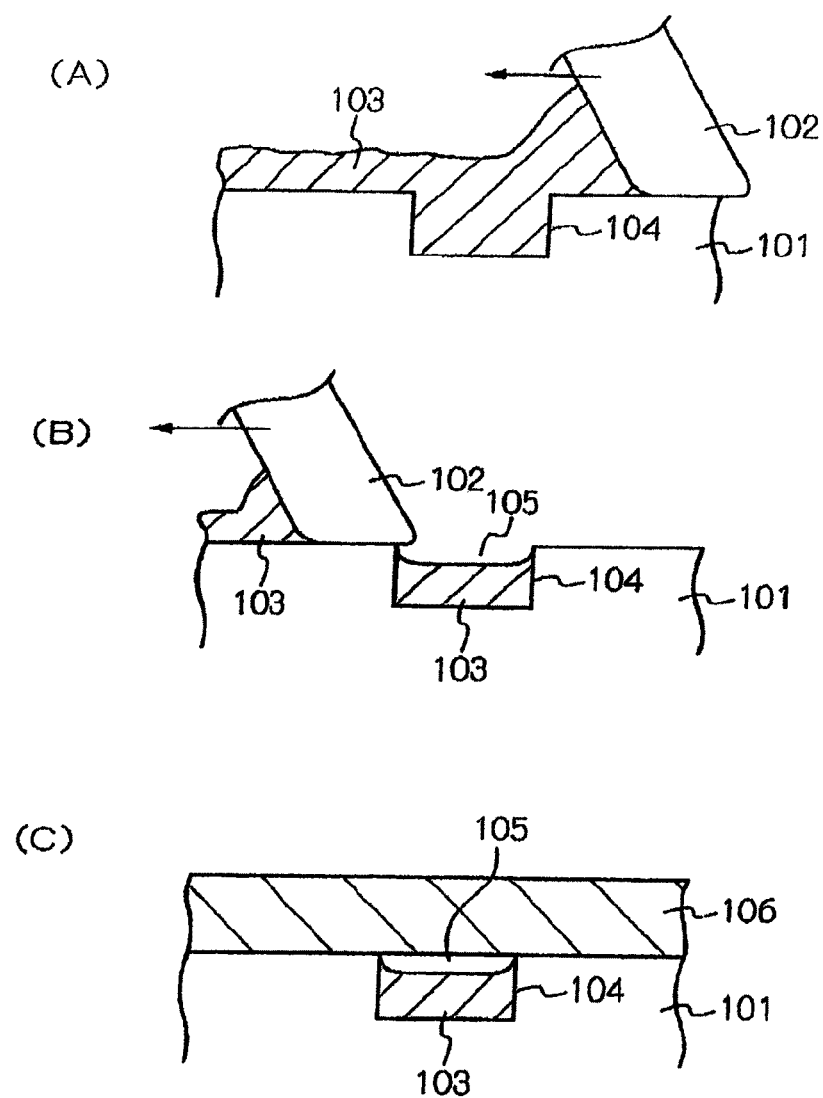
FIG. 4 is an explanatory view of a conventional phenomenon in which an untransferred part of a conductive ink composition is generated on a transparent substrate.

While the steps are somewhat inverted, FIG. 8 is a schematic view showing a form of filling the primer layer 3 in the depression 6 of the conductive composition 15 in the recess 64, whereby the conductive composition 15 is transferred. As shown in FIGS. 8(C) and 3, when a form of the primer layer 3 after the transfer step and a form of the conductive material layer 2' are observed, the thickness TA of a portion A of the primer layer 3 where the conductive material layer 2' is transferred is thicker than the thickness TB of a portion B where the conductive material layer 2' is not transferred. And in side edges 5, 5 of the portion A having a larger thickness, the conductive material layer 2 wraps around the side of the portion B having a smaller thickness. In such a form, as shown in FIGS. 8(A) and 8(B), by press bonding the primer layer 3 side of the transparent substrate 1 in which the primer layer 3 keeping fluidity is formed and the recess 64 side of the printing plate 63 after the resin filling step to each other, the primer layer 3 having fluidity is filled in the depression 6 which is easily generated in an upper part of the conductive composition in the recess 64; and therefore, as shown in FIG. 8(C), the form after the transfer is a form in which the thickness TA of the portion A of the primer layer 3 provided on the transparent substrate 1 where the conductive material layer 2 is formed is larger than the thickness TB of the portion B where the conductive material layer 2 is not formed, and furthermore, in the side edges 5, 5 of the portion A having a larger thickness, the conductive material layer 2 wraps around the side of the portion B having a smaller thickness. In general, as shown in FIG. 3, the thickness TA of the primer layer in the portion A where the convex pattern layer is formed becomes thick as it is advanced toward a central part of the subject portion. That is, in the transverse cross section of the pattern part for electromagnetic wave shielding (see, for example, FIG. 3), the sectional shape of the primer layer 3 displays a shape which becomes convex toward a direction going away from the transparent substrate 1, inclusive of so-called bell shapes such as a semicircle, and a semi-ellipse, so-called mountain shapes such as a triangle, a trapezoid, and a pentagon, and analogous shapes thereto.

In particular, a characteristic feature of the electromagnetic wave shielding material of the invention of the electromagnetic wave shielding material of the second embodiment of the present invention resides in an interface between the primer layer and the convex pattern layer in the convex pattern layer forming part.

[Sectional Form of Interface Between Convex Pattern Layer and Primer Layer]

Figure 9:
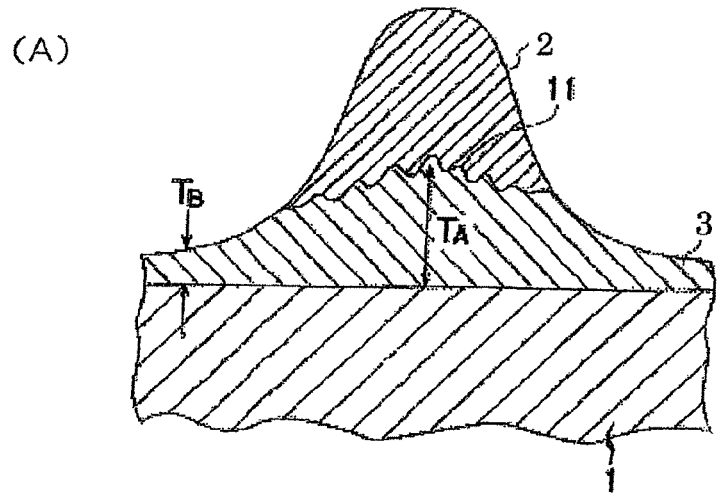
FIG. 9 is a schematic sectional view of an interface form between a convex pattern layer and a primer layer in an electromagnetic wave shielding material of the present invention, in which (A) shows a first embodiment of the interface form, (B) shows a second embodiment of the interface form, and (C) shows a third embodiment of the interface form, respectively.
Figure 9:
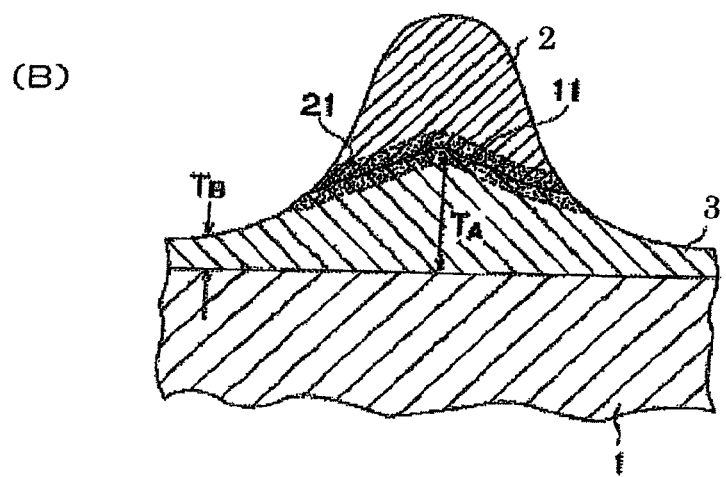
Figure 9:
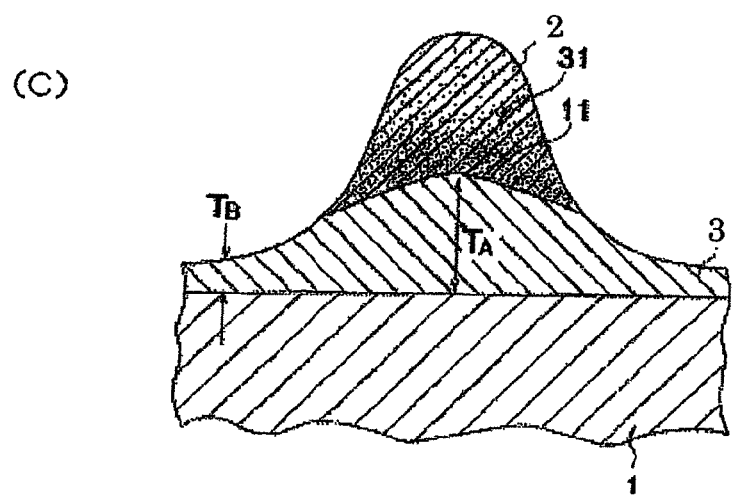
Figure 10:
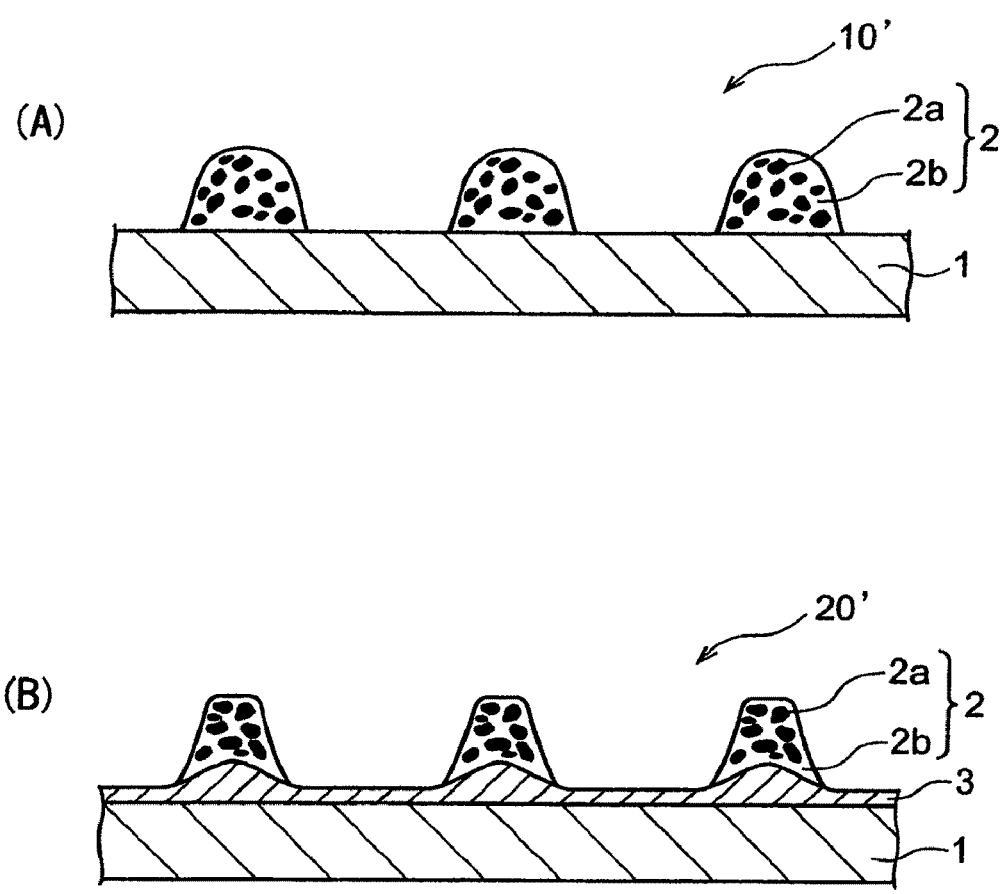
FIG. 10 is a schematic view of a state of conductive particles before applying an electrical resistance reducing treatment to a conductive pattern layer of (A) an invention of an electromagnetic wave shielding material of a first embodiment and (B) an invention of an electromagnetic wave shielding material of a second embodiment, respectively.

The interface between the convex pattern layer 2 composed of a conductive composition and the primer layer 3 in the invention of the electromagnetic wave shielding material of the second embodiment of the present invention is capable to taking sectional forms of three embodiments shown in FIGS. 9(A) to 9(C), and the interface between the convex pattern layer 2 and the primer layer 3 taking (a) a sectional form where the interface between the primer layer 3 and the convex pattern layer 2 is complicated in a non-linear manner (hereinafter referred to as "first embodiment"), (b) a sectional form having a layer where a component constituting the primer layer 3 and a component constituting the convex pattern layer 2 are mixed (hereinafter referred to as "second embodiment"), or (c) a sectional form in which a component contained in the primer layer 3 is present in the conductive composition constituting the convex pattern layer 2 (hereinafter referred to as "third embodiment"; and the sectional form being also referred to as "interface form") gives rises to a preferred result from the standpoints of adhesion and transition properties of the conductive composition.

As shown in FIG. 9(A), the first embodiment of the interface form is a form where an interface 11 between the primer layer 3 and the convex pattern layer 2 is complicated in a non-linear manner alternately on the primer layer 3 side and the convex mesh pattern layer 2 side.

In this respect, in the first embodiment of the interface form, the complicated interface is in a mountain-shaped sectional form where the center is high as a whole.

In this form, the interface 11 may be constituted as an interface between a resin constituting the primer layer 3 and a binder resin or a filling solid particle constituting the conductive layer 2. In that case, the "filling solid particle" is an arbitrary particle or powder and may be the foregoing conductive particle or a non-conductive particle such as an extender pigment. For example, in the case where the conductive composition is constituted of a powdered conductive particle and a binder resin, an interface therebetween is formed in a non-linear manner where the conductive particle in the conductive layer 2 and the resin constituting the primer layer 3 are complicated. At that time, the degree and form of complication are influenced by the shape and size of the conductive particle or powder, the pressure during press bonding the primer layer 3 to the inside of the recess, and the like. Alternatively, this interface 11 may be constituted of an interface between the resin constituting the primer layer 3 and the binder resin constituting the conductive layer 2.

Figure 22:
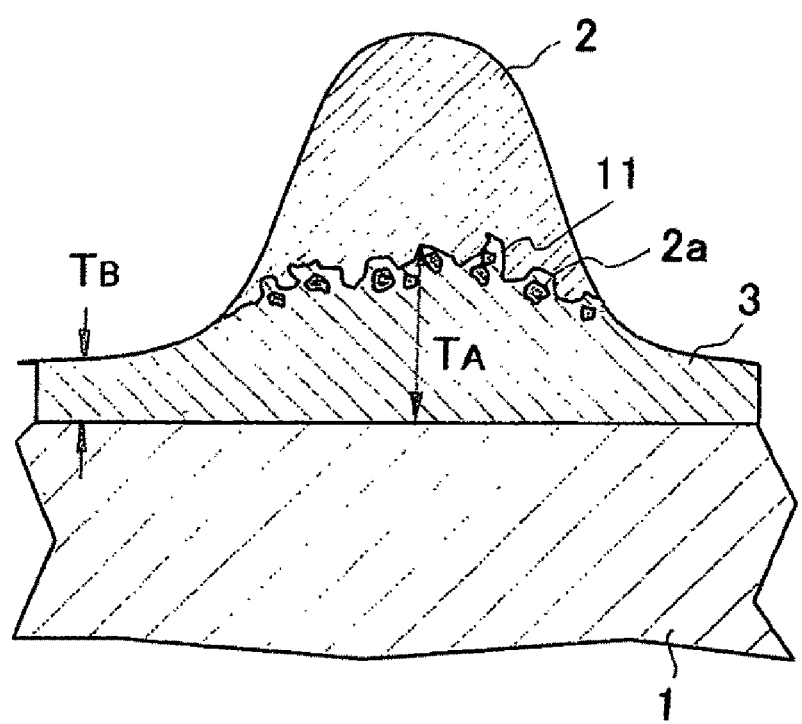
FIG. 22 is a schematic view showing a modification of a first embodiment of an interface form.

In this respect, in the first embodiment of the interface form, the interface 11 between the primer layer 3 and the convex pattern layer 2 is not always a continuous uneven curve shown in FIG. 9(A); and as shown in FIG. 22, when the interface 11 is observed in a cross section with a convex pattern, it is not the case where all of conductive particles 2a on the interface come into contact with each other, but the conductive particles 2a are present in a liberated state here and there, and also, the subject state assumes an amorphous uneven curve fluctuating one by one even in a longitudinal direction of the convex pattern (a depth direction on the paper). In particular, in the case where curing is carried out using a solvent-containing conductive paste, the form shown in FIG. 22 is assumed.

In the first embodiment of such an interface form, even by taking into consideration the matter that the convex pattern layer 2 is formed on the mountain-shaped primer layer 3 which is not originally flat, in addition to good adhesion, since the interface 11 is in a complicated form as described previously, the adhesion between the primer layer 3 and the convex pattern layer 2 is remarkably increased due to a so-called anchor effect. Furthermore, since such an interface form is taken, there gives rise to a special effect that the conductive composition filled in the recess of the printing plate is transferred onto the primer layer 3 at an extremely high transition rate (substantially 100%).

As shown in FIG. 9(B), the second embodiment of the interface form is a form where a region 21 having a mixture of the primer component contained in the primer layer and the component constituting the convex pattern layer is present in the neighborhood of the interface 11 between the primer layer 3 and the convex pattern layer 2. In FIG. 9(B), though the interface distinctly appears, actually, an indistinct, ambiguous interface appears. Also, in FIG. 9(B), the mixing region 21 is present so as to interpose the interface 11 up and down. This case is the case where the primer component in the primer layer and an arbitrary component in the convex pattern layer 2 mutually invade into the both layers. In this respect, the mixing region 21 may be present on the upper side of the interface 11 (the opposite side to the transparent substrate) or may be present on the lower side (the transparent substrate side) of the interface 11. The case where the mixing region 21 is present on the upper side of the interface 11 is the case where the primer component in the primer layer invades into the convex pattern layer, and the component in the convex pattern layer does not invade into the primer layer, whereas the case where the mixing region 21 is present on the lower side of the interface 11 is the case where an arbitrary component in the convex pattern layer invades into the primer layer, and the primer component in the primer layer does not invade into the convex pattern layer.

In the second embodiment of the interface form, even by taking into consideration the matter that the convex mesh pattern layer 2 is formed on the mountain-shaped primer layer 3 which is not originally flat, in addition to good adhesion, since the mixing region 21 is present in the neighborhood of the interface 11 as described previously, the adhesion between the primer layer 3 and the convex pattern layer 2 is remarkably increased. Furthermore, since such an interface form is taken, there gives rise to a special effect that the conductive composition filled in the recess of the printing plate is transferred onto the primer layer 3 at an extremely high transition rate (substantially 100%).

As shown in FIG. 9(C), the third embodiment of the interface form is a form where a primer component 31 contained in the primer layer 3 is present broadly in the convex pattern layer 2. In FIG. 9(C), an embodiment in which a content of the primer component 31 is large in the vicinity of the interface 11 and becomes small toward a top thereof is schematically shown, but it should not be construed that the present invention is limited to such an embodiment. The primer component 31 may invade into the convex pattern layer 2 to an extent that it is detected from the top of the convex pattern layer 2 or to an extent that it is detected mainly in the neighborhood of the interface. In this respect, in the third embodiment, in particular, it may be said that the case where a region where the primer component 31 is present in the convex pattern layer is localized in the neighborhood of the interface 11 is corresponding to a form where in the foregoing second embodiment, the mixing region is present only on the upper side of the interface 11.

Similar to the cases of the foregoing first and second embodiments, in the third embodiment of the interface form, even by taking into consideration the matter that the convex pattern layer 2 is formed on the mountain-shaped primer layer 3 which is not originally flat, in addition to good adhesion, since the primer component 31 invades into the convex pattern layer 2 as described previously, the adhesion between the primer layer 3 and the convex pattern layer 2 is remarkably increased. Furthermore, since such an interface form is taken, there gives rise to a special effect that the conductive composition filled in the recess of the printing plate is transferred onto the primer layer 3 at an extremely high transition rate (substantially 100%).

Though the interface 11 between the convex pattern layer 2 composed of the conductive composition in the present invention and the primer layer 3 has at least one of the characteristic features of the foregoing interface forms of the first to third embodiments, it may have two or more or all of these three characteristic features.

[Convex Pattern Layer]

In particular, in a form in which the convex pattern layer has a mesh shape (this form will be also called "convex mesh pattern layer"), line parts composed of two or more groups of parallel line groups having a different direction from each other cross each other, and an aperture (pattern non-forming part) surrounded by these line parts is formed. In this respect, even in the case where three or more groups of parallel line groups (line parts) cross each other, since basic design points and actions and effects thereof are common, the following explanation is limited to the case of two groups which are in general widely used as an example. Also, though a crossed axes angle of each line group, namely a crossed axes angle θ between a first direction line part and a second direction line part, can be selected from the range of 0°<θ<180°, θ=90° is in general widely used.

[Metal Layer (Plated Layer)]

In the case where the electromagnetic wave shielding material in the present invention is insufficient in the desired conductivity only by the convex mesh pattern layer 2 composed of a conductive composition, in order to further enhance the conductivity, a metal layer can be formed as the need arises and is formed on the convex pattern layer 2 by means of plating. Though the plating method includes methods such as electroplating, and electroless plating, the electroplating is preferable because by increase an amount of electricity, a plating rate can be increased several times, and the productivity can be remarkably enhanced as compared with the electroless plating.

In the case of electroplating, though the supply of electricity into the convex pattern layer 2 is carried out from an electrode brought into contact with the surface on which the convex pattern layer 2 is formed, such as an electricity supply roll, since the convex pattern layer 2 has conductivity (for example, not more than 100Ω/□) to an extent that electroplating can be achieved, the electroplating can be carried out without any problem. Examples of a material constituting the metal layer include those materials having high conductivity and capable of easily achieving plating, such as copper, silver, gold, chromium, and nickel.

As compared with the convex pattern layer 2, the metal layer is generally small in the volume resistivity by one digit or more; and therefore, as compared with the case of ensuring the electromagnetic wave shielding properties by a single convex pattern layer, there is an advantage that a necessary amount of the conductive material can be decreased.

Figure 5:
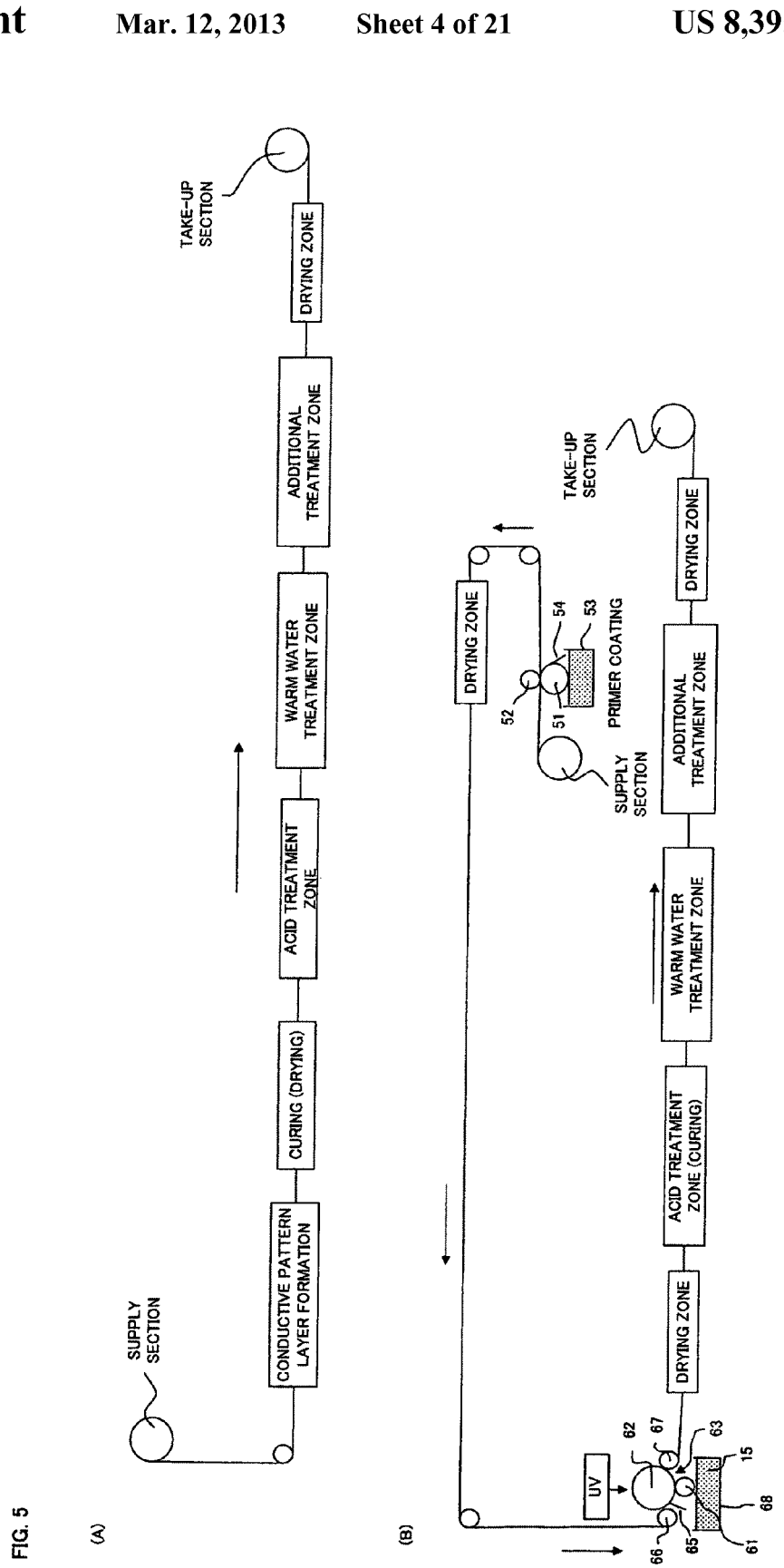
FIG. 5 is a flowchart showing an example of (A) a manufacture invention of a first embodiment and (B) a manufacture invention of a second embodiment, respectively in a manufacturing method of an electromagnetic wave shield of the present invention.

In this respect, though the plating step can be carried out in a step which is designated as an additional treatment zone in FIG. 5, it is not always necessary to carry out it in an in-line mode.

In this respect, after forming the metal layer, the metal layer may be subjected to a blackening treatment, or the protective layer 9 (see FIG. 2) may be provided, as the need arises. Examples of the blackening treatment include treatments such as blackening-nickel plating, and copper-cobalt alloy plating, but the blackening treatment is not always limited to these treatments. Also, the protective layer is a layer for covering the surface of the conductive pattern layer to protect it. In general, as shown in FIG. 2, the protective layer 9 also has a function as a so-called flattening layer for filling irregularities of the conductive pattern layer 2, thereby flattening the surface. The protective layer can be, for example, formed using an acrylic ultraviolet ray curable resin. In the case where the metal which is used in the conductive pattern layer or the metal layer is an easily rusty metal such as copper, it is preferable to carry out a rustproofing treatment; a general rustproofing agent such as a chromate treating agent can be used; and the rustproofing treatment may serve as both the blackening treatment and the protective layer formation.

[Optical Filter]

Though the thus obtained electromagnetic wave shielding material can be used singly, besides, various functional layers may be laminated on the front surface, the back surface or both the front surface and back surface of the electromagnetic wave shielding material. As such a functional layer, an optical functional layer is provided, whereby it can be utilized as an optical filter provided with both functions of an electromagnetic wave shielding function and an optical function. As the optical functional layer, those which are conventionally known can be used as they are, and examples thereof include a near infrared ray absorbing layer, a neon light absorbing layer, a toning layer, an ultraviolet ray absorbing layer, an antireflection layer and an antiglare layer. Also, a layer capable of revealing a function other than the optical function can be complexed in the optical filter as the need arises. Examples of such a layer include an impact resistant layer, an antistatic layer, a hard coat layer, an antifouling layer and the like.

Here, in the case where the foregoing functional layer is formed on the surface on the conductive pattern layer side, there are included a method of directly forming it and a method of sticking a separately formed functional layer. In the case of the direct formation, a method of coating and forming a material capable of revealing the function on the conductive pattern layer surface using a coating apparatus, or a general method such as sputtering, and vapor deposition can be adopted. In any way, it is preferable that the functional layer is a layer having good adhesion to the primer layer used in the present invention.

As the method of coating and forming a material capable of revealing the function, a general method such as gravure (roll) coating, roll coating, comma coating, stencil printing, and die coating can be adopted and is properly selected in conformity with properties of the material and necessary coating precision. Also, in the case where a part of region of the convex pattern layer in the plane is required to be exposed, a method of forming a pattern at the time of coating, such as stencil pattern printing, intermittent coating, and stripe coating, a method of achieving entire coating while masking a place to be exposed and then releasing the mask, a method of removing a functional layer in an unnecessary place, or the like can be adopted.

In the case where the directly formed functional layer is located at the interface (outermost front surface or outermost back surface of the filter) coming into contact with air, it is preferable that the functional layer is flattened for the purpose of suppressing scattering image light and external light or a lowering of the image quality to be caused due to a lens effect.

In the directly formed functional layer, the function may be revealed by a single layer or may be revealed by plural layers. As an example of the case of a single layer, one or plural functions such as a hard coat function, a flattening function, a near infrared ray absorbing function, a neon light absorbing function, an ultraviolet ray absorbing function, a toning function, an antireflection function, an antiglare function, an impact resistant function, an antistatic function, and an antifouling function may be revealed; and in the case of plural layers, for example, it is possible to share functions in such a manner as (flattening layer)+(antireflection layer), (antireflection layer)+(hard coat layer), (near infrared ray absorbing layer)+(hard coat layer), etc.

In the case where the functional layer to be coated and formed is a scratch-resisting functional (hard coat) layer, a functional layer having a hardness of "H" or more in a pencil hardness test specified by JIS K5600-5-4 (1999) is preferable; and so far as such a hardness and the same transparency as the foregoing transparent (resin) substrate can be realized, the material is not particularly limited. As a curable resin to be used, an ionizing radiation curable resin, other known curable resin or the like may be properly employed depending upon a required performance or the like. Since examples of the ionizing radiation curable resin are exemplified in the foregoing description of the material of the primer layer, they are omitted herein.

A schematic sectional view of an example as a specific example of an optical functional layer $F_{opt}$ which is laminated together with the electromagnetic wave shielding material 10 or 20 is shown in FIG. 23(A). The optical functional layer $F_{opt}$ of FIG. 23(A) is a layer prepared by laminating an antireflection layer 100, a transparent substrate sheet 200, microlouver layers (300 and 400), a shielding (barrier) layer 500 and a coloring matter-containing adhesive layer 600 in this order from the image observer side (upper portion in FIG. 23(A)).

The antireflection layer 100 is composed of a layer of a material having a lower refractive index than the adjacent transparent substrate sheet 200 directly thereunder. For example, a vapor deposited film of magnesium fluoride, a coating film of a fluorocarbon based resin having a hollow silica particle dispersed therein, and the like are useful.

The transparent substrate sheet 200 is properly selected among the same materials as in the foregoing transparent substrate 1. For example, a sheet of polyethylene terephthalate is useful.

The microlouver layers (300 and 400) are one disclosed in JP-A-2007-272161, etc., and plural streaks of the light absorbing wedge-shaped parts 400 are embedded mutually in parallel on a fixed cycle in the transparent resin layer 300. In such microlouver layers (300+400), external light such as sunlight, and electric lamp light is selectively absorbed by the light absorbing wedge-shaped parts 400, and image light is transmitted from the transparent resin layer 300 between the light absorbing wedge-shaped parts 400, thereby enhancing an image contrast in the presence of external light.

In this respect, a coloring matter having a dark color (representatively a black color) which is composed of sumi (carbon black), black iron oxide, etc. is added in the light absorbing wedge-shaped part 400. Though the black coloring matter may be one in which single particles are dispersed (dispersed without causing secondary coagulation) in an individually separated and independent form in the binder resin, a form in which a plural number of respective single particles are dispersed in a secondarily coagulated, associated, fused or bonded complex particle form in the binder resin is preferable from the standpoints of external light absorbing properties, stable dispersibility and the like.

The shielding layer 500 is a layer for preventing fluctuation of an absorption spectrum to be caused due to a reaction of the coloring matter in the coloring matter-containing adhesive layer 600 with a substance in the microlouver layers (300+400). In the case where an organic coloring matter such as a diimonium based compound or tetraazaporphyrin is contained in the coloring matter-containing adhesive layer 600 and the transparent resin layer 300 of the microlouver layer is composed of a (meth)acrylate based ultraviolet ray curable resin, examples of the substance capable of fluctuating the absorption spectrum of the coloring matter include a photoreaction initiator such as acetophenone, and benzophenone and a coloring matter containing a transition metal atom, such as iron oxide in the light absorbing wedge-shaped part 400. In the case of such a combination of the substance and the coloring matter, for example, there is exemplified a layer made of polymethyl methacrylate having a glass transition temperature of 80° C. or higher and a thickness of from about 1 to 20 μm.

The coloring matter-containing adhesive layer 600 is a layer having both a function of bonding the optical functional layer $F_{opt}$ to a front surface of an image display device or a filter base and a function to impart a desired absorption spectrum characteristic. As the adhesive, a known material composed of a resin such as an acrylic resin, a polyester resin, and a rubber is useful. As the coloring matter, one or more members properly selected among near infrared ray absorbing coloring matters such as a diimonium based compound, a phthalocyanine based compound, and a cesium-tungsten complex oxide on a fine particle; neon light absorbing coloring matters capable of absorbing light having a wavelength of about 590 nm in an emission spectrum of a neon atom, such as tetraazaporphyrin; colored coloring matters such as Phthalocyanine Blue, Isoindolinone Yellow, and Polyazo Red; ultraviolet ray absorbing coloring matters such as a benzotriazole based compound, and finely particulate zinc oxide; and the like are added. In general, a coloring matter of three systems of a near infrared ray absorbing coloring matter, a colored coloring matter and a neon light absorbing coloring matter is frequently added.

FIG. 23(B) shows a schematic sectional view of a complex filter $F_{com}$ having such an optical functional layer $F_{opt}$ and the electromagnetic wave shielding material 10 of the present invention laminated therein. In the complex filter having a configuration of FIG. 23(B), the transparent substrate 1 side thereof is directly bonded onto a screen of an image display device via a transparent adhesive layer, or it is bonded onto a filter substrate via a transparent adhesive layer and further installed in the front surface of a screen of an image display device.

Figure 23:
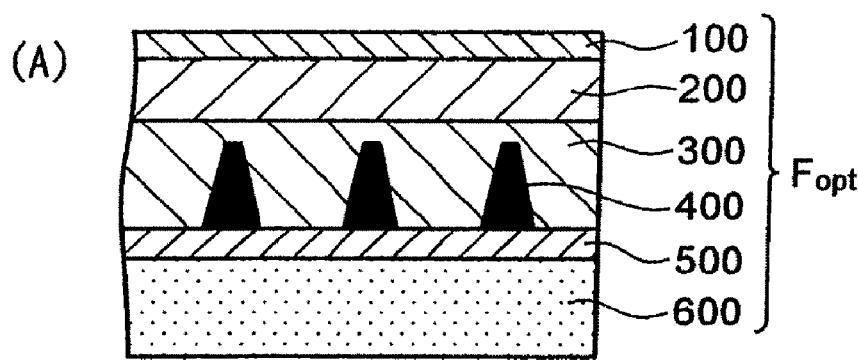
FIG. 23 is a schematic sectional view showing (A) an example of an optical filter layer laminated with an electromagnetic wave shielding material of the present invention and (B) an example of a complex filter composed of a laminate of an electromagnetic wave shielding material of the present invention and an optical filter layer, respectively.
Figure 23:
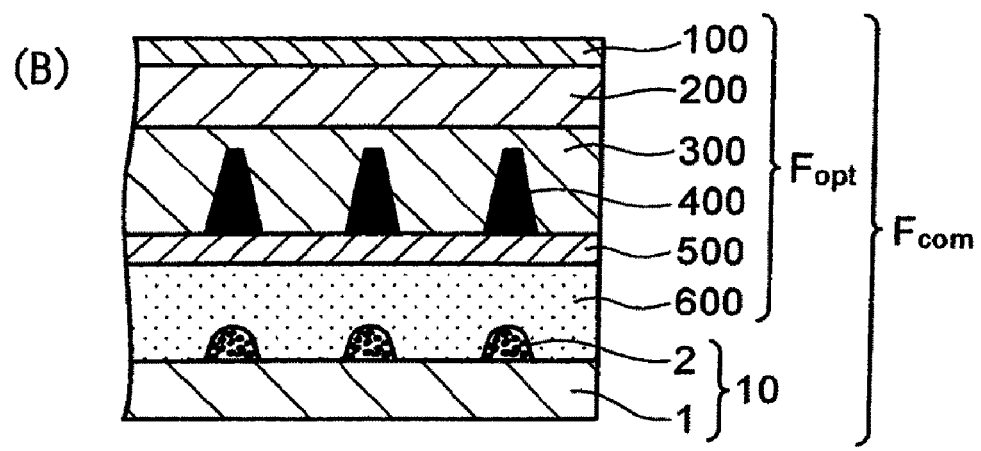

For example, the optical functional layer $F_{opt}$ of FIG. 23 (named generically for FIG. 23(A) and FIG. 23(B)) is an example to the bitter end, and its configuration can be properly changed as the need arises. As a modification form of such FIG. 23, for example, in FIG. 23, in the microlouver layers (300 and 400), the wide base of the light absorbing wedge-shaped part 400 faces toward the image display device side (lower portion in FIG. 23); however, the narrow base of the light absorbing wedge-shaped part 400 may face toward the image display device side (lower portion in FIG. 23).

Alternatively, in FIG. 23, though the electromagnetic wave shielding material 10 is used as the electromagnetic wave shielding material, instead thereof, the electromagnetic wave shielding material 20 shown in FIGS. 11(B) and 15(B) may be used.

Alternatively, in FIG. 23, though the antireflection layer 100 is used, instead thereof, fine irregularities may be shaped on the surface of a transparent coating film, or an antiglare layer having a configuration having a light diffusible particle dispersed in a transparent coating film may be used.

Alternatively, in FIG. 23, though all of the coloring matters are added in the coloring matter-containing adhesive layer 600, instead thereof, the coloring matters may be dispersed and added in the coloring matter-containing adhesive layer 600 and other layers. For example, a colored coloring matter and a neon light absorbing coloring matter can be added in the coloring matter-containing adhesive layer 600, and a near infrared ray absorbing coloring matter can be formed as a near infrared ray absorbing coloring matter-containing coating film between the substrate sheet 200 and the transparent resin layer 300 of the microlouver layers.

Alternatively, in FIG. 23, though all of the coloring matters are added in the coloring matter-containing adhesive layer 600, and the transparent substrate sheet 200 and the transparent resin layer 300 are directly laminated, instead thereof, a near infrared ray absorbing coloring matter-containing coating film can be formed in a resin binder on the image display device side of the transparent substrate sheet 200 (the lower side in FIG. 23), the coating film side and the observer side of the transparent resin layer 300 (the upper side in FIG. 23) can be laminated via a coloring matter-free, colorless transparent adhesive layer, and a colored coloring matter and a neon light absorbing coloring matter can be added in the coloring matter-containing adhesive layer 600.

Alternatively, in the above-exemplified various forms, an ultraviolet ray absorbing coloring matter may be further added in the substrate sheet 200.

In this respect, in the case where the intensity of the electromagnetic wave radiated from the image display device is relatively weak and influences against surrounding instruments are negligible, it is possible to bond only the optical functional layer $F_{opt}$ having a configuration shown in FIG. 23(A) directly onto the screen of the image display device via the coloring matter-containing adhesive layer 600 while omitting the electromagnetic wave shielding material 10 or 20, or to bond it onto the filter base via the coloring matter-containing adhesive layer 600 and further install it on the front surface of the screen of the image display device.

[Image Display Device]

A characteristic feature of the image display device according to the present invention resides in the foregoing electromagnetic wave shielding material or electromagnetic wave shielding material-containing optical filter on the display surface of the image display device. In such an image display device, the release of an electromagnetic wave generated from the image display device main body is shielded due to an electromagnetic wave shielding action which the foregoing electromagnetic wave shielding material possesses.

Examples of the image display device include conventionally known displays, for example, in addition to PDP, LCD, CRT and EL display devices, etc.

[Application]

Since the surface resistivity of the conductive pattern layer can be regulated to not more than $0.8\Omega/\square$, the manufacturing method of the electromagnetic wave shielding material of the present invention can be effectively utilized for a manufacturing method of an electromagnetic wave shielding material by printing a conductive composition on a transparent substrate to form a conductive pattern layer.

Also, the electromagnetic wave shielding material of the present invention can be used for various applications. In particular, the electromagnetic wave shielding material of the present invention is suitable for a front surface filter of an image display device such as PDP, CRT, LCD, and EL, which is used in a display part of various television receivers, measuring instruments or meters, office instruments, medical instruments, amusement instruments, computer instruments, telephone receives, etc. or the like. The electromagnetic wave shielding material of the present invention is especially suitable for PDP. Also, besides, the electromagnetic wave shielding material of the present invention can be used for electromagnetic wave shielding applications in windows of buildings such as a house, a school, a hospital, an office, and a store; windows of transportations such as a vehicle, an aircraft, and a ship, windows of various household electrical appliances such as a microwave over, and the like.

Also, the electromagnetic wave shielding material of the present invention can be utilized as an electromagnetic wave absorber. As such an electromagnetic wave absorber, there is exemplified a laminate in which a transparent dielectric layer composed of a resin such as a polycarbonate resin, an acrylic resin, a polyolefin resin, and a polystyrene, or an inorganic material such as a glass; and a transparent conductive layer composed of a thin film such as tin oxide, indium tin oxide (ITO), and silver are laminated in this order on the convex pattern layer of the electromagnetic wave shielding material of the present invention.

The manufacturing method of the electromagnetic wave shielding material of the present invention can be effectively utilized for a manufacturing method of an electromagnetic wave shielding material by printing a conductive composition on a transparent substrate to form a conductive pattern layer because the surface resistivity of the conductive pattern layer can be regulated to not more than $0.8\Omega/\square$.

EXAMPLES

The present invention is hereunder specifically described by reference to Examples and Comparative Examples, but it should be construed that the present invention is not limited thereto at all.

In the following Examples and Comparative Examples, values of electrical resistance of a conductive layer are a value measured according to the method described in JIS K7194 "Testing method for resistivity of conductive plastics with a four-point probe array" by a low-resistance meter, Lorest-EP MCP-T360, manufactured by Mitsubishi Chemical Corporation. In this respect, the measurement of the electrical resistance was carried out in a room-temperature atmosphere (temperature: 23° C., relative humidity: 50%).

Example 1

The present Example is a working example related to the invention of the electromagnetic wave shielding material of the second embodiment.
[Preparation of Intaglio]
First of all, a gravure printing plate cylinder having a printing plate depth of 12 μm, which is a mesh pattern in a regular lattice shape having a line width of 17 μm and a line pitch of 270 μm, was prepared as the intaglio roll 62.
[Preparation of Transparent Substrate]
Subsequently, a longitudinal rolled, biaxially stretched transparent polyethylene terephthalate (PET) film, on one surface of which had been subjected to an easy adhesion treatment by coating a polyester resin based easily adhesive layer, having a width of 1,000 mm and a thickness of 100 μm was used as the transparent substrate 1. Also, a composition having 12 parts by mass of an epoxy acrylate prepolymer, 44 parts by mass of a monofunctional monomer composed of phenoxyethyl acrylate and 9 parts by mass of a trifunctional monomer composed of ethylene oxide-modified isocyanuric acid triacrylate and further 3 parts by mass of 1-hydroxy-cyclohexyl-phenyl-ketone (a trade name: IRGACURE 184, manufactured by Ciba Specialty Chemicals) as a photoinitiator added therein was prepared as an ultraviolet ray curable resin composition of a primer layer. The PET film set in a supply section was drawn out, and the ultraviolet ray curable resin composition was coated in a thickness of 20 μm on the easy adhesion-treated surface of the PET film in a tri-helical gravure reverse roll coating mode, thereby preparing a transparent substrate.
[Manufacture of Electromagnetic Wave Shielding Material]
An electromagnetic wave shielding material was manufactured using the apparatus shown in FIG. 7. First of all, a silver paste ink (having a substantially spherical shape and prepared by dispersing 93 parts by mass of silver particles having an average particle size of 2 μm and composed of a mixed system of particles having particle size distribution of from 0.1 to 0.5 μm and particles having particle size distribution of from 1 to 3 μm in 4 parts by mass of a thermoplastic acrylic binder resin; solids content: about 88.5%) which is the conductive composition 15 filled in the filling container 68 was coated in the printing plate part by the pickup roll 61 using the foregoing gravure printing plate roll 62 whose printing plate pattern had a line width of 17 μm, a pitch of 270 μm and a printing plate depth of 12 μm; the printing plate 63 from which an excess of the ink had been scraped away by the doctor blade 65 and the primer layer side of the transparent substrate (PET film) having the primer layer formed thereon were press bonded to each other by the nip roll 66; subsequently, after curing the ultraviolet ray curable resin of the primer layer during running between ultraviolet ray irradiation zones (while illustration is omitted, existing in an upper portion of the intaglio roll 62 of sites shown by "UV zone" in FIG. 7), the PET film was released from the printing plate 63 through the nip roll 67, thereby transferring the conductive composition 15 shaped with a printing plate pattern of the foregoing printing plate cylinder surface thereonto via the primer layer to form the conductive pattern layer 2' composed of a mesh-shaped convex. There was thus manufactured by an electromagnetic wave shielding material (transfer film). In this respect, an endless roll was used as the transparent substrate, and printing was carried out in a roll-to-roll mode at a printing rate of 10 m/min.

Subsequently, the transfer film was passed through a drying zone at 120° C. and cured by evaporating the solvent of the silver paste, thereby forming the conductive pattern layer 2 composed of a mesh pattern on the primer layer. At that time, a thickness of the conductive pattern layer (a difference in thickness between the mesh pattern portion having the conductive pattern layer formed therein and other portion) was 10 μm, and the silver paste in the recess of the printing plate was transited at a high transition rate (83%). Also, neither disconnection nor shape failure was found.

A sample was cut out from the obtained electromagnetic wave shielding material which had not been subjected to an electrical resistance reducing treatment and measured with respect to a surface resistivity. As a result, it was found to be 1.5Ω/□. Also, a line streak part of the conductive pattern layer 2 of the obtained electromagnetic wave shielding material was cut in a cross section orthogonal to an extending direction thereof and photographed using a transmission electron microscope [focusing ion beam/scanning electron microscope (FIB-SEM)]. As a result, a portion where a part of the adjacent conductive particles 2a caused point contact with each other was merely observed, and the photograph was substantially the same as in FIG. 15(A) which is an SEM photograph in Example 10.
[Electrical Resistance Reducing Treatment]
Subsequently, an electrical resistance reducing treatment was carried out in the following method.

The sample was subjected to an acid treatment by dipping in an acid treatment tank filled with a hydrochloric acid aqueous solution at 25° C. containing 1% by mass of hydrochloric acid for 30 seconds; after taking out from the acid treatment tank, the sample was subjected to a warm water treatment by dipping in a warm water tank composed of pure water at a water temperature of 90° C. for 30 seconds; and thereafter, the resulting sample was dried to an extent so as to get rid of the moisture, thereby obtaining a sample of an electromagnetic wave shielding material. A surface resistivity of this electromagnetic wave shielding material was 0.5Ω/□, and a lowering of the surface resistivity of about 67% was confirmed. In this respect, the surface resistivity of the electromagnetic wave shielding material after the acid treatment was 0.8Ω/□.

Figure 19:
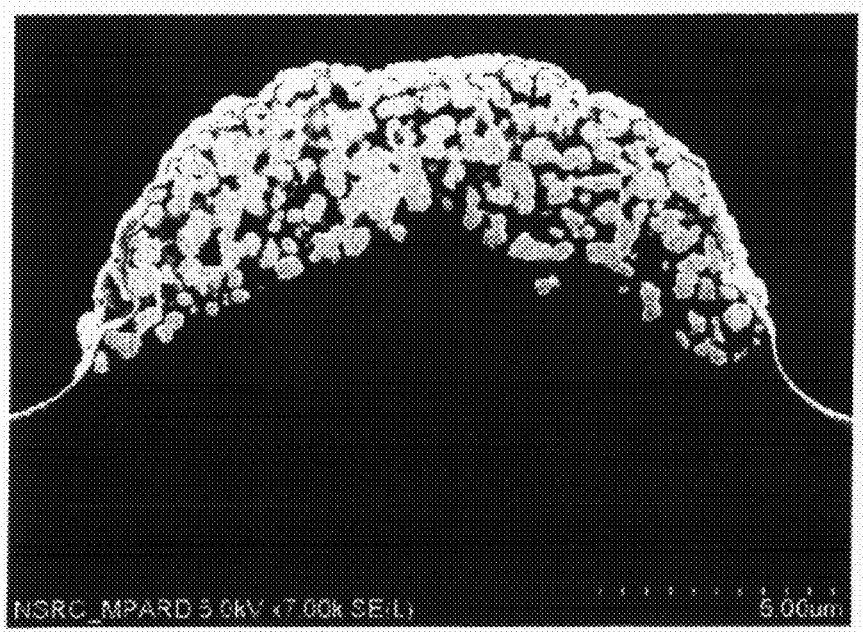
FIG. 19 is a sectional SEM photograph of a conductive pattern after an electrical resistance reducing treatment of Example 1 according to an electromagnetic wave shielding material of a second embodiment.

A line streak part of the conductive pattern layer 2 of the obtained electromagnetic wave shielding material was cut in a cross section orthogonal to an extending direction thereof and photographed using a transmission electron microscope. As a result, as shown in FIG. 19, it is noted that there are a number of portions where a part of the adjacent conductive particles 2a comes into contact with each other on a plane (line in the sectional photograph). It is determined that these conductive particles 2a are fused to each other. And it is noted that the right and left slope surfaces of the conductive pattern layer 2 are communicated with each other by continuation (cluster or lump) of the thus fused conductive particles 2a.

Experimental Example 1

Figure 12:
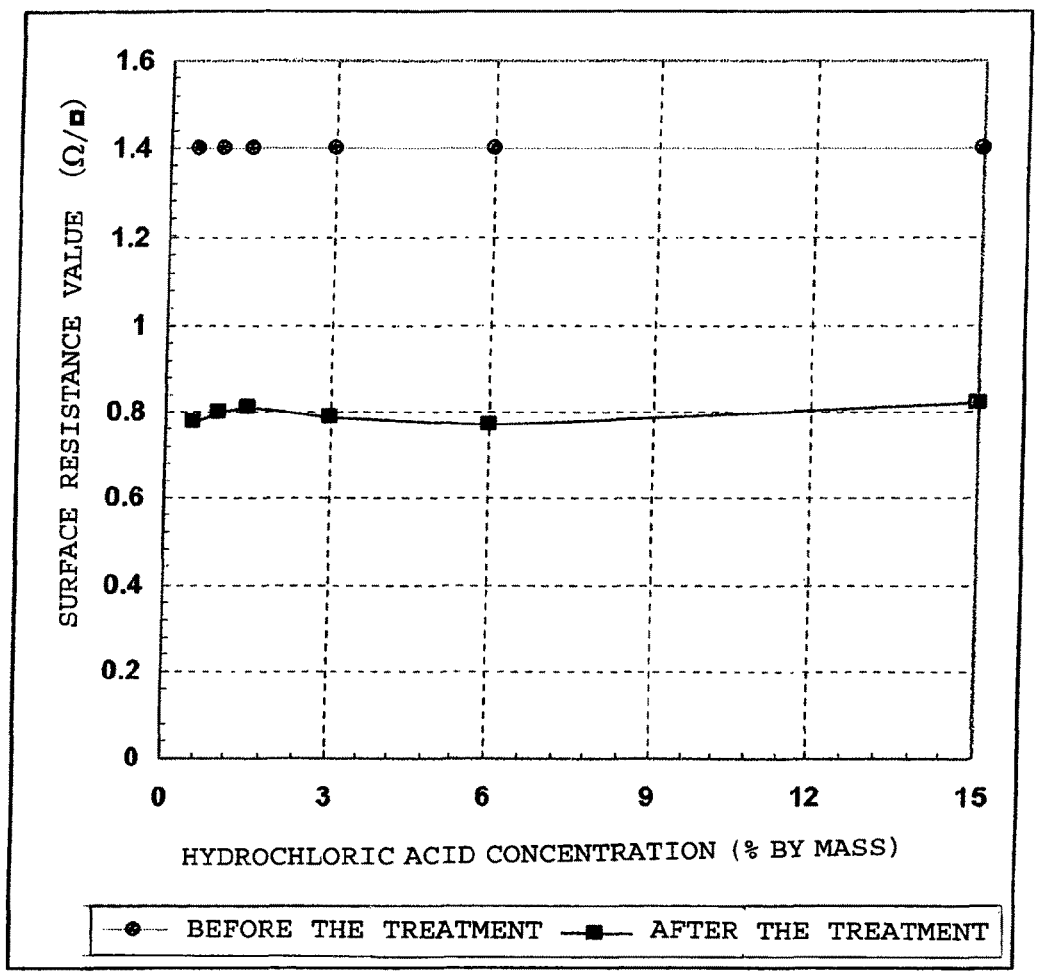
FIG. 12 is a graph showing a relation between a hydrochloric acid concentration and a surface resistivity in an acid treatment.

For the purpose of confirming any influence of the acid concentration in the electrical resistance reducing treatment, the untreated sample of the electromagnetic wave shielding material obtained in Example 1 was treated in the same manner as in Example 1 by dipping in an acid treatment tank composed of a hydrochloric acid aqueous solution at 40° C.

for 30 seconds, drawing up and rinsing with water at 20° C., followed by drying the moisture, except for changing the concentration of the hydrochloric acid aqueous solution to from 0.5% by mass to 15% by mass. A surface resistivity of the obtained samples was not influenced by the hydrochloric acid concentration and found to be about 0.8Ω/□ in all of the samples. A result of this Experimental Example is shown in FIG. 12.

Examples 2 to 6

Figure 13:
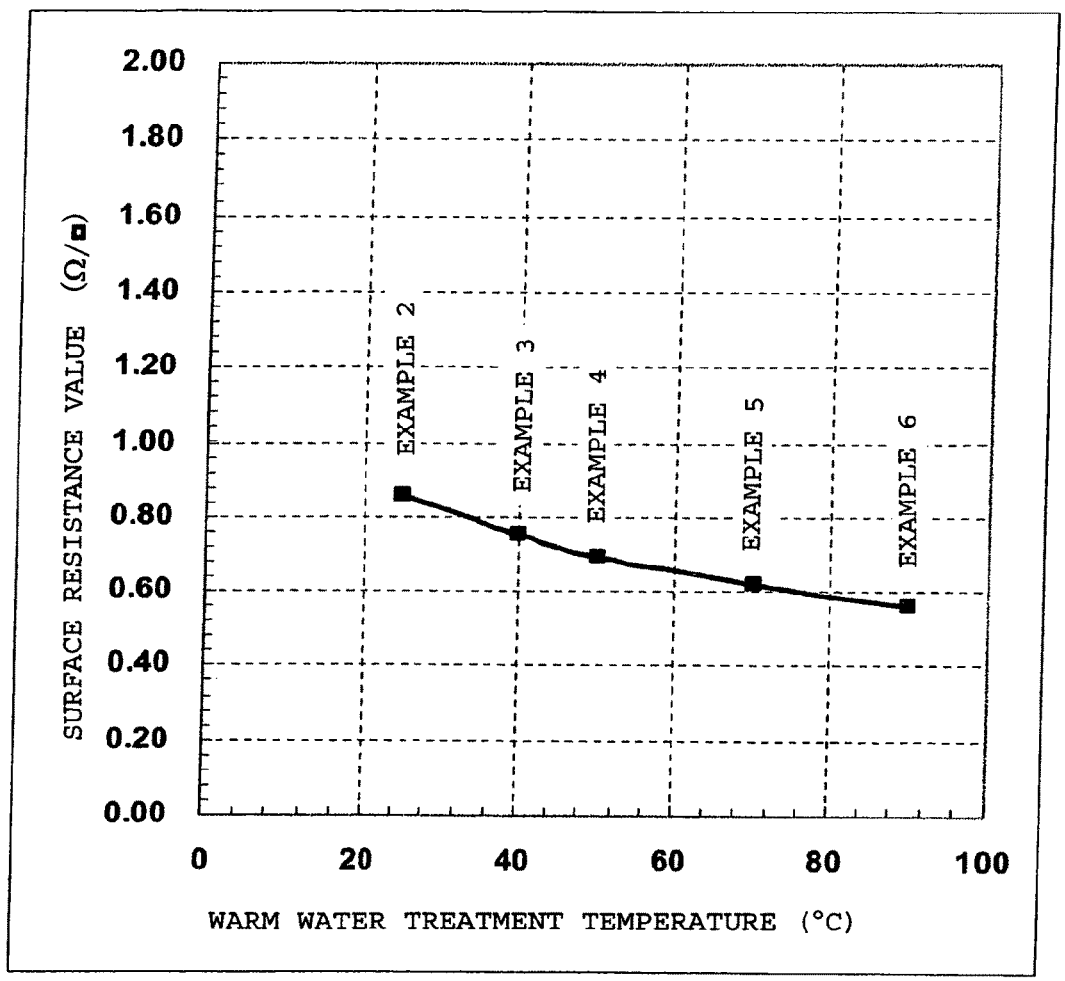
FIG. 13 is a graph showing a relation between a warm water temperature and a surface resistivity in a warm water treatment obtained in Examples 2 to 6.

In Example 1, the electrical resistance reducing treatment was carried out in the same manner as in Example 1, except for dipping each sample after the acid treatment for seconds while regulating the warm water treatment temperature to 22° C. (Example 2), 40° C. (Example 3), 50° C. (Example 4), 70° C. (Example 5) and 90° C. (Example 6), respectively. A relation between the warm water temperature and the surface resistivity (value) (Examples 2 to 6) is shown in FIG. 13.

It was confirmed that the surface resistivity is remarkably lowered with an elevation of the warm water temperature. In this respect, though Example 6 is the same condition as Example 1 with respect to the water temperature of 90° C., it was provided as a series for the purpose of also evaluating the reproducibility. In Example 6, the surface resistivity is 0.56Ω/□, a value of which is increased as compared with Example 1; however, it may be determined that this falls with an experimental error range.

Example 7

In Example 1, after the acid treatment, the warm water treatment was carried out by a method of spraying warm water at 90° C. for 30 seconds (flow rate: 4 L/min, pressure: 0.2 MPa) in place of the dipping treatment in warm water at 90° C. A surface resistivity of the obtained electromagnetic wave shielding material was 0.65Ω/□, its rate of lowering was 62%, and an electrical resistance reducing effect was low as compared with the warm water treatment by dipping in Example 1.

Example 8

Manufacture of Electromagnetic Wave Shielding Material

A sample of an electromagnetic wave shielding material was obtained in the same manner as in Example 1, except that in Example 1, the formation of a conductive pattern layer by means of printing with a silver paste ink was carried out using a silk screen printing method in place of the method using the apparatus by means of intaglio printing as shown in FIG. 5. That is, the same silver paste ink as in Example 1 was printed on the easy adhesion-treated surface of the same transparent substrate as in Example 1, and subsequently, the sample was cured by passing through a drying zone at 120° C. to evaporate the solvent of the silver paste. At that time, a thickness of the conductive pattern layer was aimed at 10 μm in conformity with the thickness of Example 1. In this respect, neither disconnection nor shape failure of the conductive pattern layer 2 was found.

Figure 20:
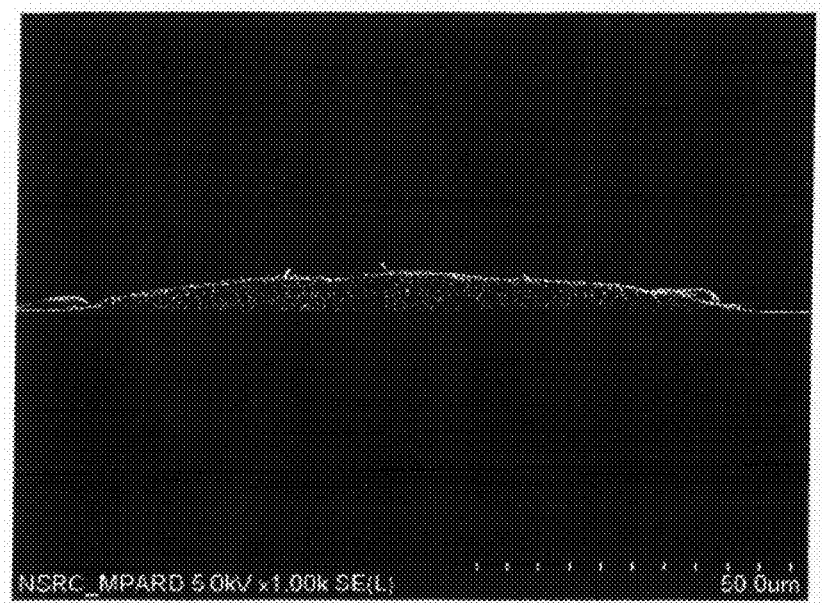
FIG. 20 is (A) a sectional SEM photograph (magnification: 1,000 times) showing the whole of a conductive pattern before an electrical resistance reducing treatment and (B) a partially enlarged sectional SEM photograph (magnification: 10,000 times of (A)), respectively of Example according to an invention of an electromagnetic wave shielding material of a first embodiment.
Figure 20:
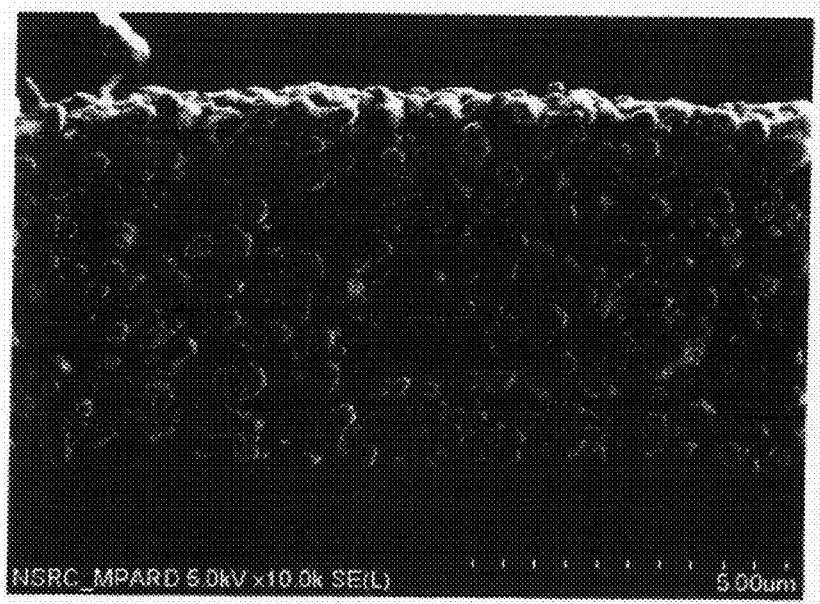

The obtained electromagnetic wave shielding material has a form of a sectional SEM photograph of the conductive pattern layer before the electric surface reducing treatment as shown in FIGS. 20(A) and 20(B) and a form of a sectional SEM photograph of the conductive pattern layer after the electric surface reducing treatment as shown in FIGS. 21(A) and 20(B). Similar to the sectional SEM photograph view of Example 1 as shown in FIG. 19, the conductive particle after the electrical resistance reducing treatment had a continuation in which a part thereof was fused.

The surface resistivity of the magnetic wave shielding material was 1.7Ω/□ before the electrical resistance reducing treatment and 0.6Ω/□ after the electrical resistance reducing treatment, respectively.

In this respect, the convex pattern had a line width of about 100 μm and a thickness of about 5.5 μm. It may be considered that this was caused due to the fact that since the primer layer as in Example 1 was not provided, bonding to the silver paste was insufficient by only the easy adhesion-treated layer of the transparent substrate or other reason, so that the silver paste assumed a shape corresponding to an angle of repose by its viscosity or the like.

Comparative Example 1

In Example 1, after the acid treatment, water washing was carried out, and a dry hot air drying treatment at 120° C. for 10 minutes was carried out in a state where four sides of the sample were fixed. A surface resistivity of the obtained electromagnetic wave shielding material was 0.6Ω/□. Wrinkles were slightly found in a margin of the sample. From this point, it was recognized that in the case of the dry hot air drying treatment, it is necessary to strictly carry out a tension control at the time of continuous production in a roll-to-roll mode. Furthermore, since a long treatment time is required, it was perceived that the treatment time must be satisfied by making a production rate slow or making a dry treatment apparatus long.

Comparative Example 2

In Comparative Example 1, a dry hot air drying treatment at 150° C. for 10 minutes was carried out in place of the dry hot air drying treatment at 120° C. for 10 minutes. A surface resistivity of the obtained electromagnetic wave shielding material was 0.50Ω/□, a value of which was the same as in the warm water dipping treatment at 90° C. in Example 1. However, the electromagnetic wave shielding material was in a wavy state and was not able to become a product.

Example 9

Preparation of Intaglio

First of all, a gravure printing plate cylinder having a printing plate depth of 10 μm, which is a mesh pattern in a regular lattice shape having a line width of 18 μm and a line pitch of 270 μm, was prepared as the intaglio roll 62.
[Preparation of Transparent Substrate]
Subsequently, the same longitudinal rolled, biaxially stretched transparent polyethylene terephthalate (PET) film, on one surface of which had been subjected to an easy adhesion treatment, having a width of 1,000 mm and a thickness of 100 μm as in Example 1 was used as the transparent substrate 1. A composition obtained by adding 3 parts by mass of 1-hydroxy-cyclohexyl-phenyl-ketone (a trade name: IRGACURE 184, manufactured by Ciba Specialty Chemicals) as a photoinitiator and 1% by mass of a stearic acid ester as a release agent to a urethane acrylate based ultraviolet curable resin composition composed of 12 parts by mass of an epoxy acrylate prepolymer, 44 parts by mass of a monofunctional monomer composed of phenoxyethyl acrylate and 9 parts by mass of a trifunctional monomer composed of ethylene oxide-modified isocyanuric acid triacrylate was prepared. The PET film set in a supply section was drawn out, and the ultraviolet ray curable resin composition was coated in a thickness of 14 μm on the easy adhesion-treated surface of the PET film in a tri-helical gravure reverse roll coating mode, thereby preparing a transparent substrate.

[Manufacture of Electromagnetic Wave Shielding Material]

An electromagnetic wave shielding material was manufactured using the apparatus shown in FIG. 7(A). First of all, a silver paste ink (having a substantially spherical shape and prepared by dispersing 93 parts by mass of silver particles having an average particle size of 1 μm and composed of a mixed system of particles having particle size distribution of from 0.1 to 0.5 μm and particles having particle size distribution of from 1 to 3 μm in 4 parts by mass of an acrylic binder resin) which is the conductive material 15 filled in the filling container 68 was coated in the printing plate part by the pickup roll 61 using the foregoing gravure printing plate roll 62 whose printing plate pattern had a line width of 18 μm, a pitch of 270 μm and a printing plate depth of 10 μm; the printing plate 63 from which an excess of the ink had been scraped away by the doctor blade 65 and the primer layer side of the transparent substrate (PET film) having the primer layer formed thereon were press bonded to each other by the nip roll 66; subsequently, after curing the ultraviolet ray curable resin of the primer layer during running between ultraviolet ray irradiation zones, the PET film was released from the printing plate 63 through the nip roll 67, thereby transferring a printing plate pattern of the foregoing printing plate cylinder surface there onto via the primer layer to form the convex pattern layer 2 having a mesh shape. There was thus manufactured by an electromagnetic wave shielding material. In this respect, an endless roll was used as the transparent substrate, and printing was carried out in a roll-to-roll mode at a printing rate of 10 m/min.

Subsequently, after printing, the electromagnetic wave shielding material was allowed to stand in an atmosphere at a temperature of 80° C. and a relative humidity of 90% for 48 hours, thereby achieving an electrical resistance reducing treatment step, followed by taking out into a room-temperature atmosphere (temperature: 23° C., relative humidity: 50%).

In this respect, by adding the release agent to the ultraviolet ray curable resin of the primer layer, not only the release properties of the primer layer (ultraviolet ray curable resin) from the intaglio printing plate cylinder were enhanced, but the transition amount of the conductive material from the intaglio was also enhanced, and a release tension from the printing plate cylinder was lowered so that the plate release could be stably achieved at the normal point P; and therefore, scattering of the uncured conductive material was reduced to an extent that a visual discrimination was impossible. Also, after curing with ultraviolet rays, fringe-like unevenness in a vertical direction against an advancing direction was not found.

Also, in the transited convex pattern, a transition defect such as disconnection was not noticed. A thickness of the printed convex pattern (measured on the basis of the primer layer in the mesh non-forming part) was 9 μm, and a transition rate calculated in terms of a ratio between the printing plate depth and the printing thickness was ((thickness of mesh pattern: 9 μm)/(printing plate depth: 10 nm))×100=90%. However, actually, since volume shrinkage due to drying of the solvent of the silver paste ink occurs, it may be estimated that the transition is achieved at a rate close to substantially 100%.

Furthermore, the form of the interface between the primer layer 3 and the convex pattern layer 2 had a mutually complicated structure in a non-linear manner as shown in FIG. 9(A). As a result of enlargedly photographing and observing such a complicated structure by an electron microscope, it was noticed that the conductive particles (silver particles) in the convex pattern layer were irregularly and confusedly distributed up and down at an interface with the primer layer 3, thereby constituting the interface. It was noticed that the conductive particles were distributed in a roughness and fineness manner such that the distribution becomes fine as it goes toward the top of the convex pattern layer, whereas the distribution becomes rough as it inversely goes toward the primer layer side.

Moreover, as shown in FIG. 9(B), a mixed region where the components of the both layers were mixed was noticed in the neighborhood of the interface.

Subsequently, a surface (electrical) resistance of the convex pattern layer of the obtained electromagnetic wave shielding material was measured.

The measured was carried out in a room-temperature atmosphere (temperature: 23° C., relative humidity: 50%). The surface resistivity was found to be 0.45Ω/□.

Comparative Example 3

An electromagnetic wave shielding material of Comparative Example 3 was obtained in the same manner as in Example 9, except that in Example 9, the electrical resistance reducing treatment step was not carried out.

A surface resistivity of the obtained electromagnetic wave shielding material was measured in the same condition and method. As a result, it was found to be 1.0Ω/□.

Referential Example 1

An electromagnetic wave shielding material was manufactured in the same manner as in the foregoing Example 9, except that in Example 9, a transparent substrate in which a release agent was not added to the ultraviolet ray curable resin of the primer layer was used.

Since the release agent was not added to the ultraviolet ray curable resin, the release properties from the intaglio printing plate cylinder after curing with ultraviolet rays was inferior; the transition properties of the conductive paste from the intaglio were poor; and since the plate release point was fluctuated from P to P' by about 2 cm in average as shown in FIG. 7(B) and the release tension was high, there were frequently caused such defects that vibrational plate release was assumed, scattering of the uncured conductive paste was frequently found, and fringe-like unevenness frequently occurred, resulting in a lowering of the product yield.

Example 10

Preparation of Intaglio

First of all, the same gravure printing plate cylinder as in Example 1, in which a recess serving as a mesh pattern in a lattice shape having a line width of 17 μm, a line pitch of 270 μm and a printing plate depth of 12 μm, was prepared as the intaglio roll 62.

[Preparation of Transparent Substrate]

The same longitudinal rolled polyethylene terephthalate (PET) film, on one surface of which had been subjected to an easy adhesion treatment, having a width of 1,000 mm and a thickness of 100 μm as in Example 1 was used as the transparent substrate 1. The PET film set in a supply section was drawn out, and a photocurable resin composition for primer layer was coated and formed in a thickness after curing of 5 µm on the easy adhesion-treated surface. A usual gravure reverse method was adopted as the coating mode, and a composition having 35 parts by mass of an epoxy acrylate, 12 parts by mass of urethane acrylate, 44 parts by mass of a monofunctional monomer and 9 parts by mass of a trifunctional monomer, 1 part by mass of a stearic acid ester as a release agent and further 3 parts by mass of IRGACURE 184 (manufactured by Ciba Specialty Chemicals) as a photoinitiator added therein was used as the photocurable resin composition. At that time, a viscosity thereof was about 1,300 cps (at 25° C. by a B-type viscometer); when touched, though the primer layer after coating exhibited fluidity, it did not flow down from the PET film; and a material having a coating thickness of the primer layer of about 20 µm was prepared as the transparent substrate having a primer layer formed thereon.

[Manufacture of Electromagnetic Wave Shielding Material]

An electromagnetic wave shielding material was manufactured in the same manner as in Example 1 by the apparatus shown in FIG. 7(A). First of all, a silver paste ink (a conductive composition composed of 94 parts by mass of a silver powder having an average particle size of about 1 µm as a conductive powder and 6 parts by mass of a thermoplastic acrylic resin as a binder resin and having a solids content of about 88.5%) which is the conductive material 15 filled in the filling container 68 was coated in the printing plate part by the pickup roll 61 using the foregoing gravure printing plate roll 62 whose printing plate pattern had a line width of 17 µm, a pitch of 270 µm and a printing plate depth of 12 µm; and the printing plate 63 from which an excess of the ink had been scraped away by the doctor blade 65 and the primer layer side of the transparent substrate (PET film) having the primer layer formed thereon were press bonded to each other by the nip roll 66, thereby bringing the conductive composition and the primer layer into intimate contact with each other leaving no space by a pressing pressure of the nip roll against the intaglio roll.

A transfer step which is subsequently carried out is as follows. First of all, the PET film having the primer layer formed thereon is interposed between the intaglio roll and the nip roll in a state where the primer layer is opposed to the printing plate side of the intaglio roll. The primer layer of the PET film is pressed onto the printing plate between the intaglio roll and the nip roll. Since the primer layer has fluidity, the primer layer pressed onto the printing plate also flows into the recess filled with the conductive composition, whereby the primer layer becomes in a state where it comes into intimate contact with the conductive composition leaving no space. Thereafter, the intaglio roll is rotated, and ultraviolet rays are irradiated by a non-illustrated UV lamp, whereby the primer layer composed of a photocurable resin composition is cured. Due to curing of the primer layer, the conductive composition in the recess of the intaglio roll comes into intimate contact with the primer layer, and thereafter, the film is released from the intaglio roll 62 by the nip roll 67 on the outlet side, whereby the conductive composition layer is transferred and formed on the primer layer.

The thus obtained transfer film was passed through a drying zone at 110° C. to evaporate the solvent of the silver paste, thereby forming a conductive layer composed of a mesh pattern on the primer layer. At that time, a thickness of the conductive layer (a difference in thickness between the mesh pattern portion having the conductive pattern layer formed therein and other portion) was about 10 µm, a line width was 17 µm, and a transition rate of the silver paste in the recess of the printing plate was ((thickness of mesh pattern: 10 µm)/ (printing plate depth: 12 µm))×100=83.3%. Also, neither disconnection nor shape failure was found.

[Electrical Resistance Reducing Treatment]

The obtained mesh pattern was allowed to stand in a wet heat environment at 80° C. and 90% RH for 48 hours. As a result, the surface resistance of 1Ω/□ at the time of untreatment was reduced to 0.5Ω/□, and thereafter, the surface resistivity was kept at 0.5Ω/□.

Figure 16:
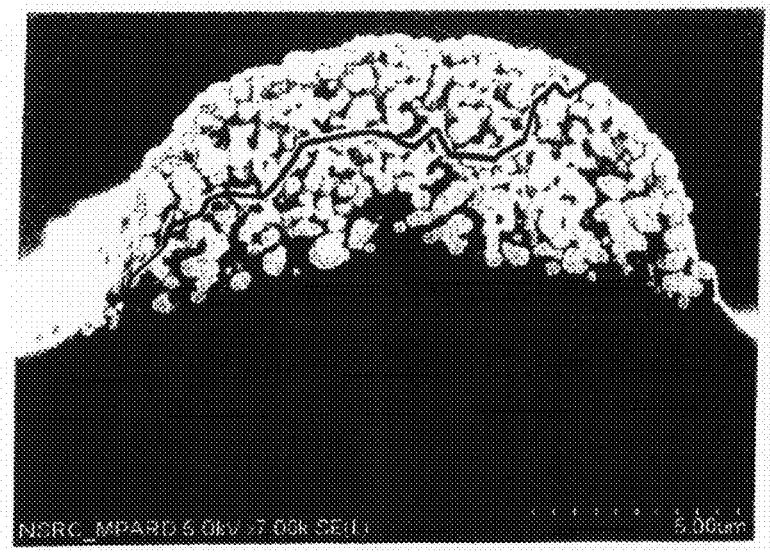
FIG. 16 is an explanatory view of a fusion path in the sectional SEM photograph of the convex pattern after the wet heat treatment of FIG. 15(B) in the electromagnetic wave shielding material of the second embodiment of the present invention.
Figure 17:
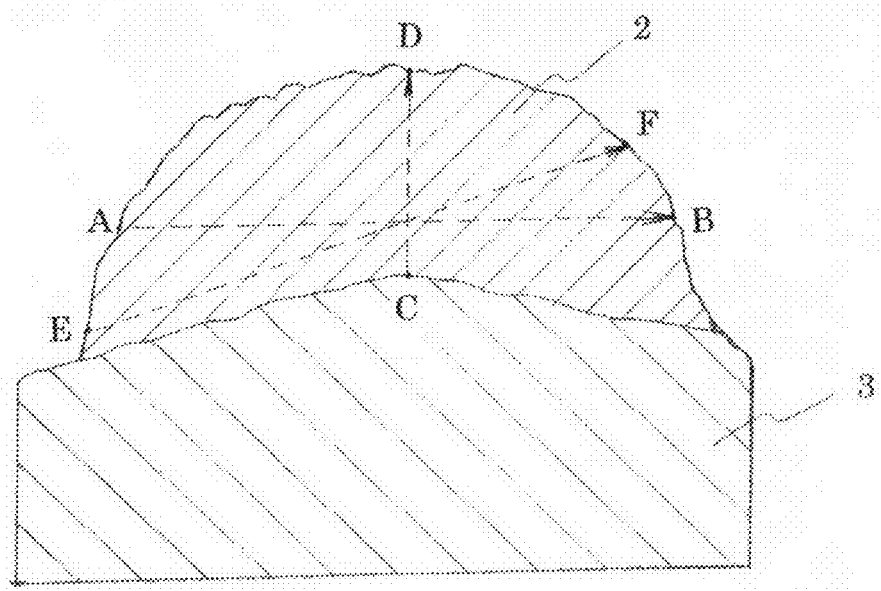
FIG. 17 is a schematic conceptual explanatory view showing a direction from one side edge (slope) toward the other side edge (slope) of a connected fusion path in an electromagnetic wave shielding material of the present invention.

Also, a cross section of the mesh pattern after the wet heat treatment was observed by a focusing ion beam/scanning electron microscope (FIB-SEM). As a result, as shown in FIG. 15(A), the silver particles were in a substantially independent particle form before standing in the wet heat environment; however, as shown in FIG. 15(B), a continuation formed by fusion of plural particles was observed after standing in the wet heat environment. A length of the fused path was 14.1 µm in a total sum of zigzag lines in FIG. 16 and was substantially identical with the line width.

Example 11

In Example 10, the obtained untreated mesh pattern was treated with dilute hydrochloric acid [0.12 moles/L=0.44% by mass], washed with water and then dried. As a result, the surface resistivity was reduced to 0.3Ω/□.

Figure 18:
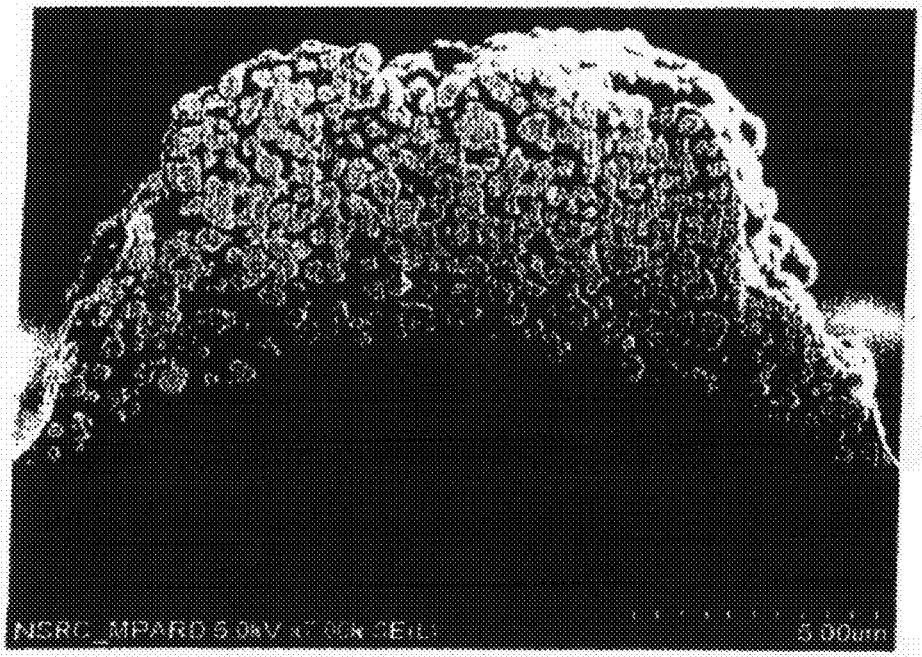
FIG. 18 is a sectional SEM photograph of a convex pattern after an acid treatment (with 0.44% hydrochloric acid for one minute) of Example 11 according to an invention of an electromagnetic wave shielding material of a second embodiment.

Though FIG. 18 is a sectional photograph by SEM observation after the treatment with dilute hydrochloric acid, a fused state of particles which is slightly different from that in the case of the treatment by standing in a wet heat environment in Example 10 is observed, and a path of a continuation formed by fusion of plural particles had a length of 10.6 µm, a value of which was ½ or more of the line width of about 14.1 µm.

Example 12

In Example 10, the obtained untreated mesh pattern was subjected to a warm water treatment by dipping in warm water at 80° C. for 6 minutes, washed with water and then dried. As a result, the surface resistivity was reduced to 0.5Ω/□.

Example 13

On the mesh pattern surface obtained in Example 11, a hard coat layer was formed in the following manner.

[Formation of Hard Coat Layer on Mesh]

A coating agent composed of an ionizing radiation curable resin prepared by mixing a composition of a mixture of 80 parts by mass of a urethane acrylate prepolymer composed of isophorone diisocyanate (IPDI) and pentaerythritol polyfunctional acrylate and 20 parts by mass of pentaerythritol triacrylate (PETA) with 3 parts by mass of 1-hydroxy-cyclohexyl-phenyl-ketone (a trade name: IRGACURE 184, manufactured by Ciba Specialty Chemicals) as a photoinitiator and 200 parts by mass of MIBK and homogenizing the mixture was intermittently coated directly on a mesh using a die coater and then dried at 80° C. Thereafter, the resulting coat was cured upon irradiation with ultraviolet rays at an irradiation dose of 200 mJ/cm$^2$ by a high-pressure mercury vapor lamp, thereby forming a hard coat layer. The obtained hard coat layer had a thickness including a mesh layer of 20 µm and a hardness of H in terms of a pencil hardness specified by JIS K5600-5-4 (1999) and was good in appearance and adhesion.

Comparative Example 4

In Example 10, the obtained untreated mesh pattern was allowed to stand in a drying oven at 80° C. for 48 hours. As a result, the surface resistivity was 1Ω/□ as it was, and no change was observed.

Comparative Example 5

In Example 10, a mesh pattern was prepared using a silver paste ink (a conductive composition composed of 93 parts by mass of a silver powder having particle size distribution of from 1 to 5 μm and an average particle size of 3 μm as a conductive particle and 7 parts by mass of a thermoplastic acrylic rein as a binder resin and having a solids content of about 88.5%). As a result, a surface resistivity after plate release and curing (after printing) was 5Ω/□, and though the surface resistivity was reduced to about 2.5Ω/□ by the same standing treatment in a wet heat environment as in Example 10, it did not reach 0.8Ω/□.

INDUSTRIAL APPLICABILITY

Since the electromagnetic wave shielding material of the present invention has a sufficient resistance value (not more than 0.8Ω/□) for electromagnetic wave shielding by fine line printing with a good resolution, it can be used for various applications of electromagnetic wave shielding or radio wave absorption as described previously. Also, besides, the electromagnetic wave shielding material of the present invention can be used for various transparent antennas and electric circuits, electrodes, touch panels and the like which are required to meet both characteristics of transparency and conductivity, and so on.

According to the manufacturing method of the electromagnetic wave shielding material of the present invention, in manufacturing an electromagnetic wave shielding material going through a step of printing a conductive paste, by adopting the present printing method, printing on a substrate can be efficiently carried out precisely; and the manufacturing method of the electromagnetic wave shielding material of the present invention can be utilized as a method of manufacturing an electromagnetic wave shield with a low resistance and a good material quality at low costs.

Also, in the manufacturing method of the electromagnetic wave shielding material of the present invention, since the electrical resistance reducing treatment of the conductive layer comprises an acid treatment and a warm water treatment, the transparent resin substrate is not damaged, and in particular, a transparent resin substrate in a sheet (or film) form can be used in a roll-to-roll mode; and the manufacturing method of the electromagnetic wave shielding material of the present invention can be effectively utilized as a manufacturing method capable of obtaining an electromagnetic wave shielding material at low costs.

Furthermore, when treatment equipment is concerned, the treatment can be carried out by simple equipment such as an acid treatment tank and a warm water treatment tank, and complicated cooling equipment of the transparent resin substrate or the like is not required. Therefore, an equipment cost can be suppressed, and the treatment can be carried out at a relatively high speed. Thus, the manufacturing method of the electromagnetic wave shielding material of the present invention can be effectively utilized as a manufacturing method capable of reducing the treatment cost of the electromagnetic wave shielding material.

Moreover, by selecting the conductive paste, an electromagnetic wave shielding material having a surface resistivity of not more than 0.8Ω/□ can be obtained without subjecting the surface to metal plating, and the manufacturing method of the electromagnetic wave shielding material of the present invention can be utilized as a manufacturing method of an electromagnetic wave shielding material capable of reducing an environmental load by omitting the plating step and contriving to enhance the productivity and reduce a cost.

The image display device of the present invention can be utilized as an image display device capable of shielding release of an electromagnetic wave from the image display device main body.

The invention claimed is:

1. An electromagnetic wave shielding material comprising: a transparent substrate; a primer layer formed on the transparent substrate; and a convex pattern layer composed of a conductive composition formed in a prescribed pattern on the primer layer, wherein
a thickness of a portion of the primer layer where the convex pattern layer is formed is thicker than a thickness of a portion thereof where the convex pattern layer is not formed; an interface between the primer layer and the convex pattern layer in the convex pattern layer-formed portion has any one or two or more sectional forms of (a) a sectional form where an interface between the primer layer and the convex pattern layer is complicated in a non-linear manner, (b) a sectional form having a layer where a component constituting the primer layer and a component constituting the convex pattern layer are mixed, and (c) a sectional form in which a component contained in the primer layer is present in the conductive composition constituting the convex pattern layer; the conductive composition contains conductive particles and a binder resin; and in observation by electron microscopic photography in a transverse cross section of the convex pattern layer, the conductive particles include those in which at least a part of the plural conductive particles has a fused continuation.

2. The electromagnetic wave shielding material according to claim 1, having at least one or more paths in which in the transverse cross section of the convex pattern layer, a length of the continuation (path) formed by partial fusion of the plural conductive particles exceeds ½ of a width of the convex pattern layer.

3. The electromagnetic wave shielding material according to claim 1, wherein in the convex pattern layer, the conductive composition contains conductive particles and a binder resin, and the convex pattern layer has a line width of not more than 30 μm and a surface resistivity of not more than 0.8Ω/□.

4. The electromagnetic wave shielding material according to claim 1, wherein a metal layer is further formed on the surface of the convex pattern layer.

5. An image display device comprising the electromagnetic wave shielding material according to claim 1 placed in the front thereof.

6. A method for manufacturing an electromagnetic wave shielding material having a transparent substrate, on one surface of which is formed a conductive layer in a prescribed pattern, the method comprising the successive steps of:
a step of forming a prescribed conductive pattern layer on one surface of the transparent substrate using a conductive composition containing conductive particles and a binder resin;
a curing step of curing the binder resin of the formed conductive pattern layer to form a conductive layer;

a step of subjecting the cured conductive layer to an acid treatment; and a step of subjecting the acid-treated conductive layer to a warm water treatment, wherein the conductive layer in which in observation of a transverse cross section of the conductive layer by electron microscopic photography, at least a part of the conductive particles has a fused continuation is formed.

7. The method for manufacturing an electromagnetic wave shielding material according to claim 6, wherein the acid treatment is a treatment of dipping the conductive layer in a solution of an acid and/or coating a solution of an acid on the conductive layer.

8. The method for manufacturing an electromagnetic wave shielding material according to claim 6, wherein the warm water treatment is a treatment of dipping the conductive layer in warm water at a water temperature of from 30 to 100° C.

9. A method for manufacturing an electromagnetic wave shielding material having a transparent substrate, on one surface of which is formed a conductive layer in a prescribed pattern, the method comprising the successive steps of:

a transparent substrate preparing step of preparing a transparent substrate, on one surface of which is formed a primer layer capable of keeping fluidity until it is cured;

a filling step of, after coating a conductive composition capable of forming a conductive layer after curing on a plate-like or cylindrical printing plate having a recess formed in a prescribed pattern thereon, scraping away the conductive composition attached to other portion than the recess, thereby filling the conductive composition in the recess;

a press bonding step of press bonding the primer layer side of the transparent substrate after the transparent substrate preparing step and the recess side of the printing plate after the conductive composition filling step to each other, thereby bringing the primer layer and the conductive composition in the recess into intimate contact with each other without forming any void;

a primer curing step of, after the press bonding step, curing the primer layer;

a transfer step of, after the curing step, releasing the transparent substrate from the printing plate, thereby transferring the conductive composition in the recess onto the primer layer;

a curing step of, after the transfer step or at the same time of the primer layer curing step, curing the conductive composition layer formed in a prescribed pattern on the primer layer to form a conductive layer; and an electrical resistance reducing treatment step of, at the same time of or after the curing step of forming the conductive layer, subjecting the conductive layer to a warm water treatment and/or an acid treatment, wherein the conductive layer in which in observation of a transverse cross section of the conductive layer by electron microscopic photography, at least a part of the conductive particles has a fused continuation is formed.

10. The method for manufacturing an electromagnetic wave shielding material according to claim 9, wherein the electrical resistance reducing treatment step comprises the successive steps of a step of subjecting the cured conductive layer to an acid treatment and a step of subjecting the acid-treated conductive layer to a warm water treatment.

11. The method for manufacturing an electromagnetic wave shielding material according to claim 9, wherein the warm water treatment includes a treatment of exposing the conductive layer in a high-temperature high-humidity environment at a temperature of 30° C. or higher and not higher than 120° C. at a relative humidity of 70% RH or more over a prescribed time or a treatment of dipping the conductive layer in warm water at a prescribed temperature of 30° C. or more for a prescribed time.

12. The method for manufacturing an electromagnetic wave shielding material according to claim 9, wherein the acid treatment is a treatment of dipping the conductive layer in a solution of an acid and/or coating a solution of an acid on the conductive layer.

13. The method for manufacturing an electromagnetic wave shielding material according to claim 9, wherein the warm water treatment is a treatment of dipping the conductive layer in warm water at a water temperature of from 30 to 100° C.

* * * * *